United States Patent
Taft

(10) Patent No.: US 10,833,532 B2
(45) Date of Patent: Nov. 10, 2020

(54) METHOD AND SYSTEM FOR MANAGING A POWER GRID

(71) Applicant: Accenture Global Services Limited, Dublin (IE)

(72) Inventor: Jeffrey D Taft, Washington, PA (US)

(73) Assignee: Accenture Global Services Limited, Dublin (IE)

( * ) Notice: Subject to any disclaimer, the term of this patent is extended or adjusted under 35 U.S.C. 154(b) by 910 days.

(21) Appl. No.: 15/353,611

(22) Filed: Nov. 16, 2016

(65) Prior Publication Data

US 2017/0170685 A1 Jun. 15, 2017

Related U.S. Application Data

(63) Continuation of application No. 12/378,091, filed on Feb. 11, 2009, now Pat. No. 9,534,928.

(Continued)

(51) Int. Cl.
*G06Q 50/06* (2012.01)
*G01R 22/06* (2006.01)

(Continued)

(52) U.S. Cl.
CPC .......... *H02J 13/0062* (2013.01); *G01D 4/002* (2013.01); *G01R 22/063* (2013.01);

(Continued)

(58) Field of Classification Search
CPC ...... G01D 4/002; G01R 22/063; G05B 15/02; H02J 3/006; G06Q 50/06
See application file for complete search history.

(56) References Cited

U.S. PATENT DOCUMENTS 4,781,119 A   11/1988   Davis
5,455,776 A   10/1995   Novosel
(Continued)

FOREIGN PATENT DOCUMENTS

EP   1 780 858 A    5/2007
EP   2 045 680 A3   4/2009
(Continued)

OTHER PUBLICATIONS

Patent Examination Report No. 3, dated Jul. 14, 2014, pp. 1-3, Australian Patent Application No. 2012241193, IP Australia, Woden ACT, Australia.

(Continued)

*Primary Examiner* — Catherine T. Rastovski
(74) *Attorney, Agent, or Firm* — Brinks Gilson & Lione

(57) ABSTRACT

A smart grid for improving the management of a power utility grid is provided. The smart grid as presently disclosed includes using sensors in various portions of the power utility grid, using communications and computing technology to upgrade an electric power grid so that it can operate more efficiently and reliably and support additional services to consumers. The smart grid may include distributed intelligence in the power utility grid (separate from the control center intelligence) including devices that generate data in different sections of the grid, analyze the generated data, and automatically modify the operation of a section of the power grid. Further, the intelligent devices in the power utility grid may cooperate together to analyze and/or control the state of the power grid. Finally, the distributed intelligence may further include distributed storage.

17 Claims, 37 Drawing Sheets

Related U.S. Application Data

(60) Provisional application No. 61/201,856, filed on Dec. 15, 2008, provisional application No. 61/127,294, filed on May 9, 2008.

(51) Int. Cl.
*G05B 15/02* (2006.01)
*H02J 13/00* (2006.01)
*H02J 3/00* (2006.01)
*G01D 4/00* (2006.01)

(52) U.S. Cl.
CPC .............. *G05B 15/02* (2013.01); *G06Q 50/06* (2013.01); *H02J 3/0073* (2020.01); *H02J 13/0075* (2013.01); *Y02B 70/30* (2013.01); *Y02B 90/20* (2013.01); *Y02E 60/00* (2013.01); *Y04S 10/30* (2013.01); *Y04S 10/50* (2013.01); *Y04S 10/52* (2013.01); *Y04S 20/221* (2013.01); *Y04S 20/222* (2013.01); *Y04S 20/30* (2013.01); *Y04S 40/124* (2013.01); *Y04S 40/126* (2013.01)

(56) References Cited

U.S. PATENT DOCUMENTS

| | | |
|---|---|---|
| 5,701,226 A | 12/1997 | Gelbien et al. |
| 5,735,492 A | 4/1998 | Pace |
| 5,923,269 A | 7/1999 | Shuey et al. |
| 6,104,978 A | 8/2000 | Harrison et al. |
| 6,553,336 B1 | 4/2003 | Johnson et al. |
| 6,845,333 B2 | 1/2005 | Anderson et al. |
| 6,860,453 B2 | 3/2005 | Moretti et al. |
| 6,925,366 B2 | 8/2005 | Theurer et al. |
| 6,985,803 B2 | 1/2006 | Abdel-Malek et al. |
| 7,013,203 B2 | 3/2006 | Moore et al. |
| 7,043,340 B2 | 5/2006 | Papallo et al. |
| 7,096,175 B2 | 8/2006 | Rehtanz et al. |
| 7,107,162 B2 | 9/2006 | Zima et al. |
| 7,120,520 B2 | 10/2006 | Seto et al. |
| 7,200,500 B2 | 4/2007 | Larsson et al. |
| 7,213,789 B1 | 5/2007 | Matzan |
| 7,233,843 B2 | 6/2007 | Budhraja et al. |
| 7,239,238 B2 | 7/2007 | Tester et al. |
| 7,283,915 B2 | 10/2007 | Saha et al. |
| 7,689,323 B2 | 3/2010 | Mansingh et al. |
| 7,739,138 B2 | 6/2010 | Chauhan et al. |
| 8,090,972 B2 | 1/2012 | Bengtson et al. |
| 2001/0021896 A1 | 9/2001 | Bertsch et al. |
| 2001/0039537 A1 | 11/2001 | Carpenter et al. |
| 2002/0103772 A1 | 8/2002 | Chattopadhyay |
| 2002/0107615 A1 | 8/2002 | Bjorklund |
| 2003/0169029 A1 | 9/2003 | Piesinger |
| 2003/0185150 A1 | 10/2003 | Matsumoto et al. |
| 2003/0205938 A1 | 11/2003 | Andarawis et al. |
| 2004/0263147 A1 | 12/2004 | Piesinger |
| 2005/0005150 A1* | 1/2005 | Ballard .................. H04B 3/542 726/22 |
| 2005/0033481 A1* | 2/2005 | Budhraja ................ H02J 3/008 700/286 |
| 2005/0125104 A1 | 6/2005 | Wilson et al. |
| 2005/0160128 A1 | 7/2005 | Fardanesh |
| 2005/0251296 A1* | 11/2005 | Tracy Nelson ..... H02J 13/0004 700/292 |
| 2006/0038672 A1* | 2/2006 | Schoettle ........... G05B 23/0221 340/522 |
| 2006/0188327 A1* | 8/2006 | Moon ................... G01S 5/0072 403/325 |
| 2006/0224336 A1 | 10/2006 | Petras et al. |
| 2006/0247874 A1 | 11/2006 | Premerlani et al. |
| 2006/0259255 A1 | 11/2006 | Anderson et al. |
| 2006/0261218 A1 | 11/2006 | Mace et al. |
| 2007/0086134 A1 | 4/2007 | Zweigle et al. |
| 2007/0152107 A1 | 7/2007 | LeFebvre et al. |
| 2008/0049619 A1 | 2/2008 | Twiss |
| 2008/0103732 A1* | 5/2008 | Stoupis .............. G05B 23/0221 702/188 |
| 2008/0150544 A1 | 6/2008 | Premerlani et al. |
| 2008/0177678 A1 | 7/2008 | Di Martini et al. |
| 2008/0189061 A1 | 8/2008 | Scholtz et al. |
| 2008/0071482 A1 | 11/2008 | Zweigle et al. |
| 2009/0173840 A1 | 7/2009 | Brown et al. |
| 2010/0324844 A1 | 12/2010 | Marti |

FOREIGN PATENT DOCUMENTS

| | | |
|---|---|---|
| GB | 2 442 114 | 3/2008 |
| JP | 08-186945 | 7/1996 |
| JP | 11-045101 | 2/1999 |
| JP | 2001-045645 | 2/2001 |
| JP | 2002-300724 | 10/2002 |
| JP | 2003-052135 | 2/2003 |
| JP | 2004-533034 | 10/2004 |
| JP | 2006-014492 | 1/2006 |
| JP | 2006-340573 | 12/2006 |
| JP | 2007-91178 | 10/2008 |
| WO | WO 2000/48288 A1 | 8/2000 |
| WO | WO 01/35190 A2 | 5/2001 |
| WO | WO 2002-069300 | 9/2002 |
| WO | WO 2004/040731 A1 | 5/2004 |
| WO | WO 2008/019636 A1 | 2/2008 |

OTHER PUBLICATIONS

International Search Report from related International Application No. PCT/US2009/000888, dated Jul. 15, 2010 (6 pages).
Written Opinion from related Singapore Application No. 201008192-5, dated Mar. 17, 2011 (10 pages).
Calyam, Prasad, "*Router Architecture and Configuration Basics*," CSE677:Lecture, www.osc.edu/-pcalyam/routerarch_677CSE07.ppt, 22 pages (May 21, 2007).
McGraw-Hill, "*Chapter 12: Connecting LANSs and WANs: Make Backbone Networks*", McGraw-Hill Companies, 140.127.22.92/download/learn_web/Tong(92-2)--BDC/.. ./ch-12-n.ppt, 28 pages (2000).
Office Action from related U.S. Appl. No. 12/378,102, dated May 27, 2011 (16 pages).
Ballance, John et al., "*Use of Synchronized Phasor Measurement System for Enhancing AC-DC Power System Transmission Reliability and Capability*" Southern California Edison Co. United States of America (*lead author) at the CIGRE Meeting held at Paris-2004; pp. 1-12.
Begovic, Miroslav et al., "*Issues Related to the Implementation of Synchrophasor Measurements*", Proceedings of the 41st Hawaii International Conference on System Sciences—2008 IEEE; pp. 1-10.
Hojo, Masahide et al., "*Analysis of Load Frequency Control Dynamics Based on Multiple Synchronized Phasor Measurements*", 15th PSCC, Liege 22-26, Aug. 2005; p. 1-7.
Jiang, Weiqing et al., "*A Distributed State Estimator Utilizing Synchronized Phasor Measurements*", vol. 22, No. 2, May 2007 IEEE; p. 563-571.
Larsson, Mats et al., "*Interactive Simulation and Visualization of Wide-Area Monitoring and Control Applications*", at least as early as Jan. 2005; Proc Power Systems Computation Conf., Liege, Belgium, 2005; 6 pgs.
Larsson, Mats et al., "*Real-Time Voltage Stability Assessment of Transmission Corridors*" IFAC Power Plants and Power Systems Control, Seoul, Korea, 2003; 6 pgs.
Overholt, Phil, DOE Update, NASPI Working Group, New Orleans Lousiana; Mar. 6, 2008; 7 pgs.
Annex to Form PCT/ISA/206 Communication Relating to the Results of the Partial International Search issued in PCT/US2009/000888 (3 pgs.).
Extended European Search Report, dated Sep. 7, 2016, pp. 1-10, issued in International Application No. 2013035282, European Patent Office 80298, Munich, Germany.

(56) References Cited

OTHER PUBLICATIONS

Office Action from related Japanese Application No. 2011-508475, dated Jul. 16, 2013 (6 pgs.).
Search Report of the International Property Office of Singapore, dated Jul. 3, 2015, pp. 1-10, issued in International Application No. 2013035282, The Danish Patent and Trademark Office, Helgeshoj Alle 81, DK-2630 Taastrup, Denmark.
Written Opinion of the International Property Office of Singapore, dated Jul. 3, 2015, pp. 1-13, issued in International Application No. 2013035282, The Danish Patent and Trademark Office, Helgeshoj Alle 81, DK-2630 Taastrup, Denmark.
Zhao, Liang et al., "Multiarea State Estimation Using Synchronized Phasor Measurements", vol. 20, No. 2, May 2005 IEEE; p. 611-617.
Zima, Marek et al., "Design Aspects for Wide-Area Monitoring and Control Systems", vol. 93,No. 5, May 2005 IEEE; p. 980-996.
http://www.synchrophasors.com/, Schweitzer Engineering Laboratories, Inc., "Synchophasor Voltage Angle Measurement Real-Time Updates. Synchrophasor-Equipped Devices Report Power System Information From Around the World", Aug. 20, 2008; 21 pgs.
http://www.geindustrial.com/cwc/Dispatcher?REQUEST=PRODUCTS&PNIID=6&ID=N60, GE Consumer & Industrial Electrical Distribution, "N60 Network Stability and Synchrophasor Measurement System—Product Information", Aug. 20, 2008 2 pgs.
Examination Report, issued in Indian Patent Application No. 7884/CHENP/2012, dated Dec. 26, 2018, pp. 1-6, Indian Patent Office, Chennai, India.
Decision of Refusal/Office Action with English translation, issued in corresponding Japanese Patent Application No. 2015-164183, dated Jan. 9, 2018, pp. 1-5, Japanese Patent Office, Tokyo, Japan.
Office Action/Requisition, issued in corresponding Canadian Application No. 2,972,362, dated May 28, 2018, pp. 1-8, Canadian Intellectual Property Office, Gatineau, Quebec.
"A New View of the Power System," SEL Synchrophasors, dated 2008, pp. 1-8, published by Schweitzer Engineering Laboratories, Inc., Pullman, WA.
Roy Moxley, "Practical Application of Synchronozied Phasor Measurement," dated 2006, pp. 1-10, published by Schweitzer Engineering Laboratories, Inc., Pullman, WA.
European Office Action, issued in European Patent Application No. 16 160 746.0, dated Apr. 23, 2019, European Patent Office, Munich, Germany.
F. Crispino et al., "An experiment using an Object-oriented standard IEC 61850 to integrate IEDs systems in substations", 2004 IEEE/PES Transmission and Distribution Conference and Exposition: Latin America, dated Nov. 8, 2004, Sao Paulo, Brazil.
India Office Action, dated Apr. 27, 2017, pp. 1-8, issued in India Patent Application No. 7129/CHENP/2010, India Patent Office, Chennai, India.
Canadian Office Action, issued in CA Application No. 3,028,486, dated Nov. 25, 2019, pp. 1-4, Canadian Intellectual Property Office, Gatineau, Quebec.
Office Action issued for Indian patent application No. 201748027862 dated Feb. 26, 2020, 5 pages.

* cited by examiner

*V = VOLTAGE, I = CURRENT, P = REAL POWER, Q = REACTIVE POWER

METHOD AND SYSTEM FOR MANAGING A POWER GRID

REFERENCE TO RELATED APPLICATIONS

This application is a continuation application of U.S. patent application Ser. No. 12/378,091, filed Feb. 11, 2009, which claims the benefit of U.S. Provisional Application No. 61/127,294, filed May 9, 2008, and claims the benefit of U.S. Provisional Application No. 61/201,856, filed Dec. 15, 2008, the entirety of these applications are hereby incorporated by reference.

BACKGROUND

1. Field of the Invention

The present invention relates generally to a system and method for managing a power grid, and more particularly to a system and method for collecting data at different sections of the power grid and analyzing the collected data m order to manage the power grid, 2. Related Art A power grid may include one or all of the following: electricity generation, electric power transmission, and electricity distribution. Electricity may be generated using generating stations, such as a coal fire power plant, a nuclear power plant, etc. Foy efficiency purposes, "the generated electrical power isstepped up to a very high voltage (such as 345K Volts) and transmitted over transmission lines. The transmission lines may transmit the power long distances, such as across state lines or across international boundaries, until it reaches its wholesale customer, which may be a company that owns the local distribution network. The transmission lines may terminate at a transmission substation, which may step down the very high voltage to an intermediate voltage (such as 138K Volts). From a transmission substation, smaller transmission lines (such as sub-transmission lines) transmit the intermediate voltage to distribution substations. At the distribution substations, the intermediate voltage may be again stepped down to a "medium voltage" (such as from 4K Volts to 23K Volts). One or more feeder circuits may emanate from the distribution substations. For example, four to tens of feeder circuits may emanate from the distribution substation. The feeder circuit is a 3-phase circuit comprising 4 wires (three wires for each of the 3 phases and one wire for neutral). Feeder circuits may be routed either above ground (on poles) or underground. The voltage on the feeder circuits may be tapped off periodically using distribution transformers, which step down the voltage from "medium voltage" to the consumer voltage (such as 120V). The consumer voltage may then be used by the consumer.

One or more power companies may manage the power grid, including managing faults, maintenance, and upgrades related to the power grid. However, the management of the power grid is often inefficient and costly. For example, a power company that manages the local distribution network may manage faults that may occur in the feeder circuits or on circuits, called lateral circuits, which branch from the feeder circuits. The management of the local distribution network often relies on telephone calls from consumers when an outage occurs or relies on field workers analyzing the local distribution network.

Power companies have attempted to upgrade the power grid using digital technology, sometimes called a "smart grid." For example, more intelligent meters (sometimes called "smart meters") are a type of advanced meter that identifies consumption in more detail than a conventional meter. The smart meter may then communicate that information via some network back to the local utility for monitoring and billing purposes (telemetering). While these recent advances in upgrading the power grid are beneficial, more advances are necessary. It has been reported that in the United States alone, half of generation capacity is unused, half the long distance transmission network capacity is unused, and two thirds of its local distribution is unused. Therefore, a need clearly exists to improve the management of the power grid.

BRIEF SUMMARY

A smart grid for improving the management of a power utility grid is provided. The smart grid as presently disclosed includes using sensors in various portions of the power utility grid, using communications and computing technology (such as additional bus structures) to upgrade the current electric power grid so that it can operate more efficiently and reliably and support additional services to consumers. The smart grid as presently disclosed may upgrade a traditional electricity transmission and distribution network or "grid," such as by using robust two-way communications, advanced sensors, and distributed computers (including additional intelligence in the electric power transmission and/or electricity distribution). The smart grid may further include additional functionality at a central management facility in order to manage operations, detect and correct faults, manage resources, etc.

One example of the management system that may manage a smart grid disclosed below is the Intelligent Network Data Enterprise (hereinafter, termed INDE) Reference Architecture. The INDE Reference Architecture enables integration of intelligent or smart grids into the electric power industry (or other types of industries). Further, management of the power grid may be improved using Intelligent Network Data Services (hereinafter, termed INDS). The following discloses a set of processes and assets for assisting utilities with the development of smart grids. This set of assets and methods comprises the INDE solution set. INDE includes: INDE Reference Architecture, which may comprise a template for enterprise wide smart grid data, and analytics management and integration; Data acquisition and real time analytics, which may include distributed architectures and analytics implementations for high speed smart grid analytics; Data transport and storage architecture assets, which may include open standards-based data management solution elements; End user transactional analytics applications, which may include implementations of a wide range of analytics covering system performance, power quality, grid asset utilization and grid asset management and Smart Grid development process, which includes may comprise a methodology to analyze a particular utility's current grid and determine a recommendation for improving the particular utility's current grid with one or more aspects of the smart grid.

Various aspects of the INDE Reference Architecture may improve the structure and management of the power grid. For example, the INDE Reference Architecture may include a plurality of network buses for carrying different types of data including: (i) multiple buses may be dedicated to the different types of data, such as operational/non-operational data, event processing data, grid connectivity data, and network location data; and (ii) using the multiple bus structure enabling delivery of the data to multiple destinations. The multiple buses may comprise different segments in a single bus or may comprise separate buses. The multiple buses may be used to transport the various types of data to other smart grid processes (such as at a centrally located controller). Alternatively, one or more types of data may be transmitted using the same bus as other types of data (such as event processing data being transmitted on the same bus as the operational/non-operational data). In this case, the event data may be transmitted using a specific protocol for the event processing data.

As another example, the INDE Reference Architecture may include distributed intelligence in the power grid including: (i) devices that generate data in different sections of the grid (such as sensing devices at substations, meters at customers' premises, line sensors); (ii) devices that analyze the generated data (such as event processing at the substations, on the power line, etc., and at the control center to analyze the data to determine whether a particular event has occurred) so that the analysis may be done at different points in the power grid and/or at the control center; and (iii) devices that automatically modify the operation of a section of the power grid (such as modify operation at the substation based on a determined event).

For example, individual components in the power grid, which are remote from the central authority of the power grid, may include intelligence (such as processing and storage capability) in order to analyze a state of the power grid (such as analyzing a fault) and/or to automatically correct for the fault. One such individual component may comprise a substation in the power grid, which may include sensors, at least one processor, and at least one storage device. The substation may use the sensor to sense data for a section of the power grid, and may use the processor and storage device analyze the sensed data in order to determine the state of the section of the power grid (such as determining whether there is a fault in the section of the power grid) and/or may automatically correct the determined fault. In this way, the substation may automatically change at least one control aspect of the section of the power grid prior to requiring the central authority of the power grid receiving the sense data and/or prior to requiring the central authority analyzing the sense data.

As another example, the individual components in the power grid, intelligent in and of themselves, may cooperate together to analyze and/or control the state of the power grid. Using the additional communication ability with the multiple buses, components in the field of the power grid may exchange information, such as data sensed from the power grid and/or fault(s) determined via analysis. The components in the field may thus work together, with or without the central authority, in order to determine the state of the power grid and/correct for a fault in the power grid.

The distributed intelligence may further include distributed storage. For example, devices in the power grid (such as the substations) may have data storage associated with them. The data storage may be proximate to the substation (such as associated with a processor in the substation). The devices in the power grid may store data in the data storage (including sensor data, analytical data, etc.). The devices in the power grid may then send to the control center a link to the storage location of the data (e.g., a pointer to the address that houses the data in the data storage). The control center may store the link in a central data storage (such as a database). Thus, when the control center seeks to obtain the data, the central control may access the link in the central data storage, send a request to the grid device (such as a substation) requesting data associated with the link, and receive a response from the grid device comprising the data associated with the link.

As still another example, the INDS may improve the management of the power grid in several aspects including grid state measurement, non-operational collection and storage, event management, demand reduction signaling, outage intelligence, fault intelligence, remote asset monitoring (including monitoring one or more assets within the power grid), power quality monitoring (such as the purity of the current/voltage waveform), system performance measurement (such as reliability as to whether the power is on or off), work order initiation, meta data management, notification agent, meter data collection, transactional analytics, grid control processes, and real-time analytics.

In still another example, the INDS may improve management of the power grid by taking advantage of the modular design of the INDE Reference Architecture. This may enable a different business model than is currently used (such as by outsourcing one or more functions) and enabling the efficient management of a plurality of power grids. In yet still another example, a particular power grid may be analyzed in order to determine which aspects of the INDE Reference Architecture or the INDS to apply to upgrade the operation of the particular power grid.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

DETAILED DESCRIPTION OF THE DRAWINGS AND THE PRESENTLY PREFERRED EMBODIMENTS

By way of overview, the preferred embodiments described below relate to a method and system for managing a power grid. As discussed in more detail below, certain aspects relate to the power grid itself (include hardware and software in the electric power transmission and/or the electricity distribution). Further, certain aspects relate to the functional capabilities of the central management of the power grid. These functional capabilities may be grouped into two categories, operation and application. The operations services enable the utilities to monitor and manage the smart grid infrastructure (such as applications, network, servers, sensors, etc).

As discussed in more detail below, the application capabilities may relate to the measurement and control of the grid itself. Specifically, the application services enable the functionality that may be important to a smart grid, and may include: (1) data collection processes; (2) data categorization and persistence processes; and (3) observability processes. As discussed in more detail below, using these processes allows one to "observe" the grid, analyze the data and derive information about the grid.

INDE High Level Architecture Description

Overall Architecture

Figure 1A:
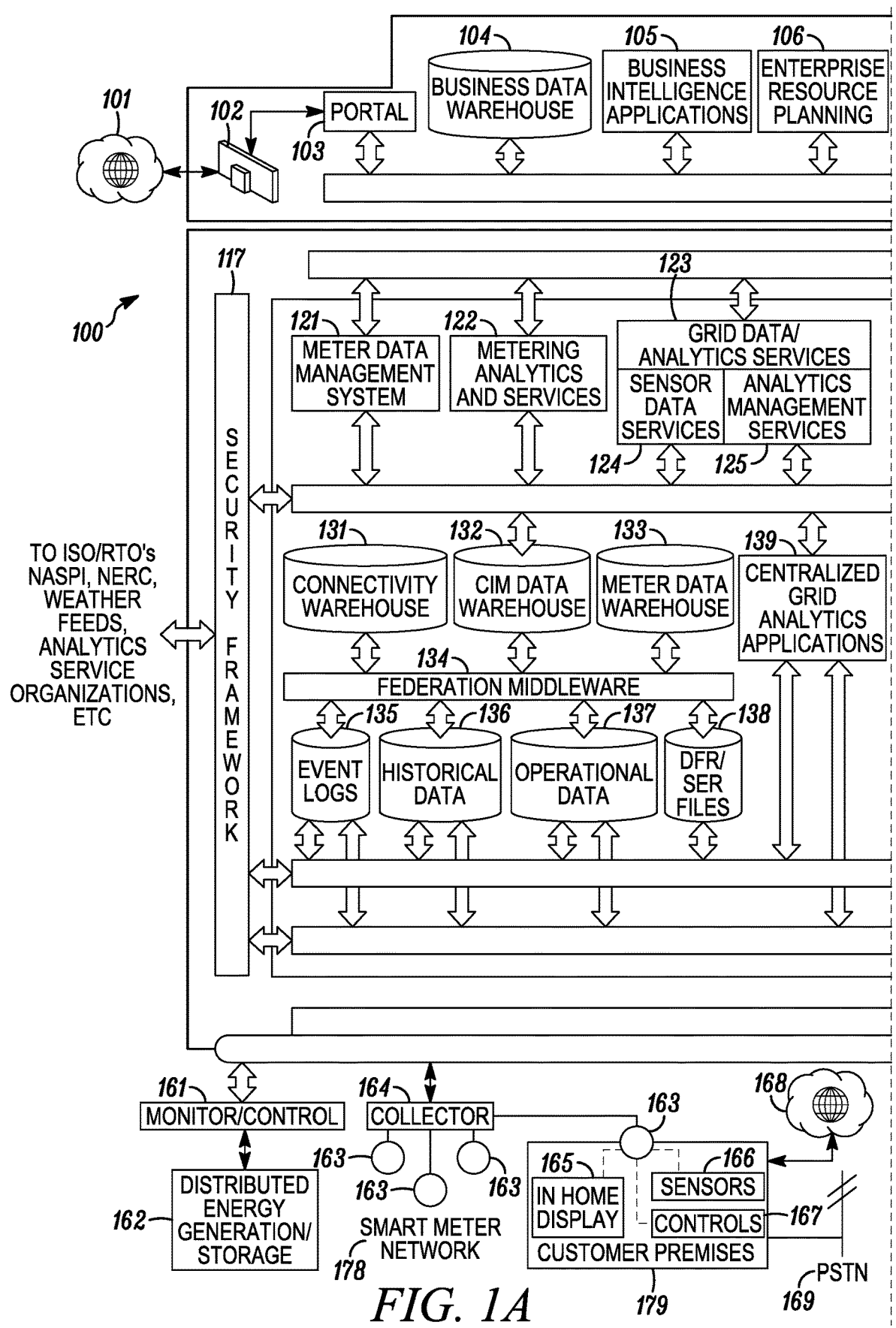
FIGS. 1A-C are block diagrams of one example of the overall architecture for a power grid.
Figure 1B:
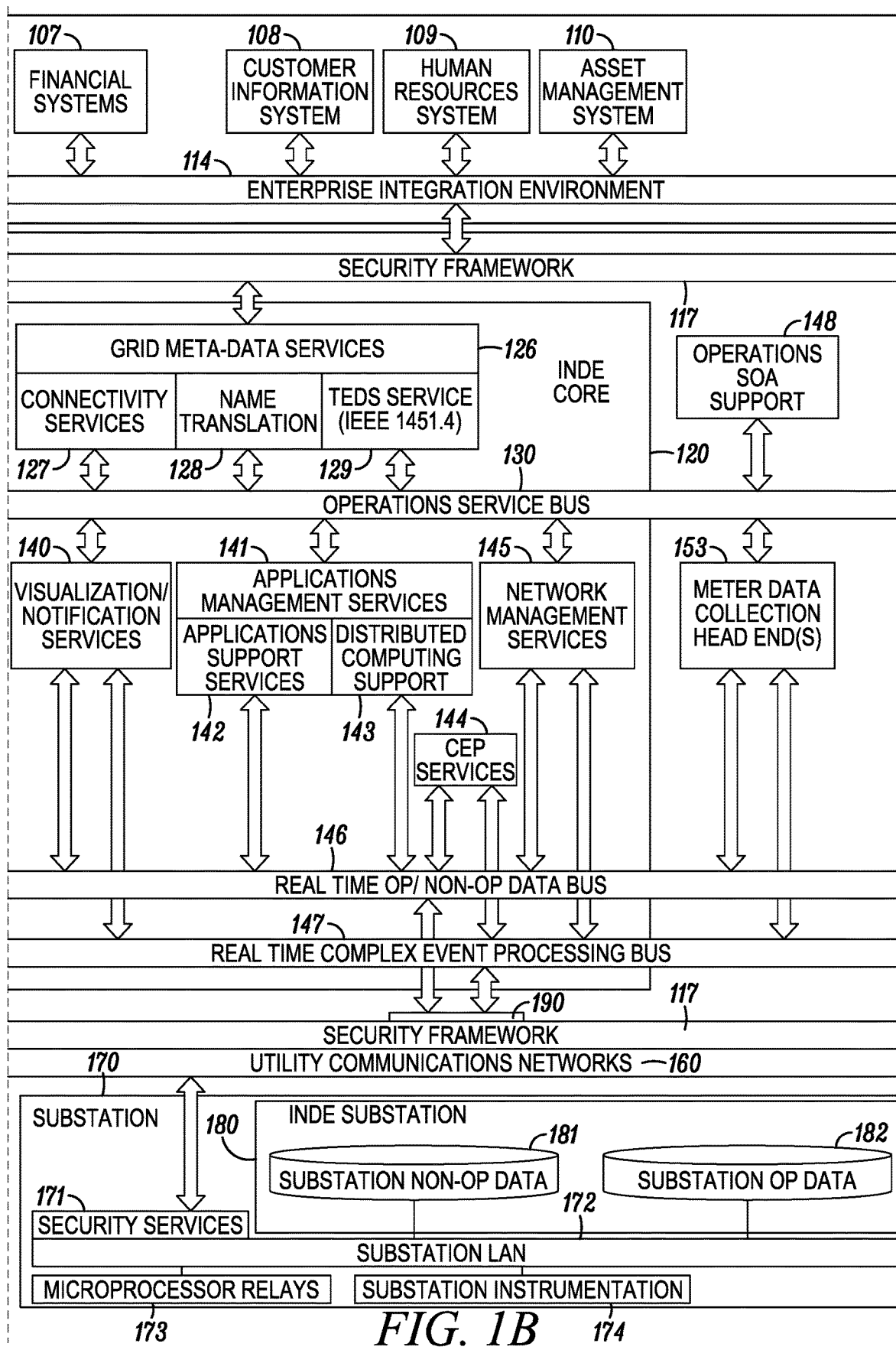
Figure 1C:
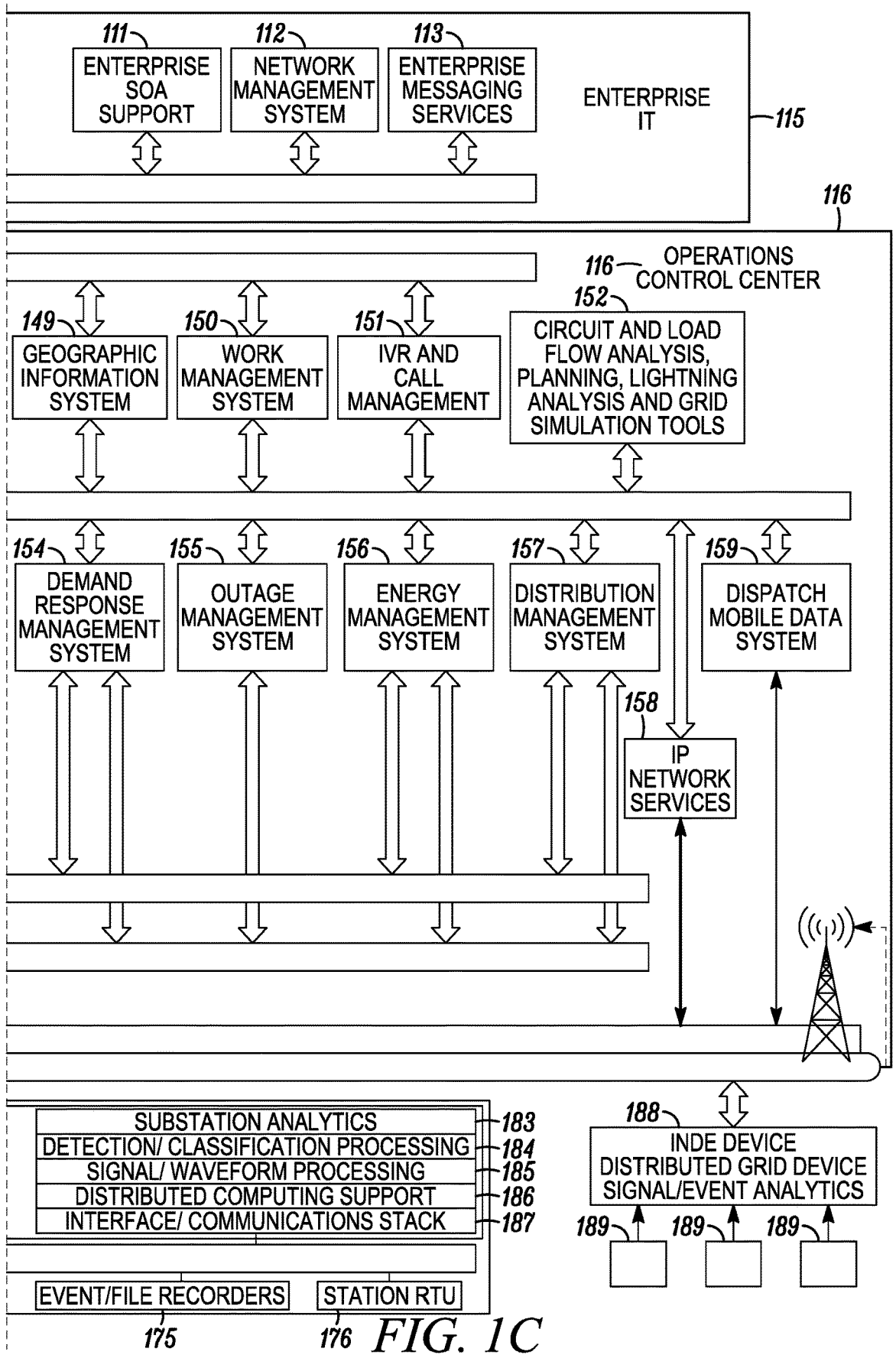

Turning to the drawings, wherein like reference numerals refer to like elements, FIGS. 1A-C illustrate one example of the overall architecture for INDE. This architecture may serve as a reference model that provides for end to end collection, transport, storage, and management of smart grid data; it may also provide analytics and analytics management, as well as integration of the forgoing into utility processes and systems. Hence, it may be viewed as an enterprise-wide architecture. Certain elements, such as operational management and aspects of the grid itself, are discussed in more detail below.

The architecture depicted in FIGS. 1A-C may include up to four data and integration buses: (1) a high speed sensor data bus 146 (which may include operational and non-operational data); (2) a dedicated event processing bus 147 (which may include event data); (3) an operations service bus 130 (which may serve to provide information about the smart grid to the utility back office applications); and (4) an enterprise service bus for the back office IT systems (shown in FIGS. 1A-C as the enterprise integration environment bus 114 for serving enterprise IT 115). The separate data buses may be achieved in one or more ways. For example, two or more of the data buses, such as the high speed sensor data bus 146 and the event processing bus 147, may be different segments in a single data bus. Specifically, the buses may have a segmented structure or platform. As discussed in more detail below, hardware and/or software, such as one or more switches, may be used, to route data on different segments of the data bus.

As another example, two or more of the data buses may be on separate buses, such as separate physical buses in terms of the hardware needed to transport data on the separate buses. Specifically, each of the buses may include cabling, separate from each other. Further, some or all of the separate buses may be of the same type. For example, one or more of the buses may comprise a local area network (LAN), such as Ethernet® over unshielded twisted pair cabling and Wi-Fi. As discussed in more detail below, hardware and/or software, such as a router, may be used to route data on data onto one bus among the different physical buses.

As still another example, two or more of the buses may be on different segments in a single bus structure and one or more buses may be on separate physical buses. Specifically, the high speed sensor data bus 146 and the event processing bus 147 may be different segments in a single data bus, while the enterprise integration environment bus 114 may be on a physically separate bus.

Though FIGS. 1A-C depict four buses, fewer or greater numbers of buses may be used to carry the four listed types of data. For example, a single unsegmented bus may be used to communicate the sensor data and the event processing data (bringing the total number of buses to three), as discussed below. And, the system may operate without the operations service bus 130 and/or the enterprise integration environment bus 114.

The IT environment may be SOA-compatible. Service Oriented Architecture (SOA) is a computer systems architectural style for creating and using business processes, packaged as services, throughout their lifecycle. SOA also defines and provisions the IT infrastructure to allow different applications to exchange data and participate in business processes. Although, the use of SOA and the enterprise service bus are optional.

The figures illustrate different elements within the overall architecture, such as the following: (1) INDE CORE 120; (2) INDE SUBSTATION 180; and (3) INDE DEVICE 188. This division of the elements within the overall architecture is for illustration purposes. Other division of the elements may be used. The INDE architecture may be used to support both distributed and centralized approaches to grid intelligence, and to provide mechanisms for dealing with scale in large implementations.

The INDE Reference Architecture is one example of the technical, architecture that may be implemented. For example, it may be an example of a meta-architecture, used to provide a starting point for developing any number of specific technical architectures, one for each utility solution, as discussed below. Thus, the specific solution for a particular utility may include one, some, or ail of the elements in the INDE Reference Architecture. And, the INDE Reference Architecture may provide a standardized starting point for solution development. Discussed below is the methodology for determining the specific technical architecture for a particular power grid.

The INDE Reference Architecture may be an enterprise wide architecture. Its purpose may be to provide the framework for end to end management of grid data and analytics and integration of these into utility systems and processes. Since smart grid technology affects every aspect of utility business processes, one should be mindful of the effects not just at the grid, operations, and customer premise levels, but also at the back office and enterprise levels. Consequently the INDE Reference Architecture can and does reference enterprise level SOA, for example, in order to support the SOA environment for interface purposes. This should not be taken as a requirement that a utility must convert their existing IT environment to SOA before a smart grid can be built and used. An enterprise service bus is a useful mechanism for facilitating IT integration, but it is not required in order to implement the rest of the smart grid solution. The discussion below focuses on different components of the INDE smart grid elements.

INDE Component Groups

As discussed above, the different components in the INDE Reference Architecture may include, for example: (1) INDE CORE 120; (2) INDE SUBSTATION 180; and (3) INDE DEVICE 188. The following sections discuss these three example element groups of the INDE Reference Architecture and provide descriptions of the components of each group.

INDE Core

Figure 2:
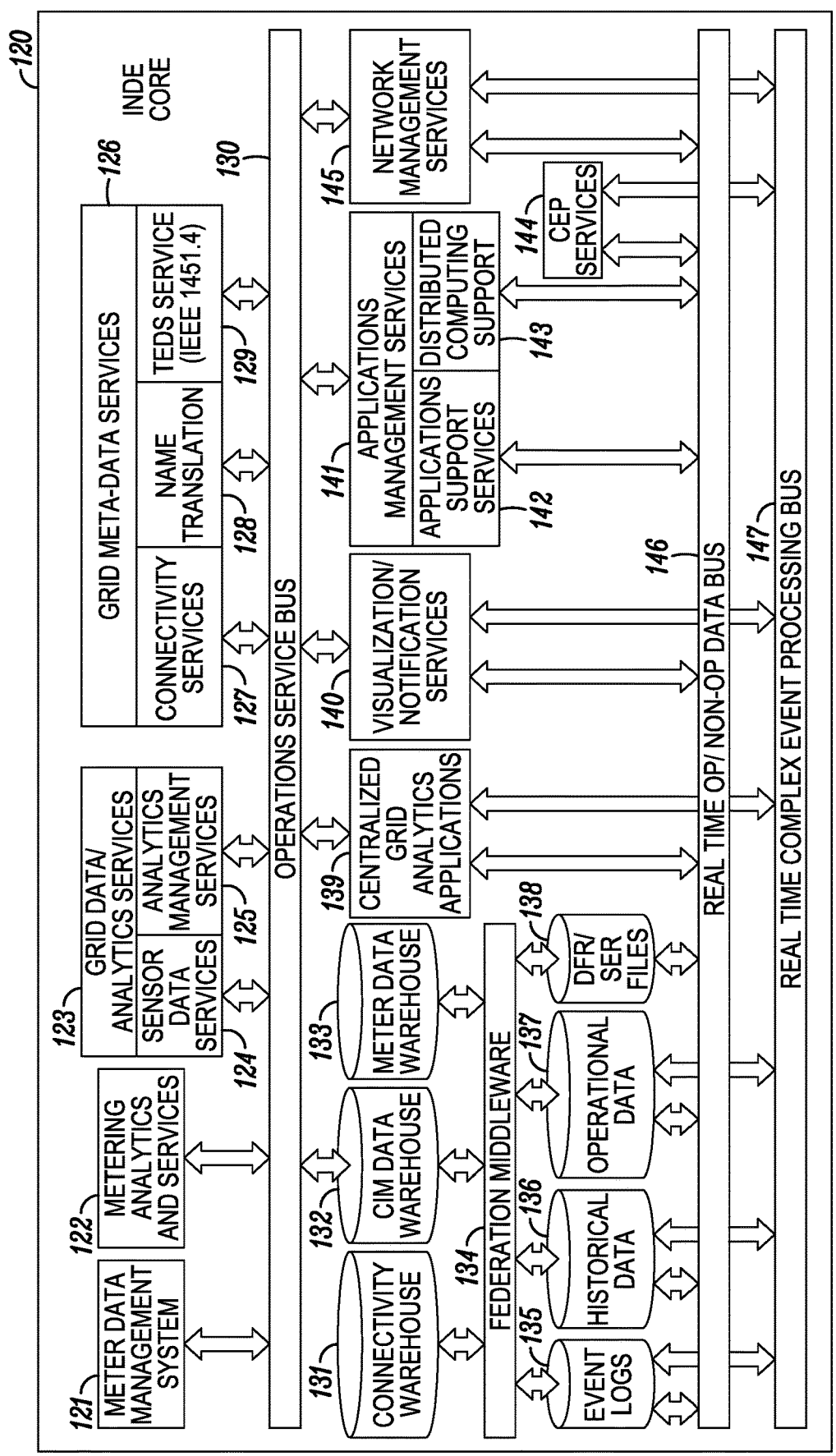
FIG. 2 is a block diagram of the INDE CORE depicted in FIG. 1.

FIG. 2 illustrates the INDE CORE 120, which is the portion of INDE Reference Architecture that may reside in an operations control center, as shown in FIGS. 1A-C. The INDE CORE 120 may contain a unified data architecture for storage of grid data and an integration schema for analytics to operate on that data. This data architecture may use the International Electrotechnical Commission (IEC) Common Information Model (CIM) as its top level schema. The IEC CIM is a standard developed by the electric power industry that has been officially adopted by the IEC, aiming to allow application software to exchange information about the configuration and status of an electrical network.

In addition, this data architecture may make use of federation middleware 134 to connect other types of utility data (such as, for example, meter data, operational and historical data, log and event files), and connectivity and meta-data files into a single data architecture that may have a single entry point for access by high level applications, including enterprise applications. Real time systems may also access key data stores via the high speed data bus and several data stores can receive real time data. Different types of data may be transported within one or more buses in the smart grid. As discussed below in the INDE SUBSTATION 180 section, substation data may be collected and stored locally at the substation. Specifically, a database, which may be associated with and proximate to the substation, may store the substation data. Analytics pertaining to the substation level may also be performed at the substation computers and stored at the substation database, and all or part of the data may be transported to the control center.

The types of data transported may include operation and non-operational data, events, grid connectivity data, and network location data. Operational data may include, but is not limited to, switch state, feeder state, capacitor state, section state, meter state, FCI state, line sensor state, voltage, current real power, reactive power, etc. Non-operational data may include, but is not limited to, power quality, power reliability, asset health, stress data, etc. The operational and non-operational data may be transported using an operational/non-operational data bus 146. Data collection applications in the electric power transmission and/or electricity distribution of the power grid may be responsible for sending some or all of the data to the operational/non-operational data bus 146. In this way, applications that need this information may be able to get the data by subscribing to the information or by invoking services that may make this data available.

Events may include messages and/or alarms originating from the various devices and sensors that are part of the smart grid, as discussed below. Events may be directly generated from the devices and sensors on the smart grid network as well as generated by the various analytics applications based on the measurement data from these sensors and devices. Examples of events may include meter outage, meter alarm, transformer outage, etc. Grid components like grid devices (smart power sensors (such as a sensor with an embedded processor that can be programmed for digital processing capability) temperature sensors, etc.), power system components that includes additional embedded processing (RTUs, etc), smart meter networks (meter health, meter readings, etc), and mobile field force devices (outage events, work order completions, etc) may generate event data, operational and non operational data. The event data generated within the smart grid may be transmitted via an event bus 147.

Grid connectivity data may define the layout of the utility grid. There may be a base layout which defines the physical layout of the grid components (sub stations, segments, feeders, transformers, switches, reclosers, meters, sensors, utility poles, etc) and their inter-connectivity at installation. Based on the events within the grid (component failures, maintenance activity, etc), the grid connectivity may change on a continual basis. As discussed in more detail below, the structure of how the data is stored as well as the combination of the data enable the historical recreation of the grid layout at various past times. Grid connectivity data may be extracted from the Geographic Information System (GIS) on a periodic basis as modifications to the utility grid are made and this information is updated in the GIS application.

Network location data may include the information about the grid component on the communication network. This information may be used to send messages and information to the particular grid component. Network location data may be either entered manually into the Smart Grid database as new Smart Grid components are installed or is extracted from an Asset Management System if this information is maintained externally.

As, discussed in more detail below, data may be sent from various components in the grid (such as INDE SUBSTATION 180 and/or INDE DEVICE 188). The data may be sent to the INDE CORE 120 wirelessly, wired, or a combination of both. The data may be received by utility communications networks 160, which may send the data to routing device 190. Routing device 190 may comprise software and/or hardware for managing routing of data onto a segment of a bus (when the bus comprises a segmented bus structure) or onto a separate bus. Routing device may comprise one or more switches or a router. Routing device 190 may comprise a networking device whose software and hardware routes and/or forwards the data to one or more of the buses. For example, the routing device 190 may, route operational and non-operational data to the operational/non-operational data bus 146. The router may also route event data to the event bus 147.

The routing device 190 may determine how to route the data based on one or more methods. For example, the routing device 190 may examine one or more headers in the transmitted data to determine whether to route the data to the segment for the operational/non-operational data bus 146 or to the segment for the event bus 147. Specifically, one or more headers in the data may indicate whether the data is operation/non-operational data (so that the routing device 190 routes the data to the operational/non-operational data bus 146) or whether the data is event data (so that the routing device 190 routes the event bus 147). Alternatively, the routing device 190 may examine the payload of the data to determine the type of data (e.g., the routing device 190 may examine the format of the data to determine if the data is operational/non-operational data or event data).

One of the stores, such as the operational data warehouse 137 that stores the operational data, may be implemented as true distributed database. Another of the stores, the historian (identified as historical data 136 in FIGS. 1 and 2), may be implemented as a distributed database. The other "ends" of these two databases may be located in the INDE SUBSTATION 180 group (discussed below). Further, events may be stored directly into any of several data stores via the complex event processing bus. Specifically, the events may be stored in event logs 135, which may be a repository for all the events that have published to the event bus 147. The event log may store one, some, or all of the following: event id; event type; event source; event priority; and event generation time. The event bus 147 need not store the events long term, providing the persistence for all the events.

The storage of the data may be such that the data may be as close to the source as possible or practicable. In one implementation, this may include, for example, the substation data being stored at the INDE SUBSTATION 180. But this data may also be required at the operations control center level 116 to make different types of decisions that consider the grid at a much granular level. In conjunction with a distributed intelligence approach, a distributed data approach may be been adopted to facilitate data availability at all levels of the solution through the use of database links and data services as applicable. In this way, the solution for the historical data store (which may be accessible at the operations control center level 116) may be similar to that of the operational data store. Data may be stored locally at the substation and database links configured on the repository instance at the control center, provide access to the data at the individual substations. Substation analytics may be performed locally at the substation using the local data store. Historical/collective analytics may be performed at the operations Control center level 116 by accessing data at the local substation instances using the database links. Alternatively, data may be stored centrally at the INDE CORE 120. However, given the amount of data that may need to be transmitted from the INDE DEVICES 188, the storage of the data at the INDE DEVICES 188 may be preferred. Specifically, if there are thousands or tens of thousands of substations (which may occur in a power grid), the amount of data that needs to be transmitted to the INDE CORE 120 may create a communications bottleneck.

Finally, the INDE CORE 120 may program or control one, some or all of the INDE SUBSTATION 180 or INDE DEVICE 188 in the power grid (discussed below). For example, the INDE CORE 120 may modify the programming (such as download an updated program) or provide a control command to control any aspect of the INDE SUBSTATION 180 or INDE DEVICE 188 (such as control of the sensors or analytics). Other elements, not shown in FIG. 2, may include various integration elements to support this logical architecture.

Table 1 describes the certain elements of INDE ORE 120 as depicted in FIG. 2.

TABLE 1

| INDE CORE Elements | |
| --- | --- |
| INDE CORE Element | Description |
| CEP Services 144 | Provides high speed, low latency event stream processing, event filtering, and multi-stream event correlation |
| Centralized Grid Analytics Applications 139 | May consist of any number of commercial or custom analytics applications that are used in a non-real time manner, primarily operating from the data stores in CORE |
| Visualization/Notification Services 140 | Support for visualization of data, states and event streams, and automatic notifications based on event triggers |
| Application Management Services 141 | Services (such as Applications Support Services 142 and Distributed Computing Support 143) that support application launch and execution, web services, and support for distributed computing and automated remote program download (e.g., OSGi) |
| Network Management Services 145 | Automated monitoring of communications networks, applications and databases; system health monitoring, failure root cause analysis (non-grid) |
| Grid Meta-Data Services 126 | Services (such as Connectivity Services 127, Name Translation 128, and TEDS Service 129) for storage, retrieval, and update of system meta-data, including grid and communication/sensor net connectivity, point lists, sensor calibrations, protocols, device set points, etc |
| Grid Data/Analytics Services 123 | Services (such as Sensor Data Services 124 and Analytics Management Services 125) to support access to grid data and grid analytics; management of analytics |
| Meter Data Management System 121 | Meter data management system functions (e.g., Lodestar) |
| AMOS Meter Data Services | See discussion below |
| Real Time Complex Event Processing Bus 147 | Message bus dedicated to handling event message streams - purpose of a dedicated bus it to provide high bandwidth and low latency for highly bursty event message floods. The event message may be in the form of XML message. Other types of messages may be used. Events may be segregated from operational/non-operational data, and may be transmitted on a separate or dedicated bus. Events typically have higher priority as they usually require some immediate action from a utility operational |

TABLE 1-continued

INDE CORE Elements

| INDE CORE Element | Description |
| --- | --- |
| | perspective (messages from defective meters, transformers, etc) |
| | The event processing bus (and the associated event correlation processing service depicted in FIG. 1) may filter floods of events down into an interpretation that may better be acted upon by other devices. In addition, the event processing bus may take multiple event streams, find various patterns occurring across the multiple event streams, and provide an interpretation of multiple event streams. In this way, the event processing bus may not simply examine the event data from a single device, instead looking at multiple device (including multiple classes of devices that may be seemingly unrelated) in order to find correlations. The analysis of the single or multiple event streams may be rule based |
| Real Time Op/Non-Op Data Bus 146 | Operational data may include data reflecting the current state of the electrical state of the grid that may be used in grid control (e.g., currents, voltages, real power, reactive power, etc.). Non-operational data may include data reflecting the "health" or condition of a device. |
| | Operational data has previously been transmitted directly to a specific device (thereby creating a potential "silo" problem of not making the data available to other devices or other applications). For example, operational data previously was transmitted to the SCADA (Supervisory Control And Data Acquisition) system for grid management (monitor and control grid). However, using the bus structure, the operational data may also be used for load balancing, asset utilization/optimization, system planning, etc., as discussed for example in FIGS. 10-19. |
| | Non-operational data was previously obtained by sending a person in the field to collect the operational data (rather than automatically sending the non-operational data to a central repository). |
| | Typically, the operational and non-operational data are generated in the various devices in the grid at predetermined times. This is in contrast to the event data, which typically is generated in bursts, as discussed below. |
| | A message bus may be dedicated to handling streams of operational and non-operational data from substations and grid devices. |
| | The purpose of a dedicated bus may be to provide constant low latency through put to match the data flows; as discussed elsewhere, a single bus may be used for transmission of both the operation and non-operational data and the event processing data in some circumstances (effectively combining the operation/non-operational data bus with the event processing bus). |
| Operations Service Bus 130 | Message bus that supports integration of typical utility operations applications (EMS (energy management system), DMS (distribution management system), OMS (outage management system), GIS (geographic information system), dispatch) with newer smart grid functions and systems (DRMS (demand response management system), external analytics, CEP, visualization). The various buses, including the Operation/Non-operational Data bus 146, the Event data bus 147, and the operations Service Bus 130 may obtain weather feeds, etc. via a security framework 117. The operations service bus 130 may serve as the provider of information about the smart grid to the utility back office applications, as shown in FIG. 1. The analytics applications may turn the raw data from the sensors and devices on the grid into actionable information that will be available to utility applications to perform actions to control the grid. Although most of the interactions between the utility back office applications and the INDE CORE 120 is expected to occur thru this bus, utility applications |

TABLE 1-continued

INDE CORE Elements

| INDE CORE Element | Description |
|---|---|
| | will have access to the other two buses and will consume data from those buses as well (for example, meter readings from the op/non-op data bus 146, outage events from the event bus 147) |
| CIM Data Warehouse 132 | Top level data store for the organization of grid data; uses the IEC CIM data schema; provides the primary contact point for access to grid data from the operational systems and the enterprise systems. Federation Middleware allow communication to the various databases. |
| Connectivity Warehouse 131 | The connectivity warehouse 131 may contain the electrical connectivity information of the components of the grid. This information may be derived from the Geographic Information System (GIS) of the utility which holds the as built geographical location of the components that make up the grid. The data in the connectivity warehouse 131 may describe the hierarchical information about all the components of the grid (substation, feeder, section, segment, branch, t-section, circuit breaker, recloser, switch, etc - basically all the assets). The connectivity warehouse 131 may have the asset and connectivity information as built. Thus, the connectivity warehouse 131 may comprise the asset database that includes all the devices and sensors attached to the components of the grid. |
| Meter Data Warehouse 133 | The meter data warehouse 133 may provide rapid access to meter usage data for analytics. This repository may hold all the meter reading information from the meters at customer premises. The data collected from the meters may be stored in meter data warehouse 133 and provided to other utility applications for billing (or other back-office operations) as well as other analysis. |
| Event Logs 135 | Collection of log files incidental to the operation of various utility systems. The event logs 135 may be used for post mortem analysis of events and for data mining |
| Historical Data 136 | Telemetry data archive in the form of a standard data historian. Historical data 136 may hold the time series non-operational data as well as the historical operational data. Analytics pertaining to items like power quality, reliability, asset health, etc may be performed using data in historical data 136. Additionally, as discussed below, historical data 136 may be used to derive the topology of the grid at any point in time by using the historical operational data in this repository in conjunction with the as-built grid topology stored in the connectivity data mart. Further, the data may be stored as a flat record, as discussed below. |
| Operational Data 137 | Operational Data 137 may comprise a real time grid operational database. Operational Data 137 may be built in true distributed form with elements in the substations (with links in Operational Data 137) as well as the Operations center. Specifically, the Operational Data 137 may hold data measurements obtained from the sensors and devices attached to the grid components. Historical data measurements are not held in this data store, instead being held in historical data 136. The data base tables in the Operational Data 137 may be updated with the latest measurements obtained from these sensors and devices. |
| DFR/SER Files 138 | Digital fault recorder and serial event recorder files; used for event analysis and data mining; files generally are created in the substations by utility systems and equipment |

Figure 3A:
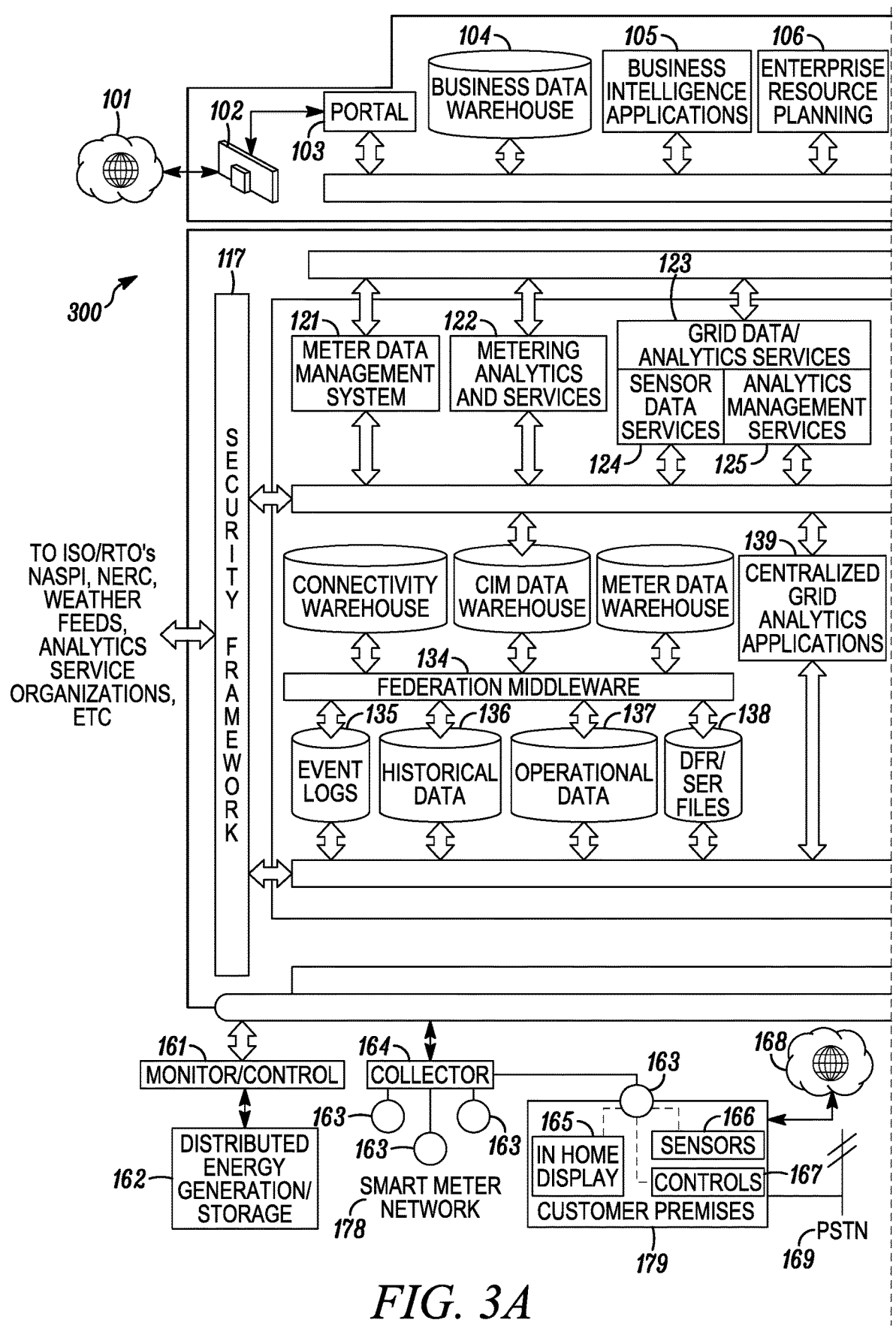
FIGS. 3A-C are block diagrams of another example of the overall architecture for a power grid.
Figure 3B:
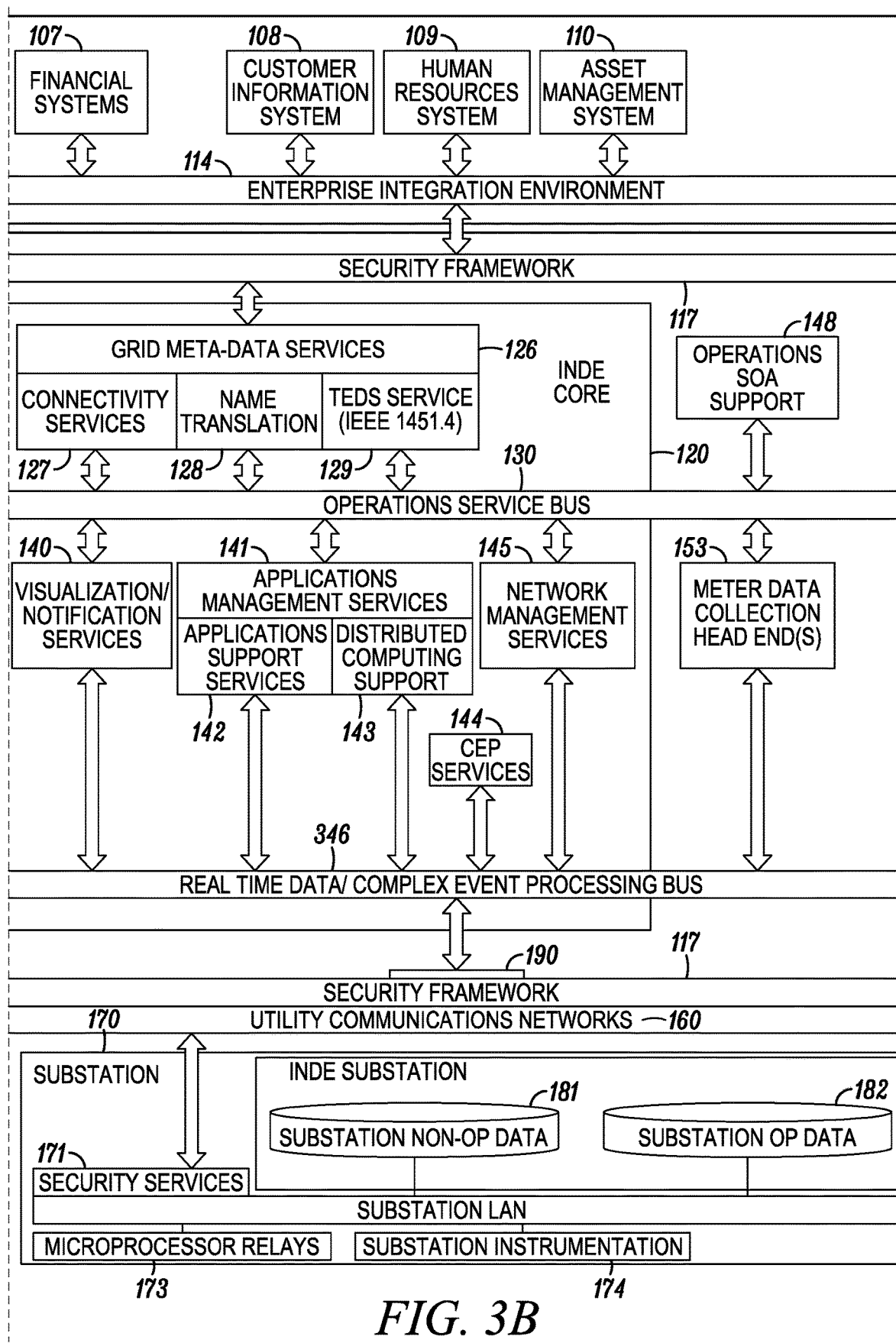
Figure 3C:
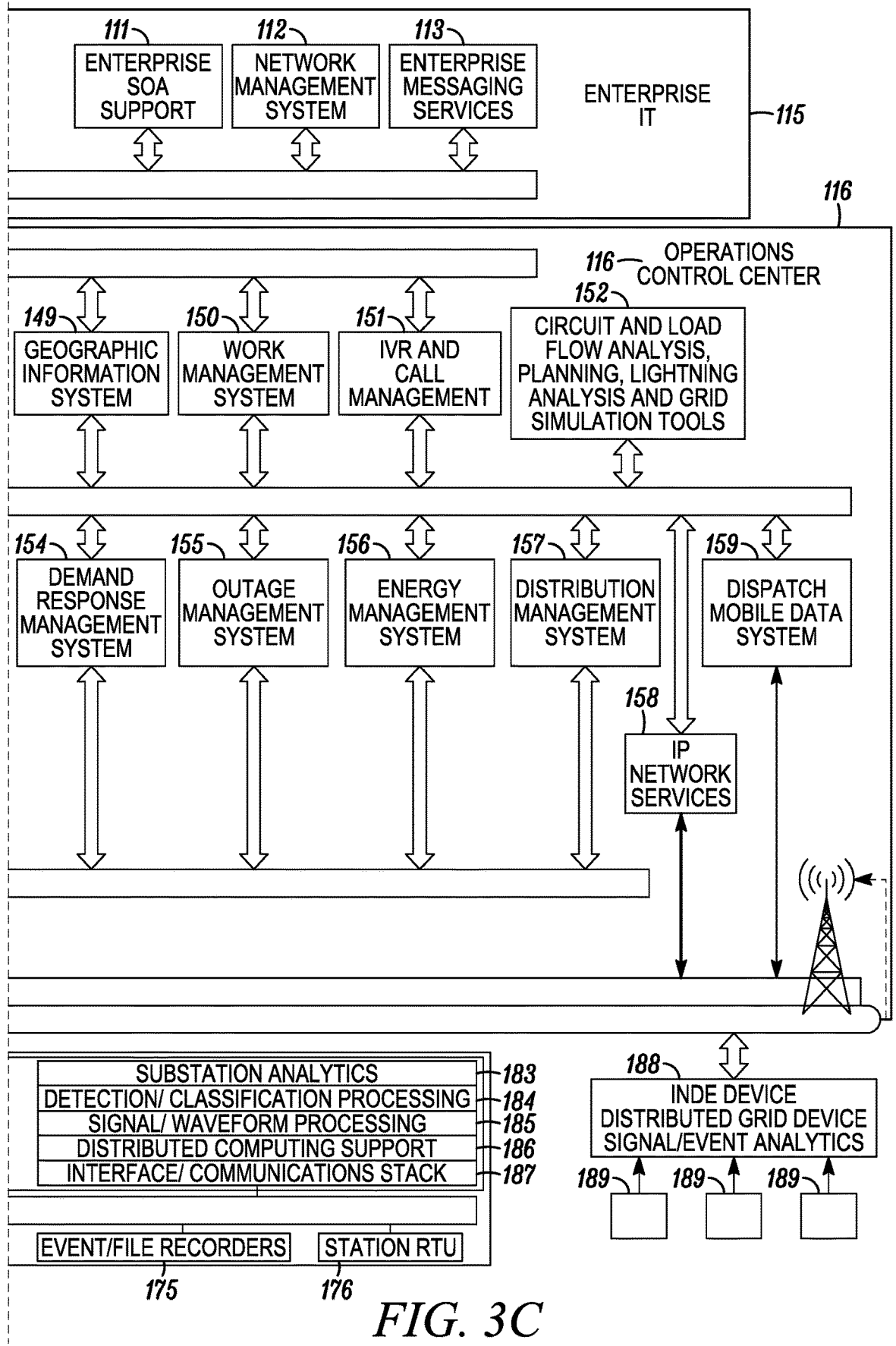

As discussed in Table 1, the real time data, bus 146 (which communicates the operation and non-operational data) and the real time complex event processing bus 147 (which communicates the event processing data) into a single bus 346. An example of this is illustrated in the block diagram 300 in FIGS. 3A-C.

As shown in FIGS. 1A-C, the buses are separate for performance purposes. For CEP processing, low latency may be important for certain applications which are subject to very large message bursts. Most of the grid data flows, on the other hand, are more or less constant, with the exception of digital fault recorder but these can usually be retrieved on a controlled basis, whereas event bursts are asynchronous and random.

FIG. 1 further shows additional elements in the operations control center 116 separate from the INDE CORE 120. Specifically, FIG. 1 further shows Meter Data Collection Head End(s) 153, a system that is responsible for communicating with meters (such as collecting data from them and providing the collected data to the utility). Demand Response Management System 154 is a system that communicates with equipment at one or more customer premises that may be controlled by the utility. Outage Management System 155 is a system that assists a utility in managing outages by tracking location of outages, by managing what is being dispatched, and by how they are being fixed. Energy Management System 156 is a transmission system level control system that controls the devices in the substations (for example) on the transmission grid. Distribution Management System 157 is a distribution system level control system that controls the devices in the substations and feeder devices (for example) for distribution grids. IP Network Services 158 is a collection of services operating on one or more servers that support IP-type communications (such a DHCP and FTP). Dispatch Mobile Data System 159 is a system that transmits/receives messages to mobile data terminals in the field. Circuit & Load Flow Analysis, Planning, Lightning Analysis and Grid Simulation Tools 152 are a collection of tools used by a utility in the design, analysis and planning for grids. IVR (integrated voice response) and Call Management 151 are systems to handle customer calls (automated or by attendants). Incoming telephone calls regarding outages may be automatically or manually entered and forwarded to the Outage Management System 155. Work Management System 150 is a system that monitors and manages work orders. Geographic Information System 149 is a database that contains information about where assets are located geographically and how the assets are connected together. If the environment has a Services Oriented Architecture (SOA), Operations SOA Support 148 is a collection of services to support the SOA environment.

One or more of the systems in the Operations Control Center 116 that are outside of the INDE Core 120 are legacy product systems that a utility may have. Examples of these legacy product systems include the Operations SOA Support 148, Geographic Information System 149, Work Management System 150, Call Management 151, Circuit & Load Flow Analysis, Planning, Lightning Analysis and Grid Simulation Tools 152, Meter Data Collection Head End(s) 153, Demand Response Management System 154, Outage Management System 155, Energy Management System 156, Distribution Management System 157, IP Network Services 158, and Dispatch Mobile Data System 159. However, these legacy product systems may not be able to process or handle data that is received from a smart grid. The INDE Core 120 may be able to receive the data from the smart grid, process the data from the smart grid, and transfer the processed data to the one or more legacy product systems in a fashion that the legacy product systems may use (such as particular formatting particular to the legacy product system). In this way, the INDE Core 120 may be viewed as a middleware.

The operations control center 116, including the INDE CORE 120, may communicate with the Enterprise IT 115. Generally speaking, the functionality in the Enterprise IT 115 comprises back-office operations. Specifically, the Enterprise IT 115 may use the enterprise integration environment bus 114 to send data to various systems within the Enterprise IT 115, including Business Data Warehouse 104, Business Intelligence Applications 105, Enterprise Resource Planning 106, various Financial Systems 107, Customer Information System 108, Human Resource System 109, Asset Management System 110, Enterprise SOA Support 111, Network Management System 112, and Enterprise Messaging Services 113. The Enterprise IT 115 may further include a portal 103 to communicate with the Internet 101 via a firewall 102.

INDE SUBSTATION

Figure 4:
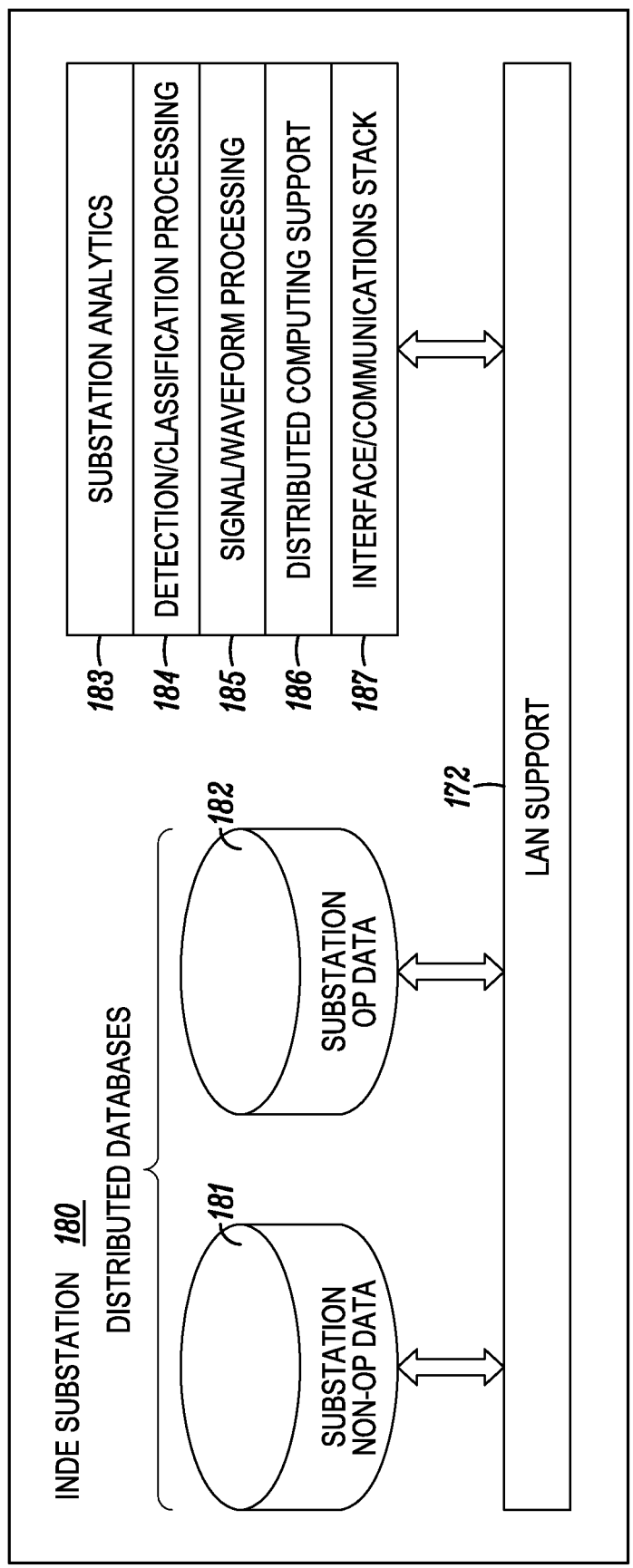
FIG. 4 is a block diagram of the INDE SUBSTATION depicted in FIGS. 1 and 3.

FIG. 4 illustrates an example of the high level architecture for the INDE SUBSTATION 180 group. This group may comprise elements that are actually hosted in the substation 170 at a substation control house on one or more servers co-located with the substation electronics and systems.

Table 2 below lists and describes certain INDE SUBSTATION 180 group elements. Data security services 171 may be a part of the substation environment; alternatively, they may be integrated into the INDE SUBSTATION 180 group.

TABLE 2

INDE SUBSTATION Elements

| INDE SUBSTATION ELEMENTS | Description |
| --- | --- |
| Non-Operational Data Store 181 | Performance and health data; this is a distributed data historian component |
| Operational Data Store 182 | Real time grid state data; this is part of a true distributed database |
| Interface/Communications Stack 187 | Support for communications, including TCP/IP, SNMP, DHCP, SFTP, IGMP, ICMP, DNP3, IEC 61850, etc. |
| Distributed/remote computing support 186 | Support for remote program distribution, inter-process communication, etc. (DCE, JINI, OSGi for example) |
| Signal/Waveform Processing 185 | Support for real time digital signal processing components; data normalization; engineering units conversions |
| Detection/Classification Processing 184 | Support for real time event stream processing, detectors and event/waveform classifiers (ESP, ANN, SVM, etc.) |
| Substation Analytics 183 | Support for programmable real time analytics applications; DNP3 scan master; |

TABLE 2-continued

INDE SUBSTATION Elements

| INDE SUBSTATION ELEMENTS | Description |
|---|---|
| | The substation analytics may allow for analysis of the real-time operational and non-operational data in order to determine if an "event" has occurred. The "event" determination may be rule-based with the rules determining whether one of a plurality of possible events occurring based on the data. The substation analytics may also allow for automatic modification of the operation of the substation based on a determined event. In this way, the grid (including various portions of the grid) may be "self-healing." This "self-healing" aspect avoids the requirement that the data be transmitted to a central authority, the data be analyzed at the central authority, and a command be sent from the central authority to the grid before the problem in the grid be corrected. In addition to the determination of the "event," the substation analytics may also generate a work-order for transmission to a central authority. The work-order may be used, for example, for scheduling a repair of a device, such as a substation. |
| Substation LAN 172 | Local networking inside the substation to various portions of the substation, such as microprocessor relays 173, substation instrumentation 174, event file recorders 175, and station RTUs 176. |
| Security services 171 | The substation may communicate externally with various utility communications networks via the security services layer. |

As discussed above, different elements within the smart grid may include additional functionality including additional processing/analytical capability and database resources. The use of this additional functionality within various elements in the smart grid enables distributed architectures with centralized management and administration of applications and network performance. For functional, performance, and scalability reasons, a smart grid involving thousands to tens of thousands of INDE SUBSTATIONS 180 and tens of thousands to millions of grid devices may include distributed processing, data management, and process communications.

The INDE SUBSTATION 180 may include one or more processors and one or more memory devices (such as substation non-operational data 181 and substation operations data 182). Non-operational data 181 and substation operations data 182 may be associated with and proximate to the substation, such as located in or on the INDE SUBSTATION 180. The INDE SUBSTATION 180 may further include components of the smart grid that are responsible for the observability of the smart grid at a substation level. The INDE SUBSTATION 180 components may provide three primary functions; operational data acquisition and storage in the distributed operational data store; acquisition of non-operational data and storage in the historian; and local analytics processing on a real time (such as a sub-second) basis. Processing may include digital signal processing of voltage and current waveforms, detection and classification processing, including event stream processing; and communications of processing results to local systems and devices as well as to systems at the operations control center 116. Communication between the INDE SUBSTATION 180 and other devices in the grid may be wired, wireless, or a combination of wired and wireless. For example, the transmission of data from the INDE SUBSTATION 180 to the operations control center 116 may be wired.

The INDE SUBSTATION 180 may transmit data, such as operation/non-operational data or event data, to the operations control center 116. Routing device 190 may route the transmitted data to one of the operational/non-operational data bus 146 or the event bus 147.

Demand response optimization for distribution loss management may also be performed here. This architecture is in accordance with the distributed application architecture principle previously discussed.

For example, connectivity data may be duplicated at the substation 170 and at the operations control center 116, thereby allowing a substation 170 to operate independently even if the data communication network to the operations control center 116 is not functional. With this information (connectivity) stored locally, substation analytics may be performed locally even if the communication link to the operations control center is inoperative.

Similarly, operational data may be duplicated at the operations control center 116 and at the substations 170. Data from the sensors and devices associated with a particular substation may be collected and the latest measurement may be stored in this data store at the substation. The data structures of the operational data store may be the same and hence database links may be used to provide seamless access to data that resides on the substations thru the instance of the operational data store at the control center. This provides a number of advantages including alleviating data replication and enabling substation data analytics, which is more time sensitive, to occur locally and without reliance on communication availability beyond the substation. Data analytics at the operations control center level 116 may be less time sensitive as the operations control center 116 may typically examine historical data to discern patterns that are more predictive, rather than reactive) and may be able to work around network issues if any.

Finally, historical data may be stored locally at the substation and a copy of the data may be stored at the control center. Or, database links may be configured on the repository instance at the operations control center 116, providing the operations control center access to the data at the individual substations. Substation analytics may be performed locally at the substation 170 using the local data store. Specifically, using the additional intelligence and storage capability at the substation enables the substation to analyze itself and to correct itself without input from a central authority. Alternatively, historical/collective analytics may also be performed at the operations control center level 116 by accessing data at the local substation instances using the database links.

INDE Device

The INDE DEVICE 188 group may comprise any variety of devices within the smart grid, including various sensors within the smart grid, such as various distribution grid devices 189 (e.g., line sensors on the power lines), meters 163 at the customer premises, etc. The INDE DEVICE 188 group may comprise a device added to the grid with particular functionality (such as a smart Remote Terminal Unit (RTU) that includes dedicated programming), or may comprise an existing device within the grid with added functionality (such as an existing open architecture pole top RTU that is already in place in the grid that, may be programmed to create a smart line sensor or smart grid device). The INDE DEVICE 188 may further include one or more processors and one or more memory devices.

Existing grid devices may not be open from the software standpoint, and may not be capable of supporting much in the way of modern networking or software services. The existing grid devices may have been designed to acquire and store data for occasional offload to some other device such as a laptop computer, or to transfer batch files via PSTN line to a remote host on demand. These devices may not be designed for operation in a real time digital network environment. In these cases, the grid device data may be obtained at the substation level 170, or at the operations control center level 116, depending on how the existing communications network has been designed. In the case of meters networks, it will normally be the case that data is obtained from the meter data collection engine, since meter networks are usually closed and the meters may not be addressed directly. As these networks evolve, meters and other grid devices may be individually addressable, so that data may be transported directly to where it is needed, which may not necessarily be the operations control center 116, but may be anywhere on the grid.

Figure 5A:
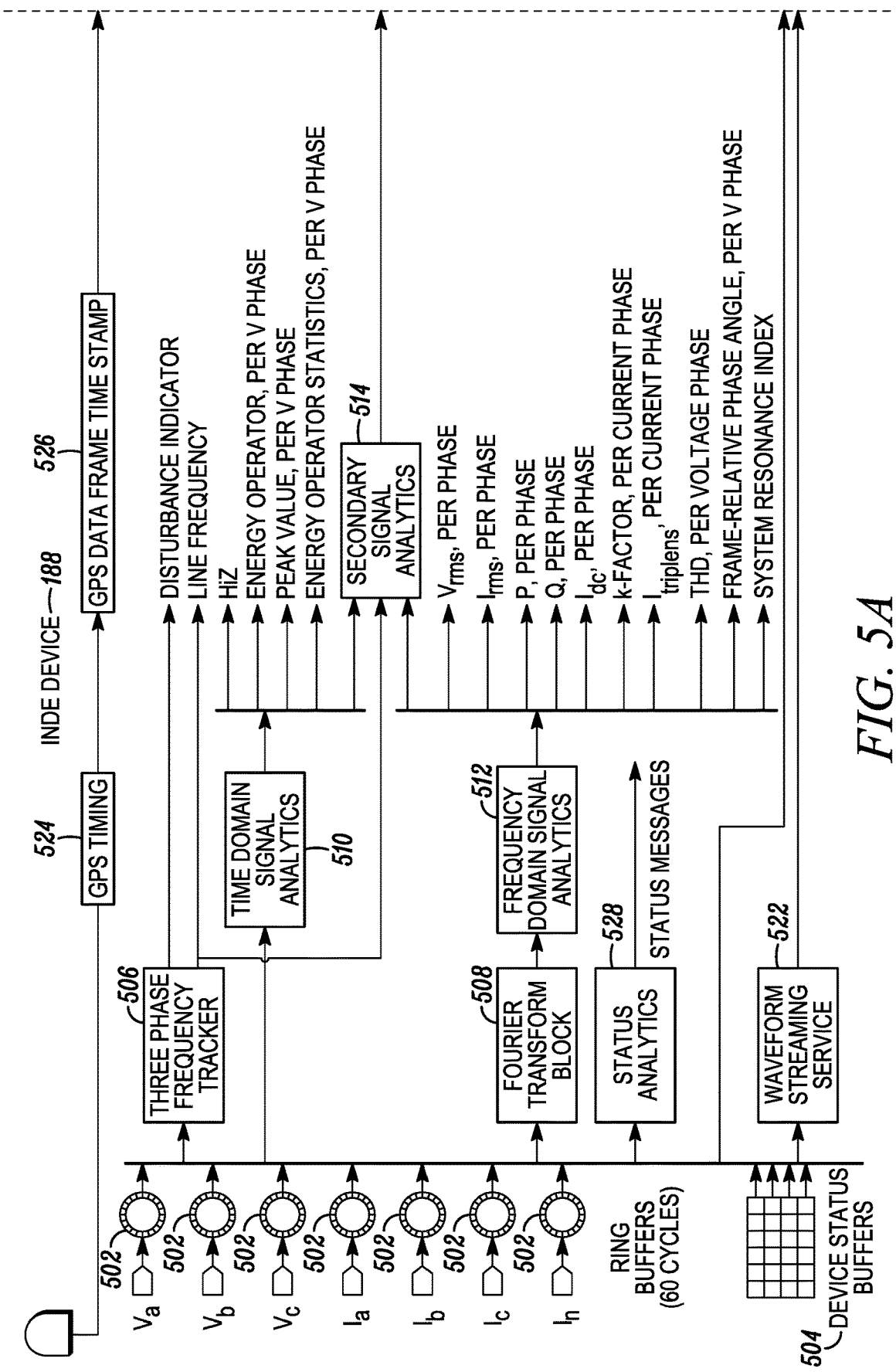
FIGS. 5A-5B are block diagrams of the INDE DEVICE depicted in FIGS. 1A-C and 3A-C.
Figure 5B:
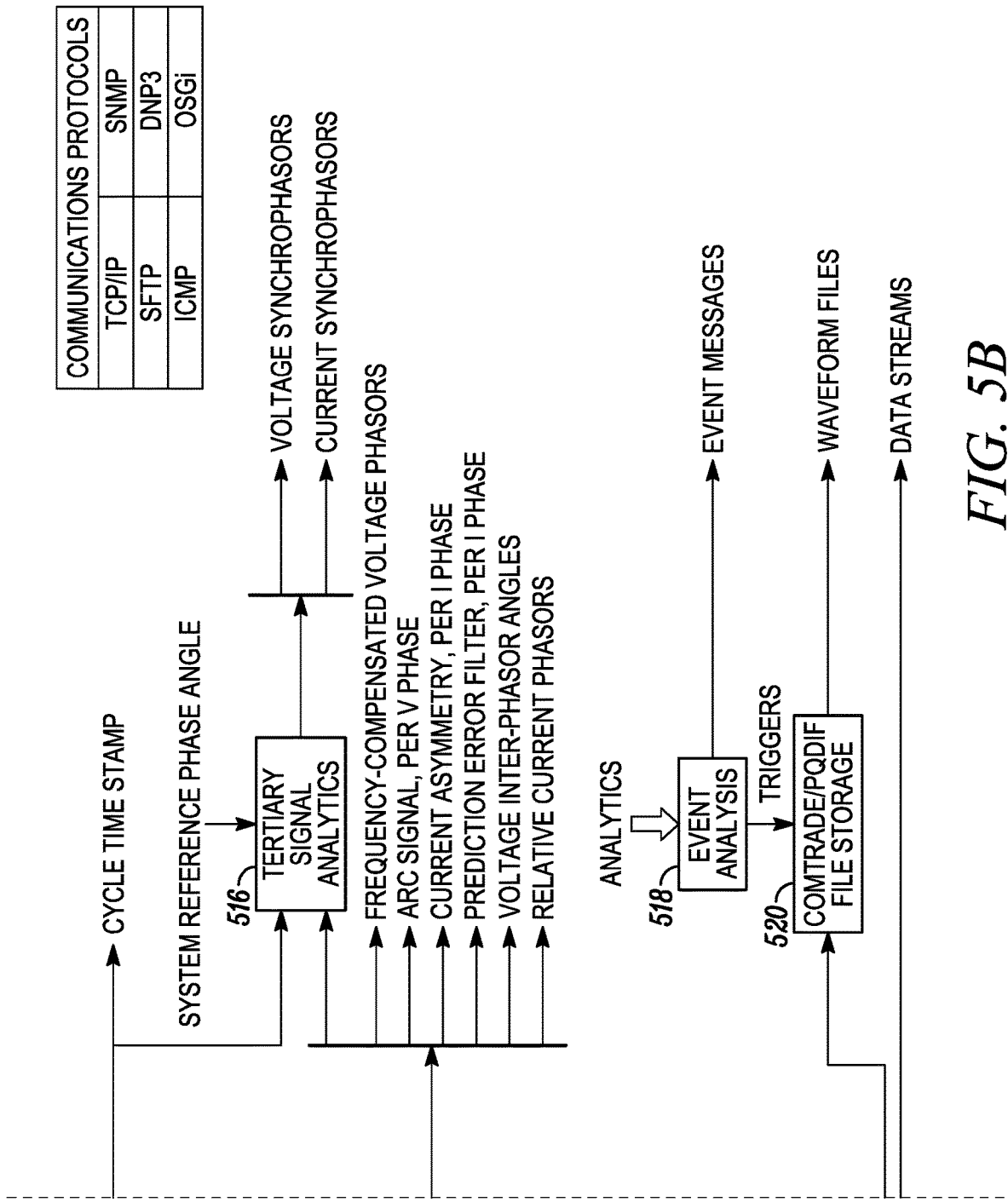

Devices such as faulted circuit indicators may be married with wireless network interface cards, for connection over modest speed (such as 100 kbps) wireless networks. These devices may report status by exception and carry out fixed pre-programmed functions. The intelligence of many grid devices may be increased by using local smart RTUs, instead of having poletop RTUs that are designed as fixed function, closed architecture devices, RTUs may be used as open architecture devices that can be programmed by third parties and that may serve as an INDE DEVICE 188 in the INDE Reference Architecture. Also, meters at customers' premises may be used as sensors. For example, meters may measure consumption (such as how much energy is consumed for purposes of billing) and may measure voltage (for use in volt/VAr optimization), FIGS. 5A-B illustrate an example architecture for INDE DEVICE 188 group. Table 3 describes the certain INDE DEVICE 188 elements. The smart grid device may include an embedded processor, so the processing elements are less like SOA services and more like real time program library routines, since the DEVICE group is implemented on a dedicated real time DSP or microprocessor

TABLE 3

INDE DEVICE Elements

| INDE DEVICE ELEMENTS | Description |
|---|---|
| Ring buffers 502 | Local circular buffer storage for digital waveforms sampled from analog transducers (voltage and current waveforms for example) which may be used hold the data for waveforms at different time periods so that if an event is detected, the waveform data leading up to the event may also be stored |
| Device status buffers 504 | Buffer storage for external device state and state transition data |
| Three phase frequency tracker 506 | Computes a running estimate of the power frequency from all three phases; used for frequency correction to other data as well as in grid stability and power quality measures (especially as relates to DG) |
| Fourier transform block 508 | Conversion of time domain waveforms to frequency domain to enable frequency domain analytics |
| Time domain signal analytics 510 | Processing of the signals in the time domain; extraction of transient and envelop behavior measures |
| Frequency domain signal analytics 512 | Processing of the signals in the frequency domain; extraction of RMS and power parameters |
| Secondary signal analytics 514 | Calculation and compensation of phasors; calculation of selected error/fault measures |
| Tertiary signal analytics 516 | Calculation of synchrophasors based on GPS timing and a system reference angle |
| Event analysis and triggers 518 | Processing of all analytics for event detection and triggering of file capture. Different types of INDE DEVICES may include different event analytical capability. For example, a line sensor may examine ITIC events, examining spikes in the |

TABLE 3-continued

INDE DEVICE Elements

| INDE DEVICE ELEMENTS | Description |
|---|---|
| | waveform. If a spike occurs (or a series of spikes occur), the line sensor, with the event analytical capability, may determine that an "event" has occurred and also may provide a recommendation as to the cause of the event. The event analytical capability may be rule-based, with different rules being used for different INDE DEVICES and different applications. |
| File storage - capture/formatting/transmission 520 | Capture of data from the ring buffers based on event triggers |
| Waveform streaming service 522 | Support for streaming of waveforms to a remote display client |
| Communications stack | Support for network communications and remote program load |
| GPS Timing 524 | Provides high resolution timing to coordinate applications and synchronize data collection across a wide geographic area. The generated data may include a GPS data frame time stamp 526. |
| Status analytics 528 | Capture of data for status messages |

FIG. 1A further depicts customer premises 179, which may include one or more Smart Meters 163, an in-home display 165, one or more sensors 166, and one or more controls 167. In practice, sensors 166 may register data at one or more devices at the customer premises 179. For example, a sensor 166 may register data at various major appliances within the customer premises 179, such as the furnace, hot water heater, air conditioner, etc. The data from the one or more sensors 166 may be sent to the Smart Meter 163, which may package the data for transmission to the operations control center 116 via utility communication network 160. The in-home display 165 may provide the customer at the customer premises with an output device to view, in real-time, data collected from Smart. Meter 163 and the one or more sensors 166. In addition, an input device (such as a keyboard) may be associated with in-home display 165 so that the customer may communicate with the operations control center 116. In one embodiment, the in-home display 165 may comprise a computer resident at the customer premises.

The customer premises 165 may further include controls 167 that may control one or more devices at the customer premises 179. Various appliances at the customer premises 179 may be controlled, such as the heater, air conditioner, etc., depending on commands from the operations control center 116.

As depicted in FIG. 1A, the customer premises 169 may communicate in a variety of ways, such as via the Internet 168, the public-switched telephone network (PSTN) 169, or via a dedicated line (such as via collector 164). Via any of the listed communication channels, the data from one or more customer premises 179 may be sent. As shown in FIG. 1, one or more customer premises 179 may comprise a Smart Meter Network 178 (comprising a plurality of smart meters 163), sending data to a collector 164 for transmission to the operations control center 116 via the utility management network 160. Further, various sources of distributed energy generation/storage 162 (such as solar panels, etc.) may send data to a monitor control 161 for communication with the operations control center 116 via the utility management network 160.

As discussed above, the devices in the power grid outside of the operations control center 116 may include processing and/or storage capability. The devices may include the INDE SUBSTATION 180 and the INDE DEVICE 188. In addition to the individual devices in the power grid including additional intelligence, the individual devices may communicate with other devices in the power grid, in order to exchange information (include sensor data and/or analytical data (such as event data)) in order to analyze the state of the power grid (such as determining faults) and in order to change the state of the power grid (such as correcting for the faults). Specifically, the individual devices may use the following: (1) intelligence (such as processing capability); (2) storage (such as the distributed storage discussed above); and (3) communication (such as the use of the one or more buses discussed above). In this way, the individual devices in the power grid may communicate and cooperate with one another without oversight from the operations control center 116.

For example, the INDE architecture disclosed above may include a device that senses at least one parameter on the feeder circuit. The device may further include a processor that monitors the sensed parameter on the feeder circuit and that analyzes the sensed parameter to determine the state of the feeder circuit. For example, the analysis of the sense parameter may comprise a comparison of the sensed parameter with a predetermined threshold and/or may comprise a trend analysis. One such sensed parameter may include sensing the waveforms and one such analysis may comprise determining whether the sensed waveforms indicate a fault on the feeder circuit. The device may further communicate with one or more substations. For example, a particular substation may supply power to a particular feeder circuit. The device may sense the state of the particular feeder circuit, and determine whether there is a fault on the particular feeder circuit. The device may communicate with the substation. The substation may analyze the fault determined by the device and may take corrective action depending on the fault (such as reducing the power supplied to the feeder circuit). In the example of the device sending data indicating a fault (based on analysis of waveforms), the substation may alter the power supplied to the feeder circuit without input from the operations control center 116. Or, the substation may combine the data indicating the fault with information from other sensors to further refine the analysis of the fault. The substation may further communicate with the operations control center 116, such as the outage intelligence application (such as discussed FIGS. 13A-13B and/or the fault intelligence application (such as discussed in FIGS. 14A-C). Thus, the operations control center 116 may determine the fault and may determine the extent of the outage (such as the number of homes affected by the fault). In this way, the device sensing the state of the feeder circuit may cooperatively work with the substation in order to correct a potential fault with or without requiring the operations control center 116 to intervene.

As another example, a line sensor, which includes additional intelligence using processing and/or memory capability, may produce grid state data in a portion of the grid (such as a feeder circuit). The grid state data may be shared with the demand response management system 155 at the operations control center 116. The demand response management system 155 may control one or more devices at customer sites on the feeder circuit in response to the grid state data from the line sensor. In particular, the demand response management system 155 may command the energy management system 156 and/or the distribution management system 157 to reduce load on the feeder circuit by turning off appliances at the customer sites that receive power from the feeder circuit in response to line sensor indicating an outage on the feeder circuit. In this way, the line sensor in combination with the demand response management system 155 may shift automatically load from a faulty feeder circuit and then isolate the fault.

As still another example, one or more relays in the power grid may have a microprocessor associated with it. These relays may communicate with other devices and/or databases resident in the power grid in order to determine a fault and/or control the power grid.

INDS Concept and Architecture

Outsourced Smart Grid Data/Analytics Services Model

One application for the smart grid architecture allows the utility to subscribe to grid data management and analytics services while maintaining traditional control systems and related operational systems in-house. In this model, the utility may install and own grid sensors and devices (as described above), and may either own and operate the grid data transport communication system, or may outsource it. The grid data may flow from the utility to a remote Intelligent Network Data Services (INDS) hosting site, where the data may be managed, stored, and analyzed. The utility may then subscribe to data and analytics services under an appropriate services financial model. The utility may avoid the initial capital expenditure investment and the ongoing costs of management, support, and upgrade of the smart grid data/analytics infrastructure, in exchange for fees. The INDE Reference Architecture, described above, lends itself to the outsourcing arrangement described herein.

INDS Architecture for Smart Grid Services

Figure 6A:
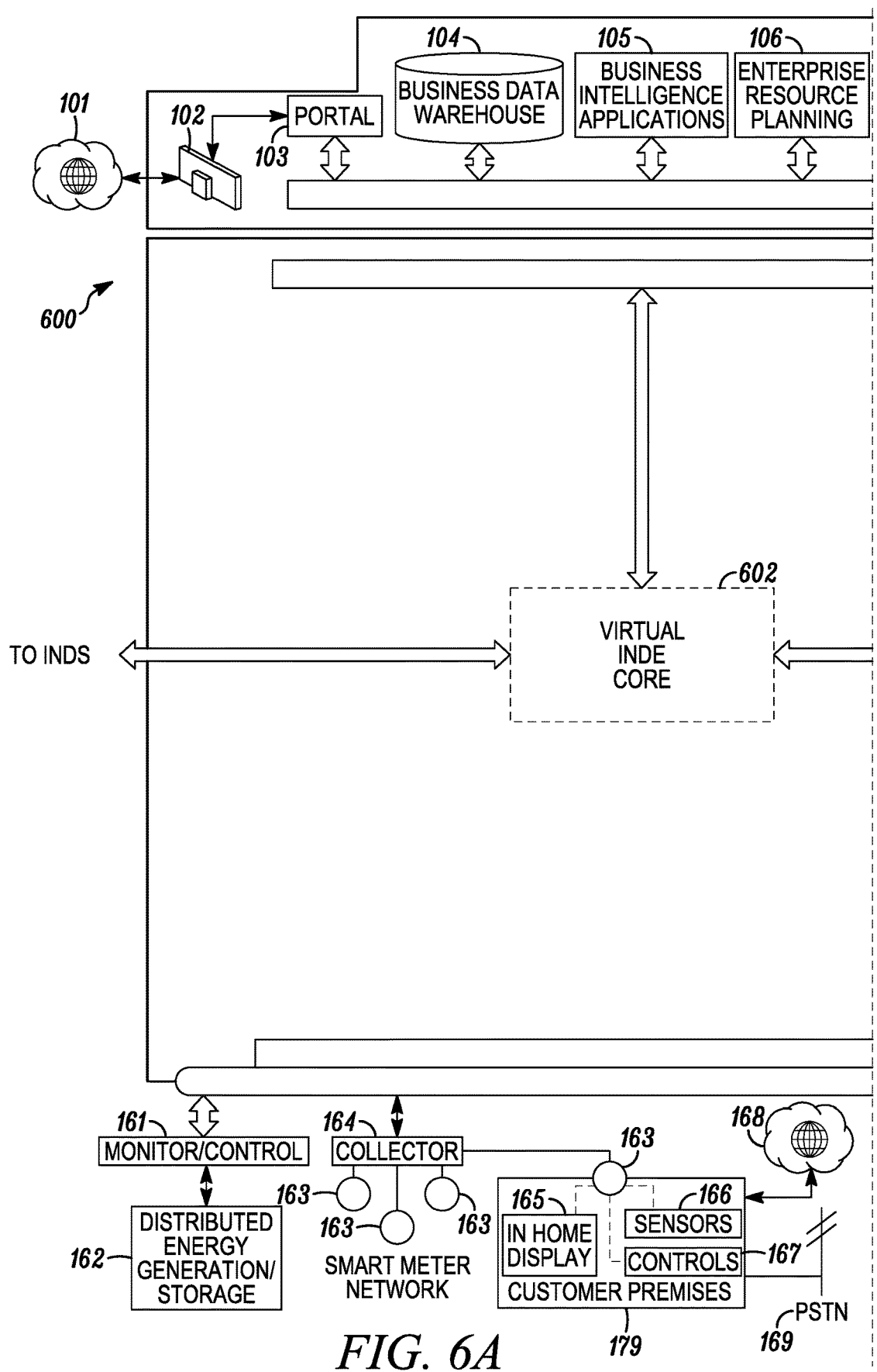
FIGS. 6A-C are Hock diagrams of still another example of the overall architecture for a power grid.
Figure 6B:
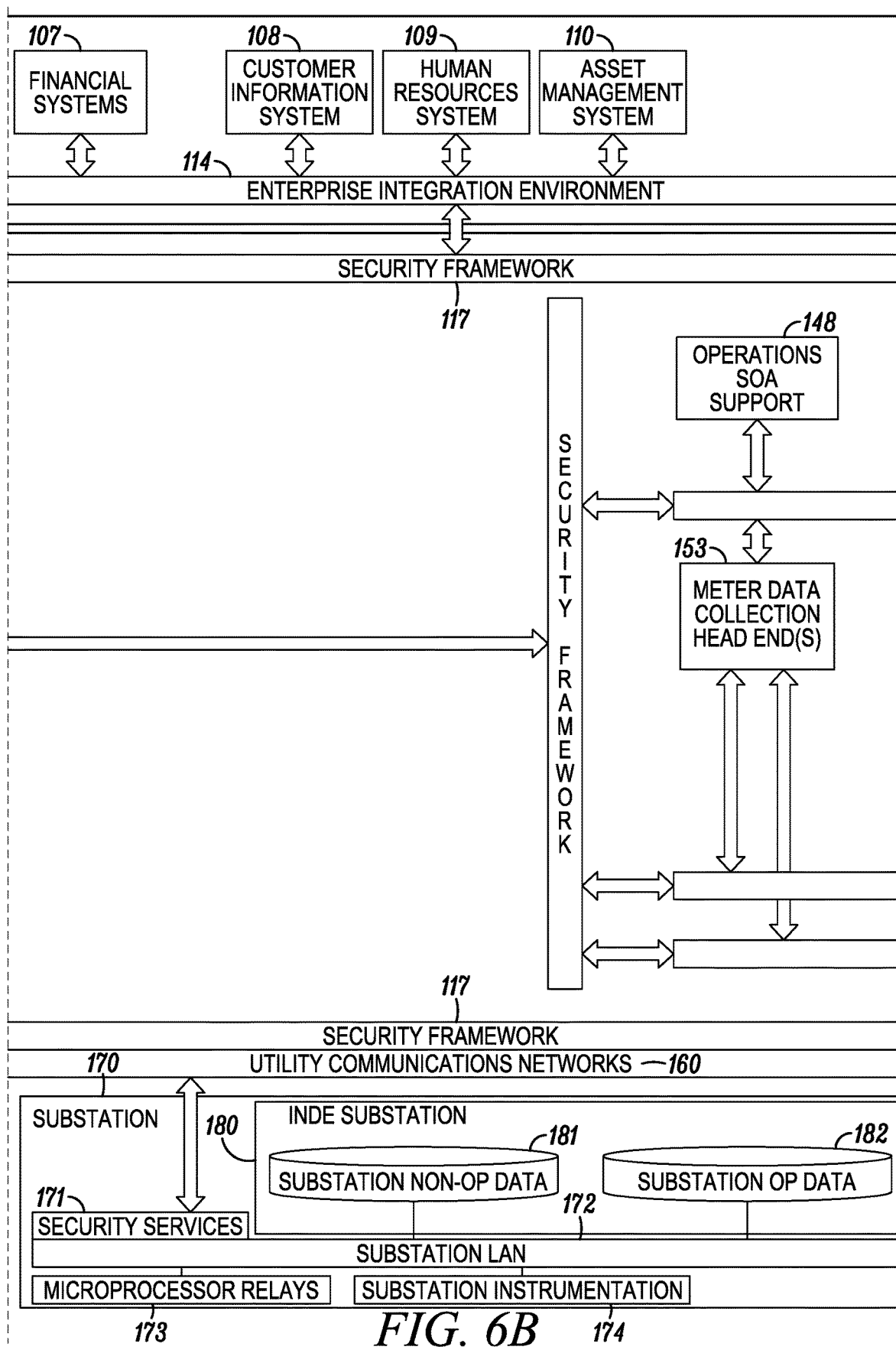
Figure 6C:
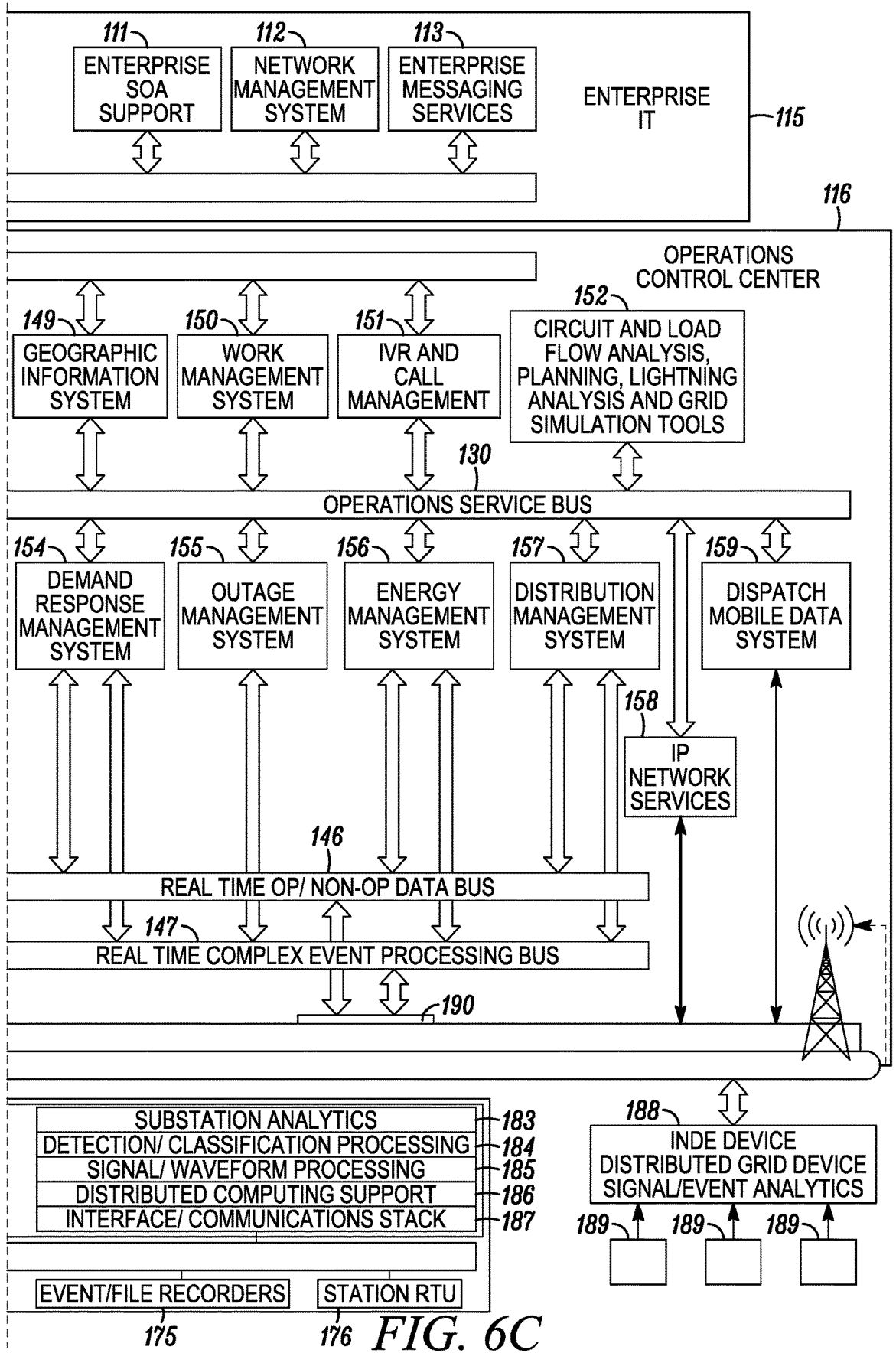

In order to implement the INDS services model, the INDE Reference Architecture may be partitioned into a group of elements that may be hosted remotely, and those that may remain at the utility. FIGS. 6A-C illustrate how the utility architecture may look once the INDE CORE 120 has been made remote. A server may be included as part of the INDE CORE 120 that may act as the interface to the remote systems. To the utility systems, this may appear as a virtual INDE CORE 602.

As the overall block diagram 600 in FIGS. 6A-C show, the INDE SUBSTATION 180 and INDE DEVICE 188 groups are unchanged from that depicted in FIGS. 1A-C. The multiple bus structure may also still be employed at the utility as well.

Figure 7:
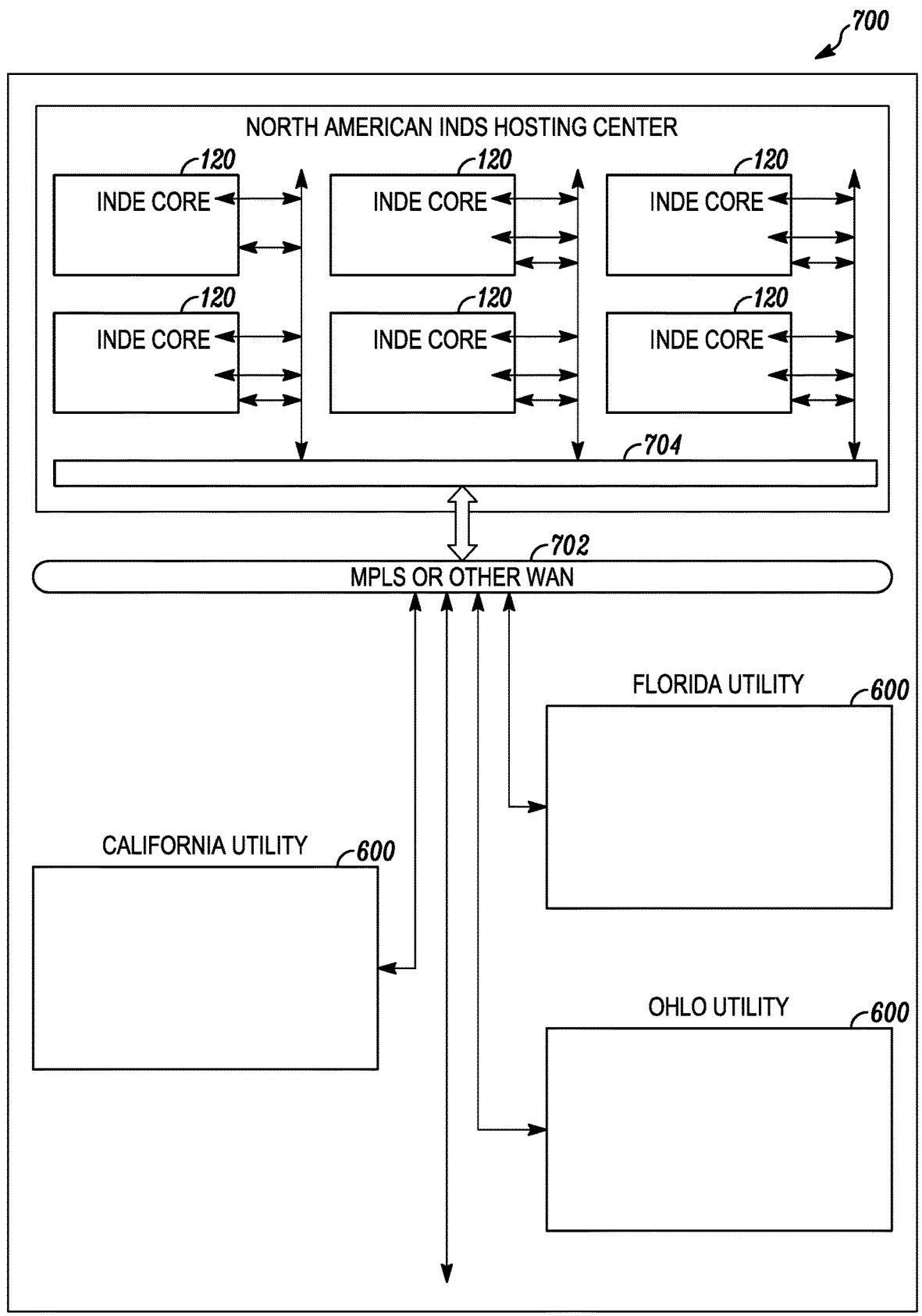
FIG. 7 is a block diagram of still another example of the overall architecture for a power grid.

The INDE CORE 120 may be remotely hosted, as the block diagram 700 in FIG. 7 illustrates. At the hosting site, INDE COREs 120 may be installed as needed to support utility INDS subscribers (shown as North American INDS Hosting Center 702). Each CORE 120 may be a modular system, so that adding a new subscriber is a routine operation. A party separate from the electric utility may manage and support the software for one, some, or all of the INDE COREs 120, as well as the applications that are downloaded from the INDS hosting site to each utility's INDE SUBSTATION 180 and INDE DEVICES 188.

In order to facilitate communications, high bandwidth low latency communications services, such as via network 704 (e.g., a MPLS or other WAN), may be use that can reach the subscriber utility operations centers, as well as the INDS hosting sites. As shown in FIG. 7, various areas may be served, such as California, Florida, and Ohio. This modularity of the operations not only allows for efficient management of various different grids. It also allows for better inter-grid management. There are instances where a failure in one grid may affect operations in a neighboring grid. For example, a failure in the Ohio grid may have a cascade effect on operations in a neighboring grid, such as the mid-Atlantic grid. Using the modular structure as illustrated in FIG. 7 allows for management of the individual grids and management of inter-grid operations. Specifically, an overall INDS system (which includes a processor and a memory) may manage the interaction between the various INDE COREs 120. This may reduce the possibility of a catastrophic failure that cascades from one grid to another. For example, a failure in the Ohio grid may cascade to a neighboring grid, such as the mid-Atlantic grid. The INDE CORE 120 dedicated to managing the Ohio grid may attempt to correct for the failure in the Ohio grid. And, the overall INDS system may attempt to reduce the possibility of a cascade failure occurring in neighboring grids.

Specific Examples of Functionality in INDE Core

As shown in FIGS. 1A-C, 6A-C, and 7, various functionalities (representated by blocks) are included in the INDE CORE 120, two of which depicted are meter data management services (MDMS) 121 and metering analytics and services 122. Because of the modularity of the architecture, various functionality, such as MDMS 121 and metering analytics and services 122, may be incorporated.

Observability Processes

Figure 8:
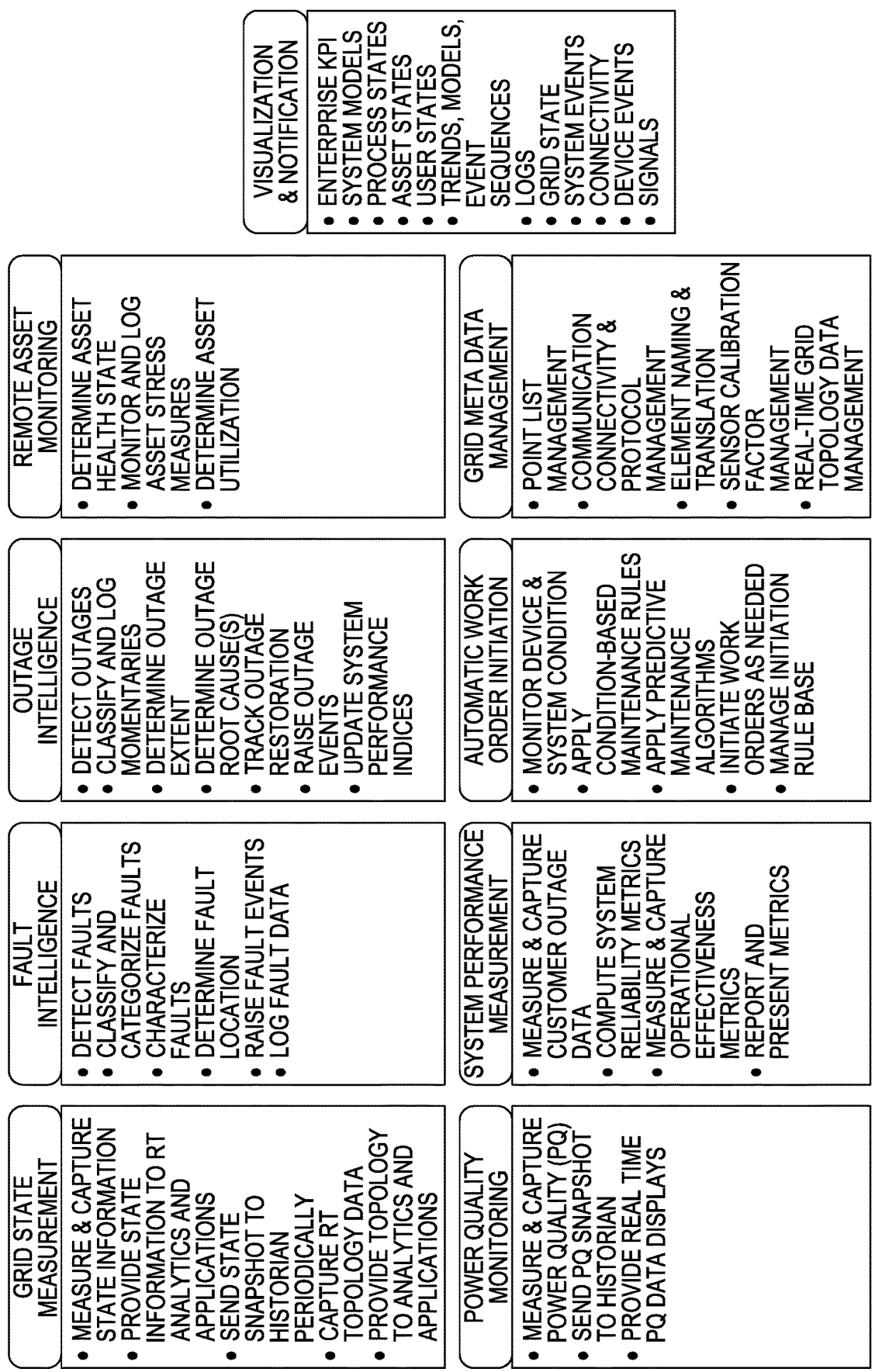
FIG. 8 is a block diagram including a listing of some examples of the observability processes.

As discussed above, one functionality of the application services may include observability processes. The observability processes may allow the utility to "observe" the grid. These processes may be responsible for interpreting the raw data received from all the sensors and devices on the grid and turning them into actionable information. FIG. 8 includes a listing of some examples of the observability processes.

Figure 9A:
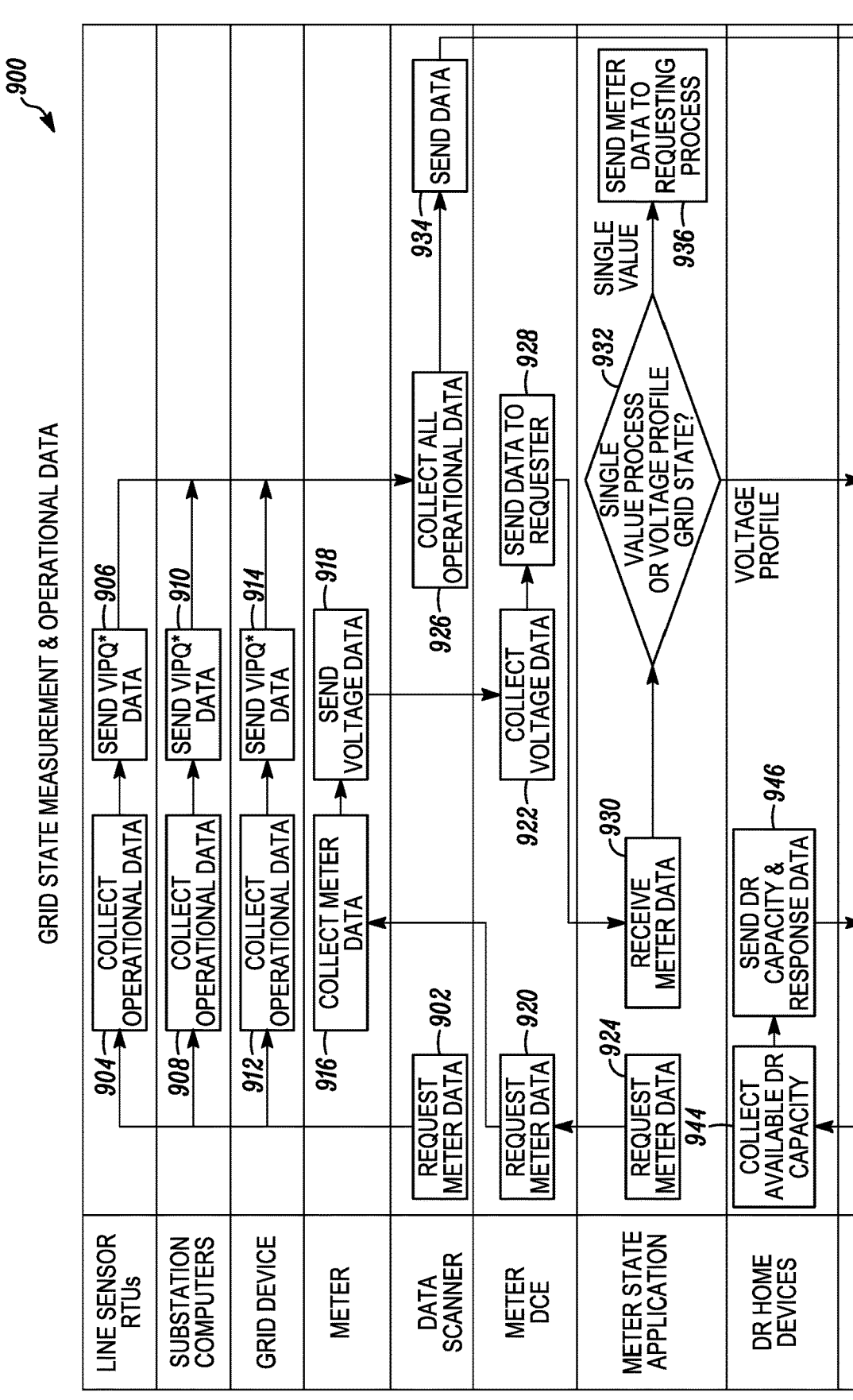
FIGS. 9A-B illustrate flow diagrams of the Grid State Measurement & Operations Processes.
Figure 9B:
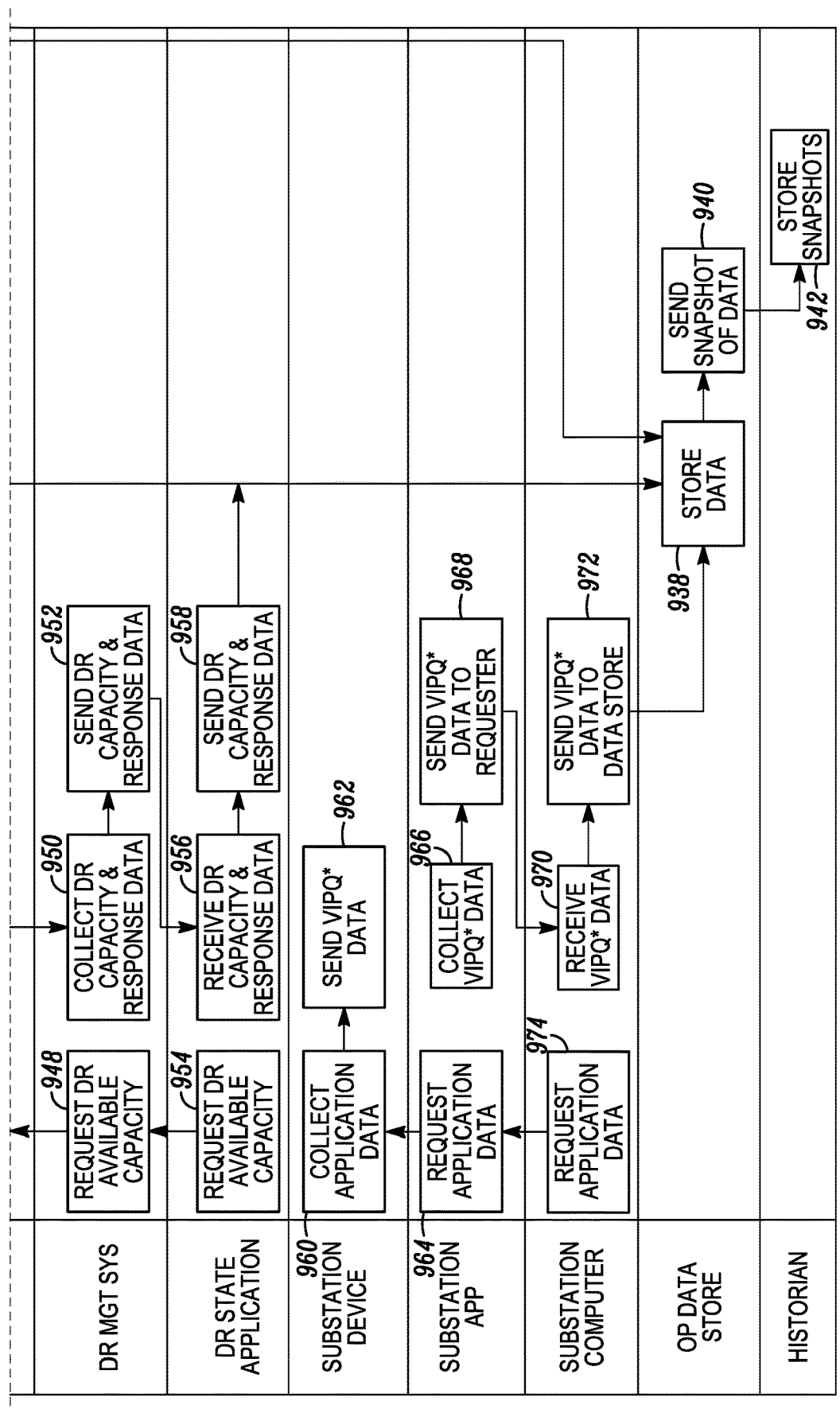

FIGS. 9A-B illustrate a flow diagram 900 of the Grid State Measurement & Operations Processes. As shown, the Data Scanner may request meter data, as shown at block 902. The request may be sent to one or more grid devices, substation computers, and line sensor RTU. In response to the request, the devices may collect operations data, as shown at blocks 904, 908, 912, and may send data (such as one, some or all of the operational data, such as Voltage, Current, Real Power, and Reactive Power data), as shown at blocks 906, 910, 914. The data scanner may collect the operational data, as shown at block 926, and may send the data to the operational data store, as shown at block 928. The operational data store may store the operational data, as shown at block 938. The operational data store may further send a snapshot of the data to the historian, as shown at block 940, and the historian may store the snapshot of the data, as shown at block 942.

The meter state application may send a request for meter data to the Meter DCE, as shown in block 924, which in turn sends a request to one or more meters to collect meter data, as shown at block 920. In response to the request, the one or more meters collects meter data, as shown at block 916, and sends the voltage data to the Meter DCE, as shown at block 918. The Meter DCE may collect the voltage data, as shown at block 922, and send the data to the requestor of the data, as shown at block 928. The meter state application may receive the meter data, as shown at block 930, and determine whether it is for a single value process or a voltage profile grid state, as shown at block 932. If it is for the single value process, the meter data is send to the requesting process, as shown at block 936. If the meter data is for storage to determine the grid state at a future time, the meter data is stored in the operational data store, as shown at block 938. The operational data store further sends a snapshot of the data to the historian, as shown at block 940, and the historian stores the snapshot of the data, as shown at block 942.

FIGS. 9A-B further illustrate actions relating to demand response (DR) Demand response refers to dynamic demand mechanisms to manage customer consumption of electricity in response to supply conditions, for example, having electricity customers reduce their consumption at critical times or in response to market prices. This may involve actually curtailing power used or by starting on site generation which may or may not be connected in parallel with the grid. This may be different from energy efficiency, which means using less power to perform the same tasks, on a continuous basis or whenever that task is performed. In demand response, customers, using one or more control systems, may shed loads in response to a request by a utility or market price conditions. Services (lights, machines, air conditioning) may be reduced according to a preplanned load prioritization scheme during the critical timeframes. An alternative to load shedding is on-site generation of electricity to supplement the power grid. Under conditions of tight electricity supply, demand response may significantly reduce the peak price and, in general, electricity price volatility.

Demand response may generally be used to refer to mechanisms used to encourage consumers to reduce demand, thereby reducing the peak demand for electricity. Since electrical systems are generally sized to correspond to peak demand (plus margin for error and unforeseen events), lowering peak demand may reduce overall plant and capital cost requirements. Depending on the configuration of generation capacity, however, demand response may also be used to increase demand (load) at times of high production and low demand. Some systems may thereby encourage energy storage to arbitrage between periods of low and high demand (or low and high prices). As the proportion of intermittent power sources such as wind power in a system grows, demand response may become increasingly important to effective management of the electric grid.

The DR state application may request the DR available capacity, as shown at block 954. The DR management system may then request available capacity from one or more DR home devices, as shown at block 948. The one or more home devices may collect available DR capacity in response to the request, as shown at block 944, and send the DR capacity and response data to the DR management system, as shown at block 946. The DR management system may collect the DR capacity and response data, as shown at block 950, and send the DR capacity and response data to the DR state application, as shown at block 952. The DR state application may receive the DR capacity and response data, as shown at block 956, and send the capacity and response data to the operational data store, as shown at block 958. The operational data store may store the DR capacity and response data data, as shown at block 938. The operational data store may further send a snapshot of the data to the historian, as shown at block 940, and the historian may store the snapshot of the data, as shown at block 942.

The substation computer may request application data from the substation application, as shown at block 974. In response, the substation application may request application from the substation device, as shown at block 964. The substation device may collect the application data, as shown at block 960, and send the application data to the substation device (which may include one, some or all of Voltage, Current, Real Power, and Reactive Power data), as shown at block 962. The substation application may collect the application data, as shown at block 966, and send the application data to the requestor (which may be the substation computer) as shown at block 968. The substation computer may receive the application data, as shown at block 970, and send the application data to the operational data store, as shown at block 972.

The grid state measurement and operational data process may comprise deriving the grid state and grid topology at a given point in time, as well as providing this information to other system and data stores. The sub-processes may include; (1) measuring and capturing grid state information (this relates to the operational data pertaining to the grid that was discussed previously); (2) sending grid state information to other analytics applications (this enables other applications, such as analytical applications, access to the grid state data); (3) persisting grid state snapshot to connectivity/operational data store (this allows for updating the grid state information to the connectivity/operational data store in the appropriate format as well as forwarding this information to the historian for persistence so that a point in time grid topology may be derived at a later point in time); (4) deriving grid topology at a point in time based on default connectivity and current grid state (this provides the grid topology at a given point in time by applying the point in time snapshot of the grid state in the historian to the base connectivity in the connectivity data store, as discussed in more detail below); and (5) providing grid topology information to applications upon request.

With regard to sub-process (4), the grid topology may be derived for a predetermined time, such as in real-time, 30 seconds ago, 1 month ago, etc. In order to recreate the grid topology, multiple databases may be used, and a program to access the data in the multiple databases to recreate the grid topology. One database may comprise a relational database that stores the base connectivity data (the "connectivity database"). The connectivity database may hold the grid topology information as built in order to determine the baseline connectivity model. Asset and topology information may be updated into this database on a periodic basis, depending on upgrades to the power grid, such as the addition or modification of circuits in the power grid (e.g., additional feeder circuits that are added to the power grid). The connectivity database may be considered "static" in that it does not change. The connectivity database may change if there are changes to the structure of the power grid. For example, if there is a modification to the feeder circuits, such as an addition of a feeder circuit, the connectivity database may change.

One example of the structure 1800 of the connectivity database may be derived from the hierarchical model depicted in FIGS. 18A-D. The structure 1800 is divided into four sections, with FIG. 18A being the upper-left section, FIG. 18B being the upper-right section, FIG. 18C being the bottom-left section, and FIG. 18D being the bottom-right section. Specifically, FIGS. 18A-D are an example of an entity relationship diagram, which is an abstract method to represent the baseline connectivity database. The hierarchical model in FIGS. 18A-D may hold the meta-data that describes the power grid and may describe the various components of a grid and the relationship between the components.

A second database may be used to store the "dynamic" data. The second database may comprise a non-relational database. One example or a non-relational database may comprise a historian database, which stores the time series non-operational data as well as the historical operational data. The historian database may stores a series of "flat" records such as: (1) time stamp; (2) device ID; (3) a data value; and (4) a device status. Furthermore, the stored data may be compressed. Because of this, the operation/note-operational data in the power grid may be stored easily, and may be manageable even though a considerable amount of data may be available. For example, data on the order of 5 Terabytes may be online at any given time for use in order to recreate the grid topology. Because the data is stored in the simple flat record (such as no organizational approach), it allows efficiency in storing data. As discussed in more detail below, the data may be accessed by a specific tag, such as the time stamp.

Various analytics for the grid may wish to receive, as input, the grid topology at a particular point in time. For example, analytics relating to power quality, reliability, asset health, etc., may use the grid topology as input. In order to determine the grid topology, the baseline connectivity model, as defined by the data in the connectivity database, may be accessed. For example, if the topology of a particular feeder circuit is desired, the baseline connectivity model may define the various switches in the particular feeder circuit in the power grid. After which, the historian database may be accessed (based on the particular time) in order to determine the values of the switches in the particular feeder circuit. Then, a program may combine the data from the baseline connectivity model and the historian database in order to generate a representation of the particular feeder circuit at the particular time.

A more complicated example to determine the grid topology may include multiple feeder circuits (e.g., feeder circuit A and feeder circuit B) that have an inter-tie switch and sectionalizing switches. Depending on the switch states of certain switches (such as the inter-tie switch and/or the sectionalizing switches), sections of the feeder circuits may belong to feeder circuit A or feeder circuit B. The program that determines the grid topology may access the data from both the baseline connectivity model and the historian database in order to determine the connectivity at a particular time (e.g., which circuits belong to feeder circuit A or feeder circuit B).

Figure 10:
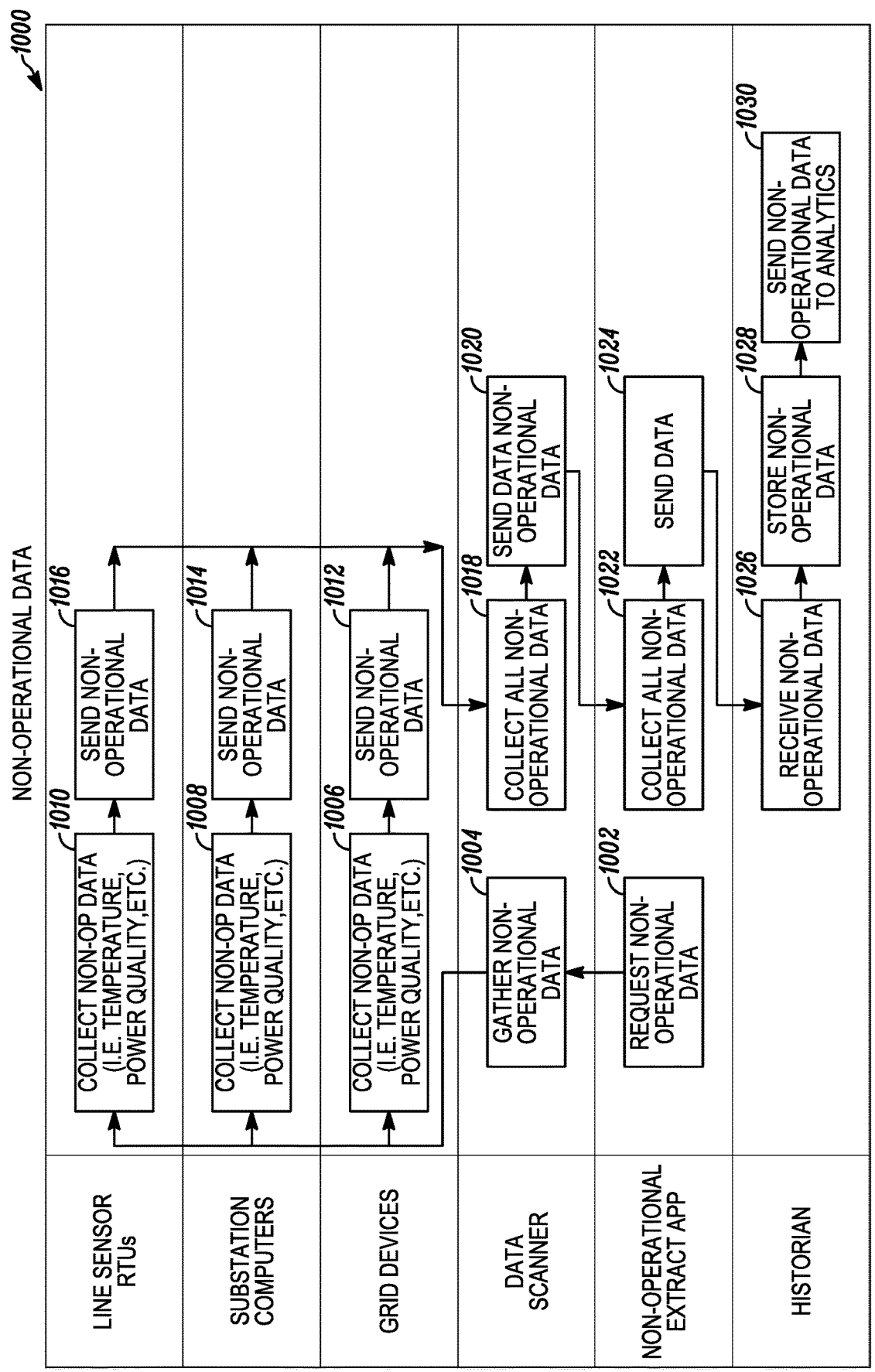
FIG. 10 illustrates a flow diagram of the Non-Operational Data processes.

FIG. 10 illustrates a flow diagram 1000 of the Non-Operational Data processes. The non-operational extract application may request non-operational data, as shown at block 1002. In response, the data scanner may gather non-operational data, as shown at block 1004, where by various devices in the power grid, such as grid devices, substation computers, and line sensor RTUs, may collect non-operational data, as shown at blocks 1006, 1008, 1110. As discussed above, non-operational data may include temperature, power quality, etc. The various devices in the power grid, such as grid devices, substation computers, and line sensor RTUs, may send the non-operational data to the data scanner, as shown at blocks 1012, 1014, 1116. The data scanner may collect the non-operational data, as shown at block 1018, and send the non-operational data to the non-operational extract application, as shown at block 1020. The non-operational extract application may collect the non-operational data, as shown at block 1022, and send the collected non-operational data to the historian, as shown at block 1024. The historian may receive the non-operational data, as shown at block 1026, store the non-operational data, as shown at block 1028, and send the non-operational data to one or more analytics applications, as shown at block 1030.

Figure 11:
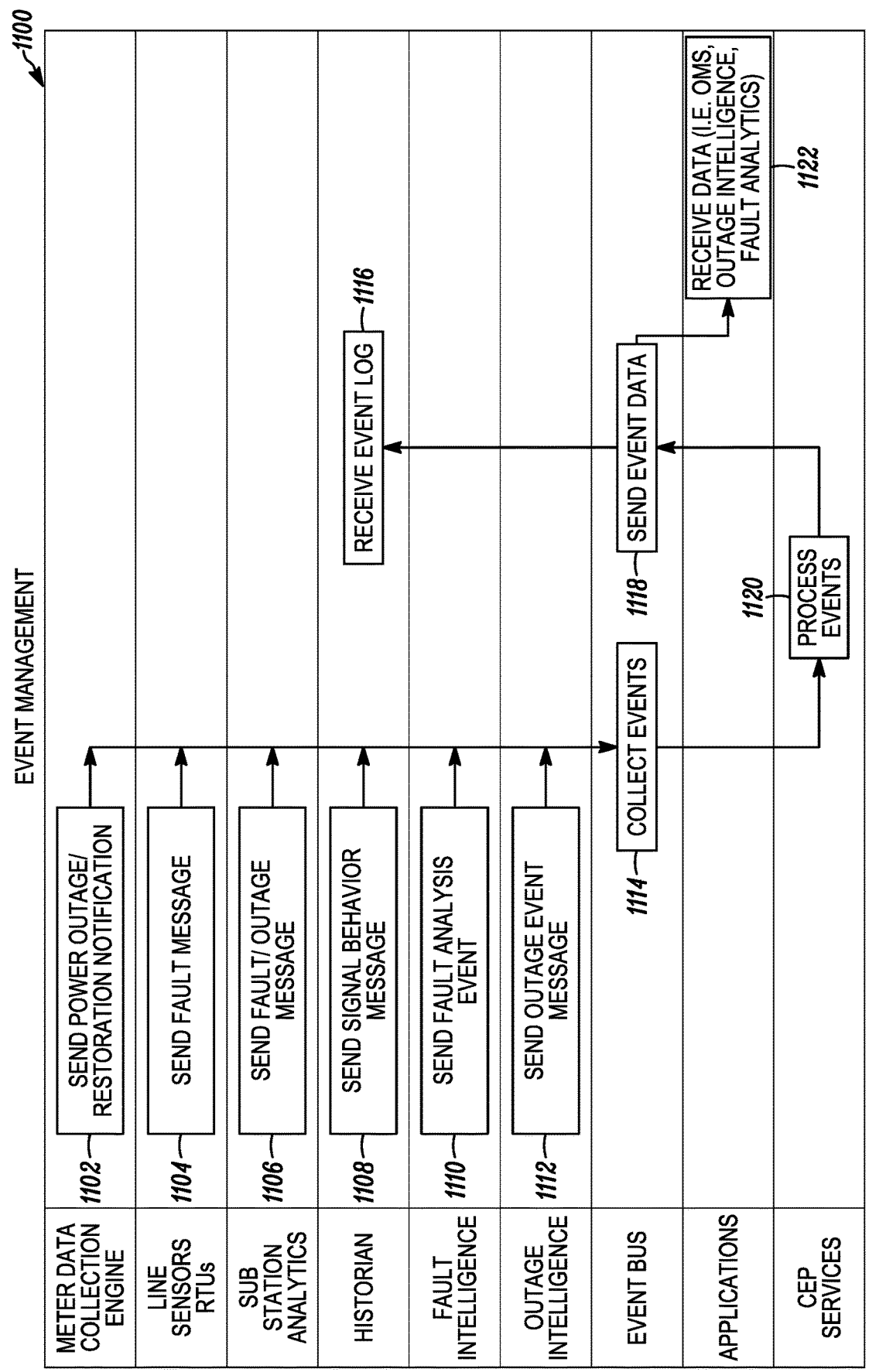
FIG. 11 illustrates a flow diagram of the Event Management processes.

FIG. 11 illustrates a flow diagram 1100 of the Event Management processes. Data may be generated from various devices based on various events in the power grid and sent via the event bus 147. For example, the meter data collection engine may send power outage/restoration notification information to the event bus, as shown at block 1102. The line sensors RTUs generate a fault message, and may send the fault message to the event bus, as shown at block 1104. The substation may analytics may generate a fault and/or outage message, and may send the fault and/or outage message to the event bus, as shown at block 1106. The historian may send signal behavior to the event bus, as shown at block 1108. And, various processes may send data via the event bus 147. For example, the fault intelligence process, discussed in more detail in FIGS. 14A-C, may send a fault analysis event via the event bus, as shown at block 1110. The outage intelligence process, discussed in more detail in FIGS. 13A-B, may send an outage event via the event bus, as shown at block 1112. The event bus may collect the various events, as shown at block 1114. And, the Complex Event Processing (CEP) services may process the events sent via the event bus, as shown at block 1120. The CEP services may process queries against multiple concurrent high speed real time event message streams. After processing by the CEP services, the event data may be sent via the event bus, as shown at block 1118. And the historian may receive via the event bus one or more event logs for storage, as shown at block 1116. Also, the event data may be received by one or more applications, such as the outage management system (OMS), outage intelligence, fault analytics, etc., as shown at block 1122. In this way, the event bus may send the event data to an application, thereby avoiding the "silo" problem of not making the data available to other devices or other applications.

Figure 12A:
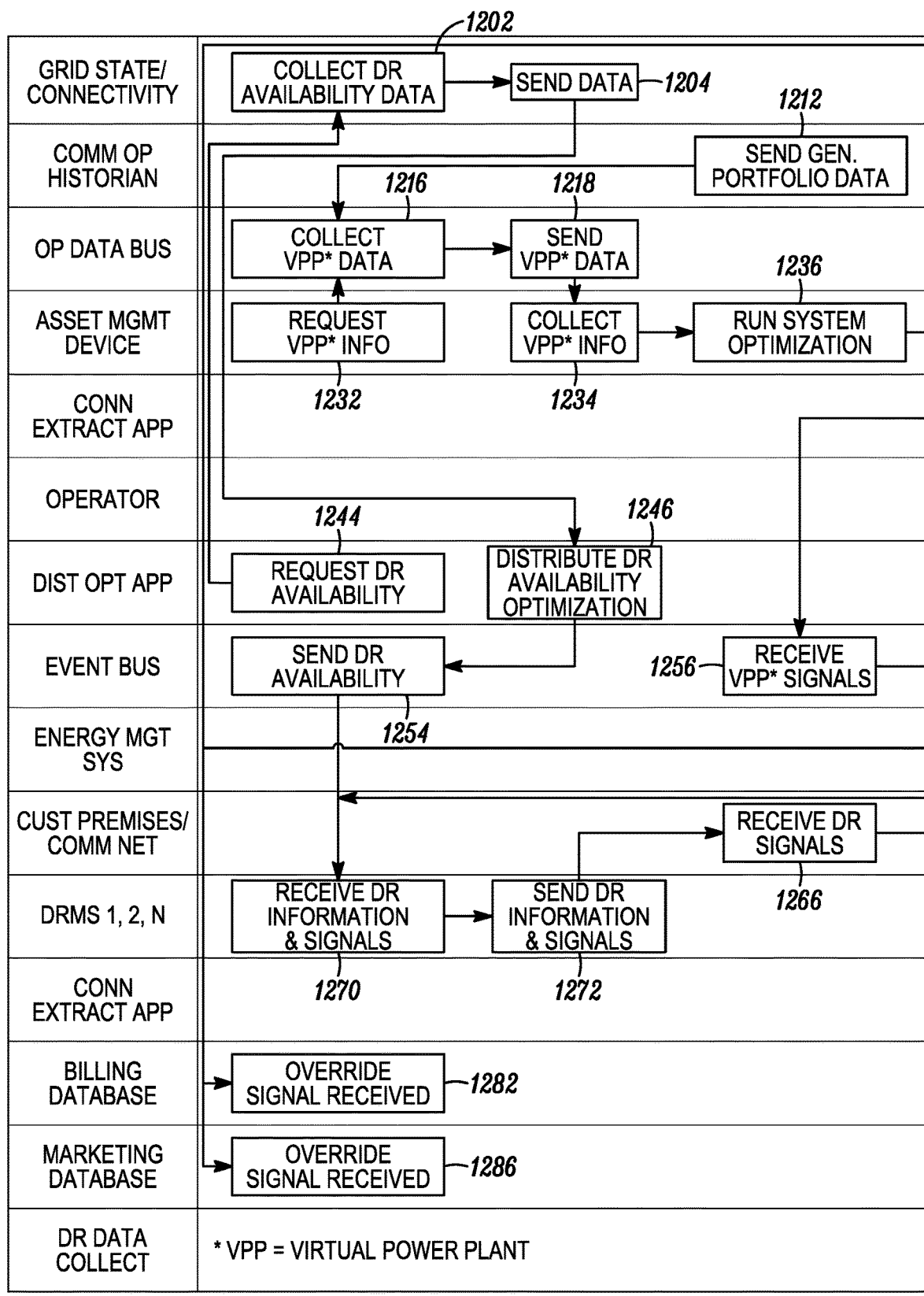
FIGS. 12A-C illustrate flow diagrams of the Demand Response (DR) Signaling processes.
Figure 12B:
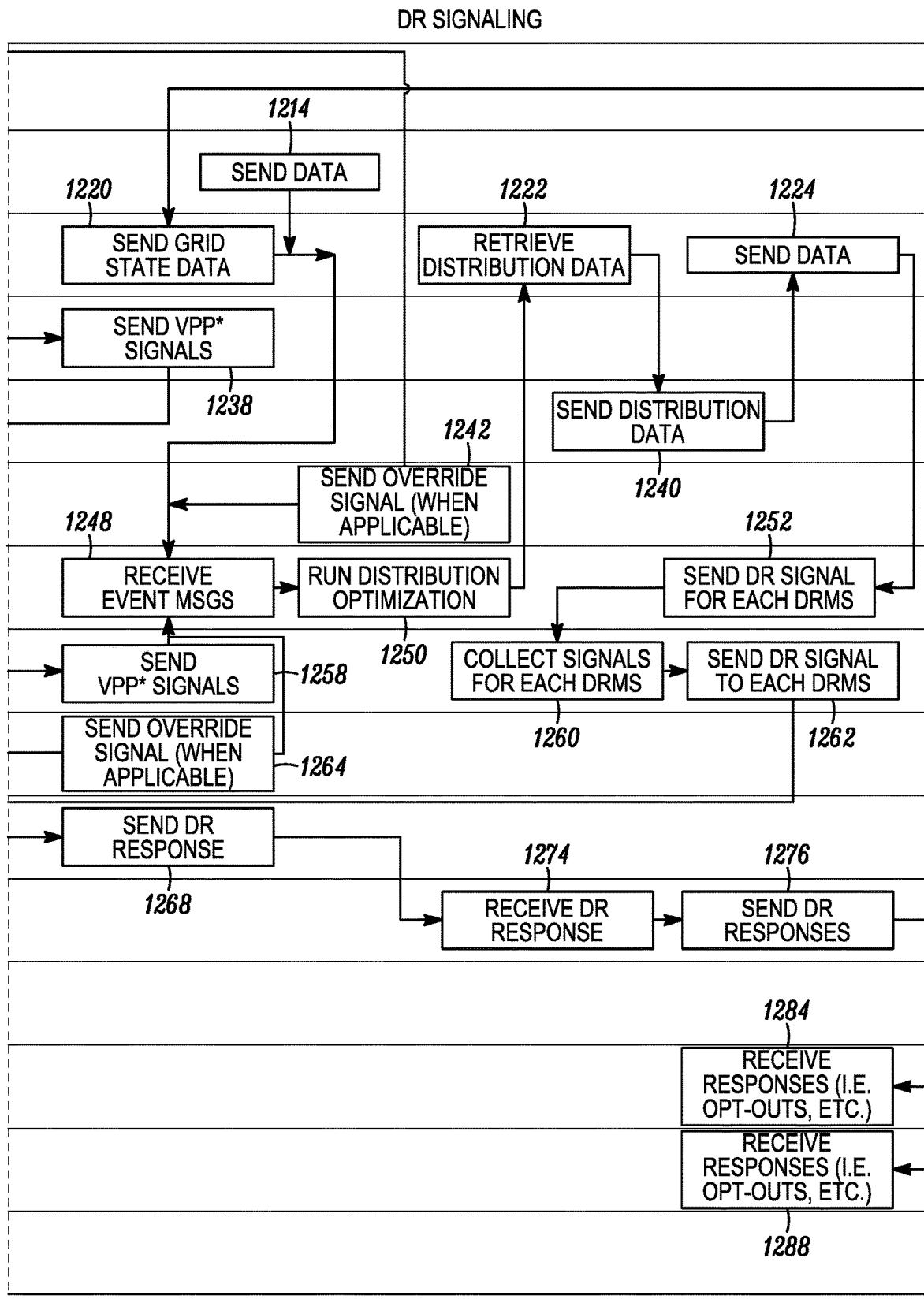
Figure 12C:
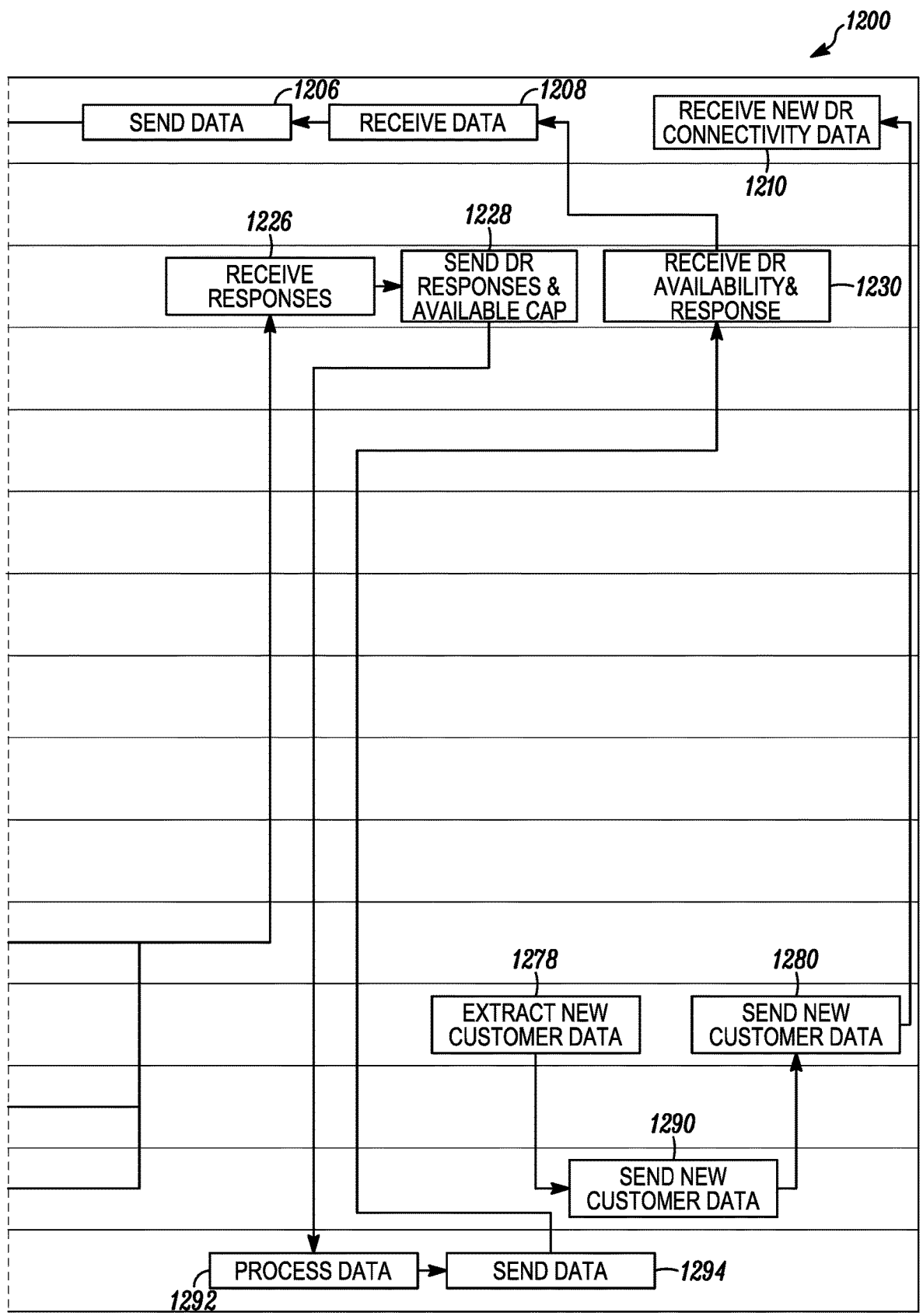

FIGS. 12A-C illustrate a flow diagram 1200 of the Demand Response (DR) Signaling processes. DR may be requested by the distribution operation application, as shown at block 1244. In response, the grid state/connectivity may collect DR availability data, as shown at block 1202, and may send the data, as shown at block 1204, the distribution operation application may distribute the DR availability optimization, as show at block 1246, via the event bus (block 1254), to one or more DR Management Systems. The DR Management System may send DR information and signals to one or more customer premises, as shown at block 1272. The one or more customer premises may receive the DR signals, as shown at block 1266, and send the DR response, as shown at block 1268. The DR Management may receive the DR response, as shown at block 1274, and send DR responses to one, some or all of the operations data bus 146, the billing database, and the marketing, database, as shown at block 1276. The billing database and the marketing database may receive the responses, as shown at blocks 1284, 1288. The operations data bus 146 may also receive the responses, as shown at block 1226, and send the DR responses and available capacity to the DR data collection, as shown at block 1228. The DR data collection may process the DR responses and available capacity, as shown at block 1291, and send the data to the operations data bus, as shown at block 1294. The operations data bus may receive the DR availability and response, as shown at block 1230, and send it to the grid state/connectivity. The grid state/connectivity may receive the data, as shown at block 1208. The received data may be used to determine the grid state data, which may be sent (block 1206) via the operations data bus (block 1220). The distribution operation application may receive the grid state data (as an event message for DR optimization), as shown at block 1248. Using the grid state data and the DR availability and response, the distribution operation application may run distribution optimization to generate distribution data, as shown at block 1250. The distribution data may be retrieved by the operations data bus, as shown at block 1222, and may be sent to the connectivity extract application, as shown at block 1240. The operational data bus may send data (block 1224) to the distribution operation application, which in turn may send one or more DR signals to one or more DR Management Systems (block 1252). The event bus may collect signals for each of the one or more DR Management Systems (block 1260) and send the DR signals to each of the DR Management Systems (block 1262). The DR Management System may then process the DR signals as discussed above.

The communication operation historian may send data to the event bus, as shown at block 1214. The communication operation historian may also send generation portfolio data, as shown at block 1212. Or, an asset management device, such as a Ventyx®, may request virtual power plant (VPP) information, as shown at block 1232. The operations data bus may collect the VPP data, as shown at block 1216, and send the data to the asset management device, as shown at block 1218. The asset management device may collect the VPP data, as shown at block 1234, run system optimization, as shown at block 1236, and send VPP signals to the event bus, as shown at block 1238. The event bus may receive the VPP signals, as shown at block 1256, and send the VPP signals to the distribution operation application, as shown at block 1258. The distribution operation application may then receive and process the event messages, as discussed above.

The connection extract application may extract new customer data, as shown at block 1278, to be sent to the Marketing Database, as shown at block 1290. The new customer data may be sent to the grid state/connectivity, as shown at block 1280, so that the grid state connectivity may receive new DR connectivity data, as shown at block 1210.

The operator may send one or more override signals when applicable, as shown at block 1242. The override signals may be sent to the distribution operation application. The override signal may be sent to the energy management system, as shown at block 1264, the billing database, as shown at block 1282, and/or the marketing database, as shown at block 1286.

Figure 13A:
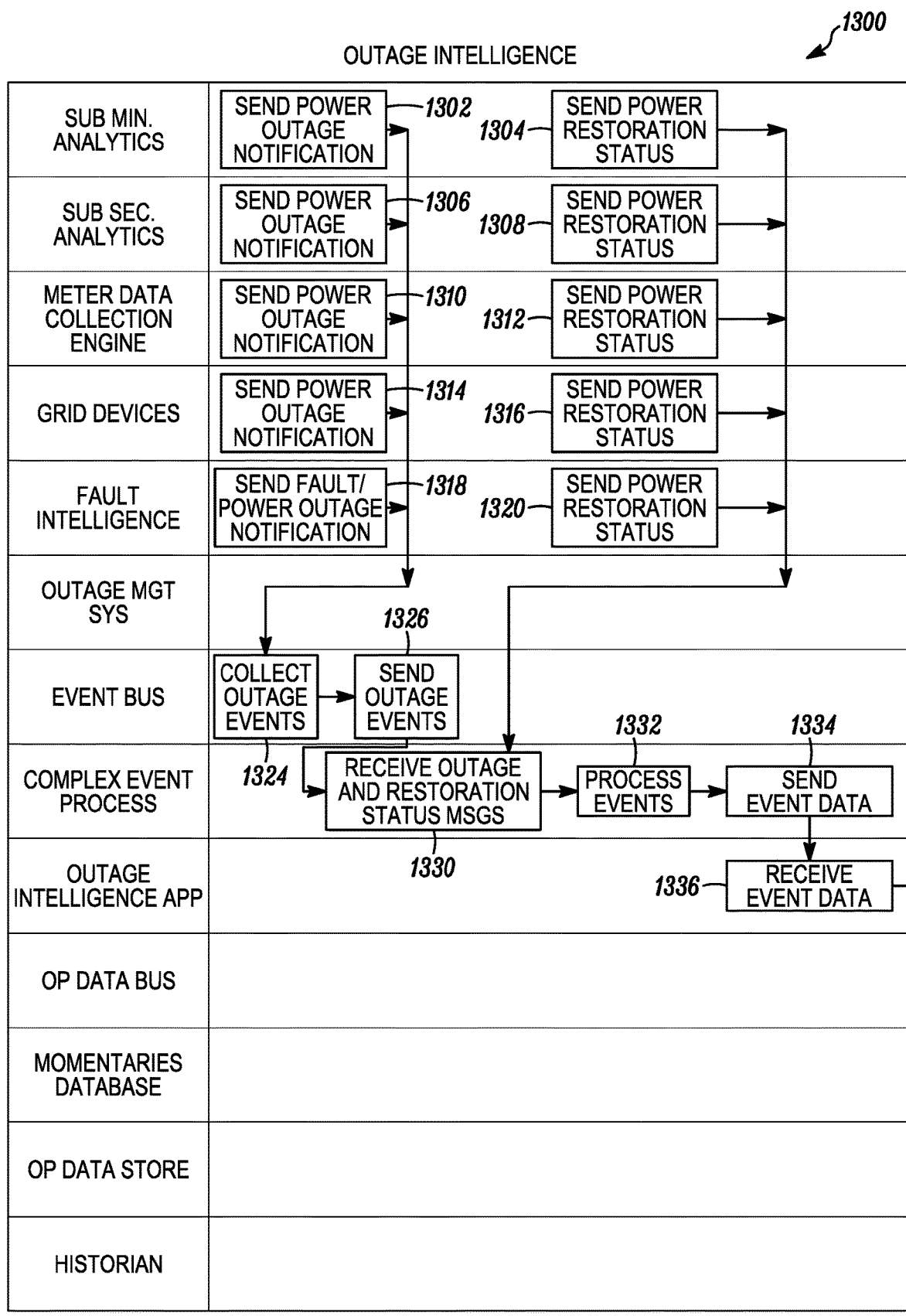
FIGS. 13A-B illustrate flow diagrams of the Outage Intelligence Processes.
Figure 13B:
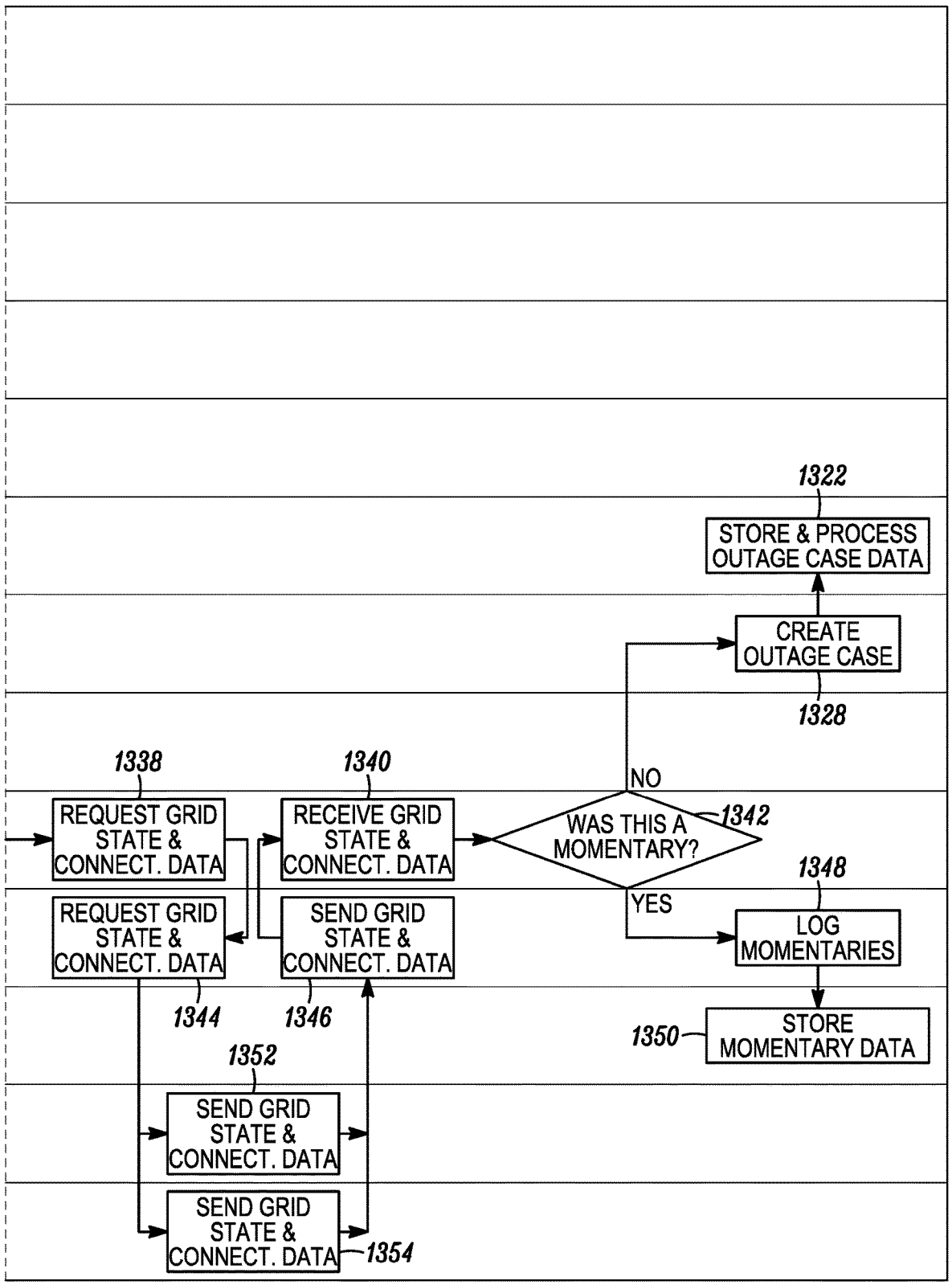

FIGS. 13A-B illustrate a flow diagram 1300 of the Outage Intelligence processes. Various devices and applications may send power outage notification, as shown at blocks 1302, 1306, 1310, 1314, 1318. The outage events may be collected by the event bus, as shown at block 1324, which may send the outage events to the complex event processing (CEP), as shown at block 1326. Further, various devices and applications may send power restoration status, as shown at block 1304, 1308, 1312, 1316, 1320. The CEP may receive outage and restoration status messages (block 1330), process the events (block 1332), and send event data (block 1334). The outage intelligence application may receive the event data (block 1335) and request grid state and connectivity data (block 1338). The operational data bus may receive the request for grid state and connectivity data (block 1344) and forward it to one or both of the operational data store and the historian. In response, the operational data store and the historian may send the grid state and connectivity data (blocks 1352, 1354) via the operational data bus (block 1346) to the outage intelligence application (block 1340). It is determined whether the grid state and connectivity data indicate whether this was a momentary, as shown at block 1342. If so, the momentaries are sent via the operational data bus (block 1348) to the momentaries database for storage (block 1350). If not, an outage case is created (block 1328) and the outage case data is stored and processed by the outage management system (block 1322).

The outage intelligence processes may: detect outages; classify & log momentaries, determine outage extent; determine outage root cause(s); track outage restoration; raise outage events; and update system performance indices.

Figure 14A:
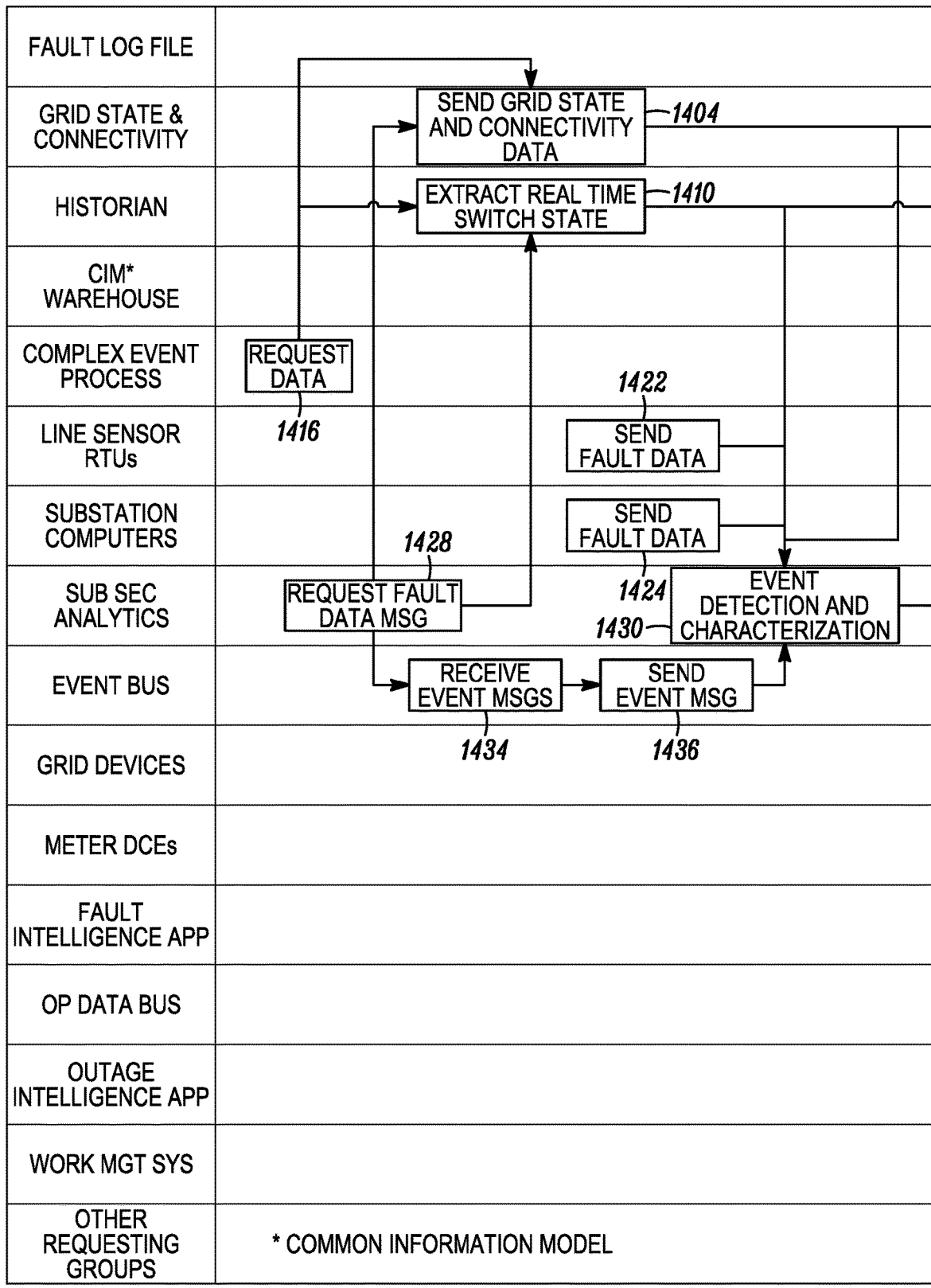
FIGS. 14A-C illustrate flow diagrams of the Fault Intelligence processes.
Figure 14B:
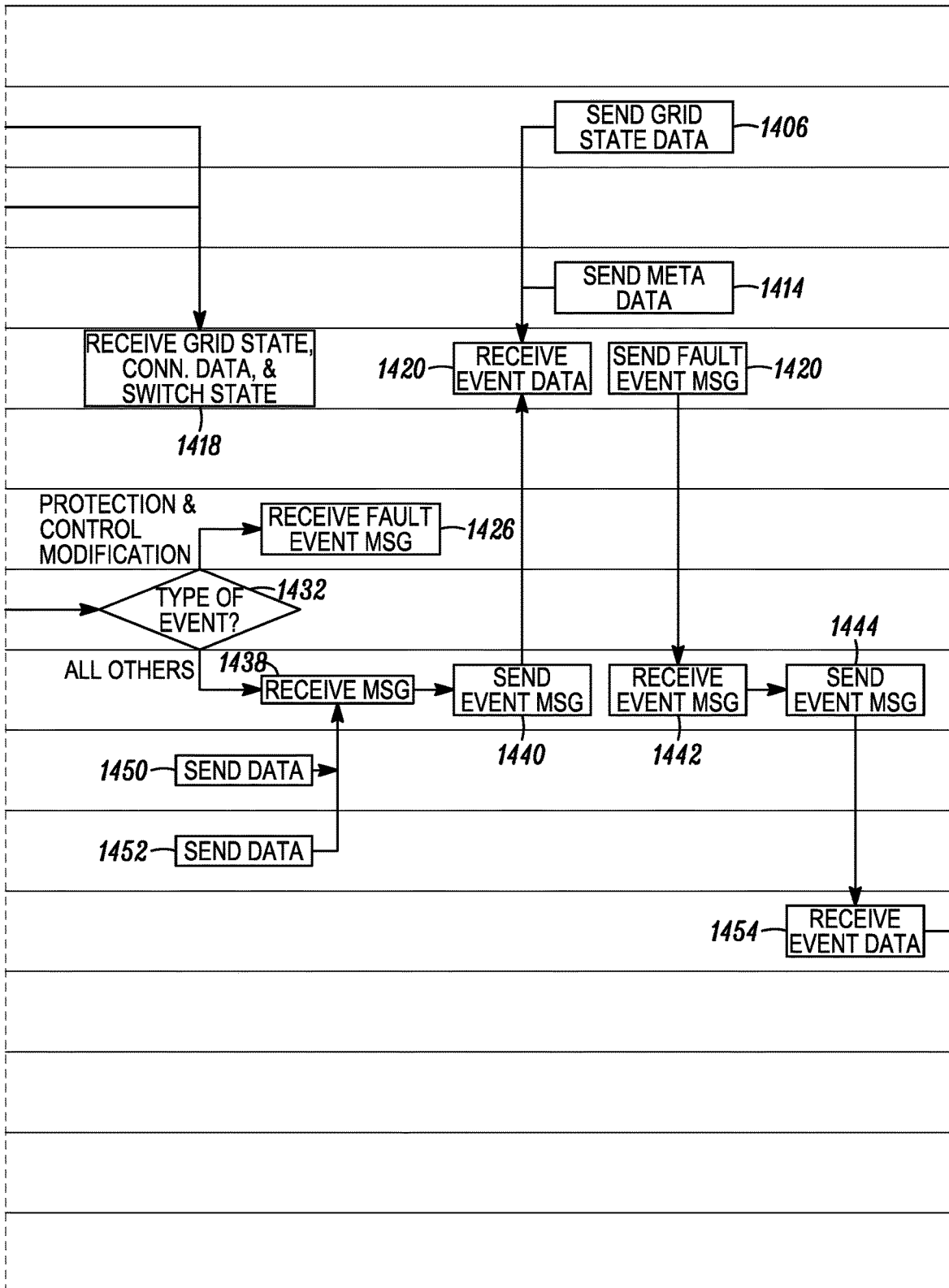
Figure 14C:
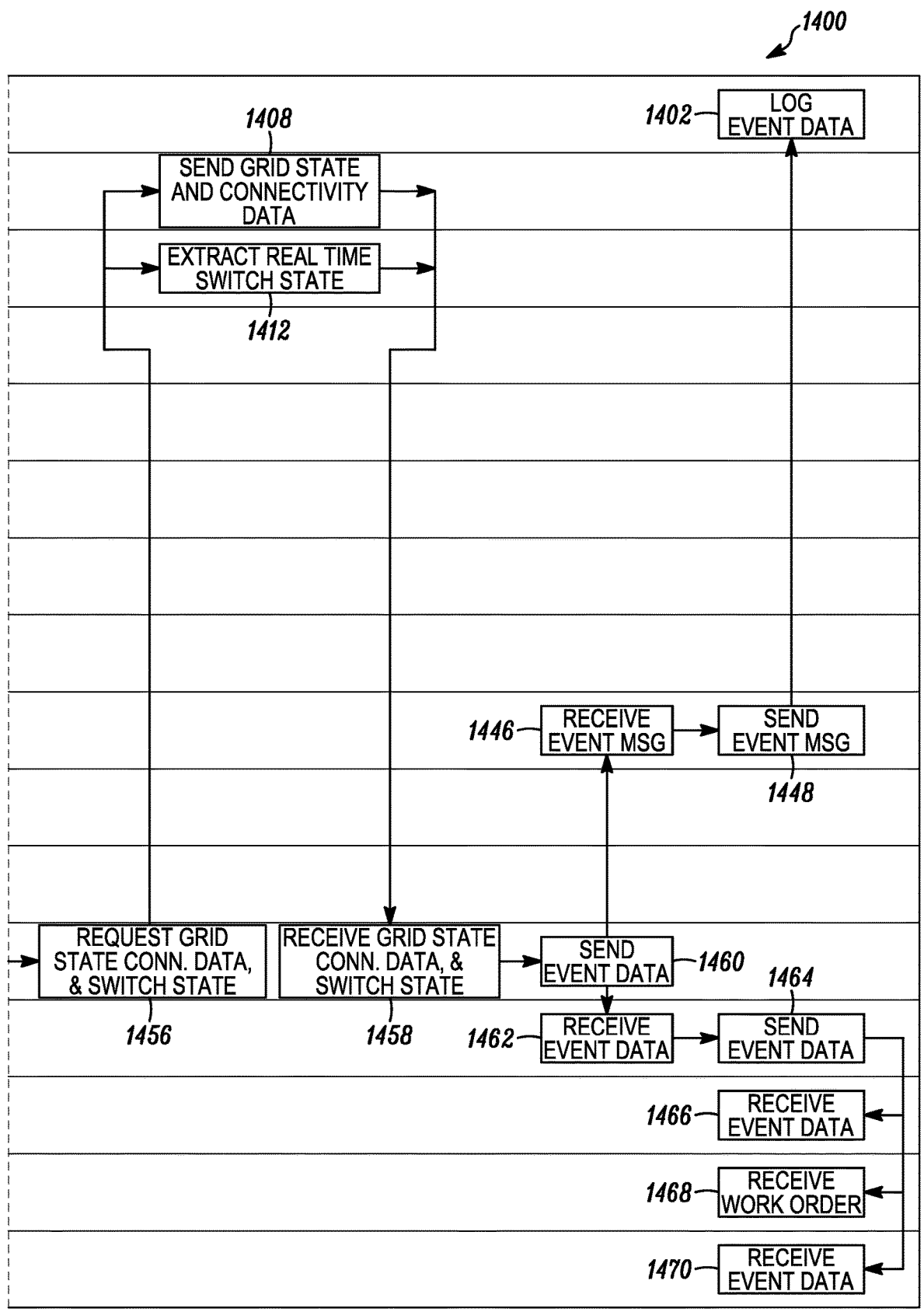

FIGS. 14A-C illustrate a flow diagram 1400 of the Fault Intelligence processes. The complex event processing may request data from one or more devices, as shown at block 1416. For example, the grid state and connectivity in response to the request may send grid state and connectivity data to the complex event processing, as shown at block 1404. Similarly, the historian in response to the request may send real time switch state to the complex event processing, as shown at block 1410. And, the complex event processing may receive the grid state, connectivity data, and the switch state, as shown at block 1418. The substation analytics may request fault data, as shown at block 1428. Fault data may be sent by a variety of devices, such as line sensor and substation computers, as shown at blocks 1422, 1424. The various fault data, grid state, connectivity data, and switch state may be sent to the substation analytics for event detection and characterization, as shown at block 1430. The event bus may also receive event messages (block 1434) and send the event messages to the substation analytics (block 1436). The substation analytics may determine the type of event, as shown at block 1432. For protection and control modification events, the substation computers may receive a fault event message, as shown at block 1426. For all other types of events, the event may be received by the event bus (block 1438) and sent to the complex event processing (block 1440). The complex event processing may receive the event data (block 1420) for further processing. Similarly, the grid state and connectivity may send grid state data to the complex event processing, as shown at block 1406. And, the Common Information Model (CIM) warehouse may send meta data to the complex event processing, as shown at block 1414.

The complex event processing may send a fault event message, as shown at block 1420. The event bus may receive the message (block 1442) and send the event message to the fault intelligence application (block 1444). The fault intelligence application may receive the event data (block 1432) and request grid state, connectivity data, and switch state, as shown at block 1456. In response to the request, the grid state and connectivity send grid state and connectivity data (block 1408), and the historian send switch state data (block 1412). The fault intelligence receives the data (block 1458), analyzes the data, and sends event data (block 1460). The event data may be received by the event bus (block 1446) and sent to the fault log file (block 1448). The fault log file may log the event data (block 1402). The event data may also be received by the operational data bus (block 1462) and send to one or more applications (block 1464). For example, the outage intelligence application may receive the event data (block 1466), discussed above with respect to FIGS. 13A-B. The work management system may also receive the event data in the form of a work order, as shown at block 1468. And, other requesting applications may receive the event data, as shown at block 1470.

The fault intelligent processes may be responsible for interpreting the grid data to derive information about current and potential faults within the grid. Specifically, faults may be detected using the fault intelligent processes. A fault is typically a short circuit caused when utility equipment fails or alternate path for current flow is created, for example, a downed power line. This processes may be used to detect typical faults (typically handled by the conventional fault detection and protection equipment—relays, fuses, etc) as well as high impedance faults within the grid that are not easily detectable using fault currents.

The fault intelligence process may also classify and categorize faults. This allows for faults to be classified and categorized. Currently, no standard exists for a systematic organization and classification for faults. A de-facto standard may be established for the same and implemented. The fault intelligence process may further characterize faults.

The fault intelligence may also determine fault location. Fault location in the distribution system may be a difficult task due to its high complexity and difficulty caused by unique characteristics of the distribution system such as unbalanced loading, three-, two-, and single-phase laterals, lack of sensors/measurements, different types of faults, different causes of short circuits, varying loading conditions, long feeders with multiple laterals and network configurations that are not documented. This process enables the use a number of techniques to isolate the location of the fault with as much accuracy as the technology allows.

The fault intelligence may further raise fault events. Specifically, this process may create and publish fault events to the events bus once a fault has been detected, classified, categorized, characterized and isolated. This process may also be responsible for collecting, filtering, collating and de-duplicating faults so that an individual fault event is raised rather than a deluge based on the raw events that are typical during a failure. Finally, the fault intelligence may log fault events to the event log database.

Figure 15A:
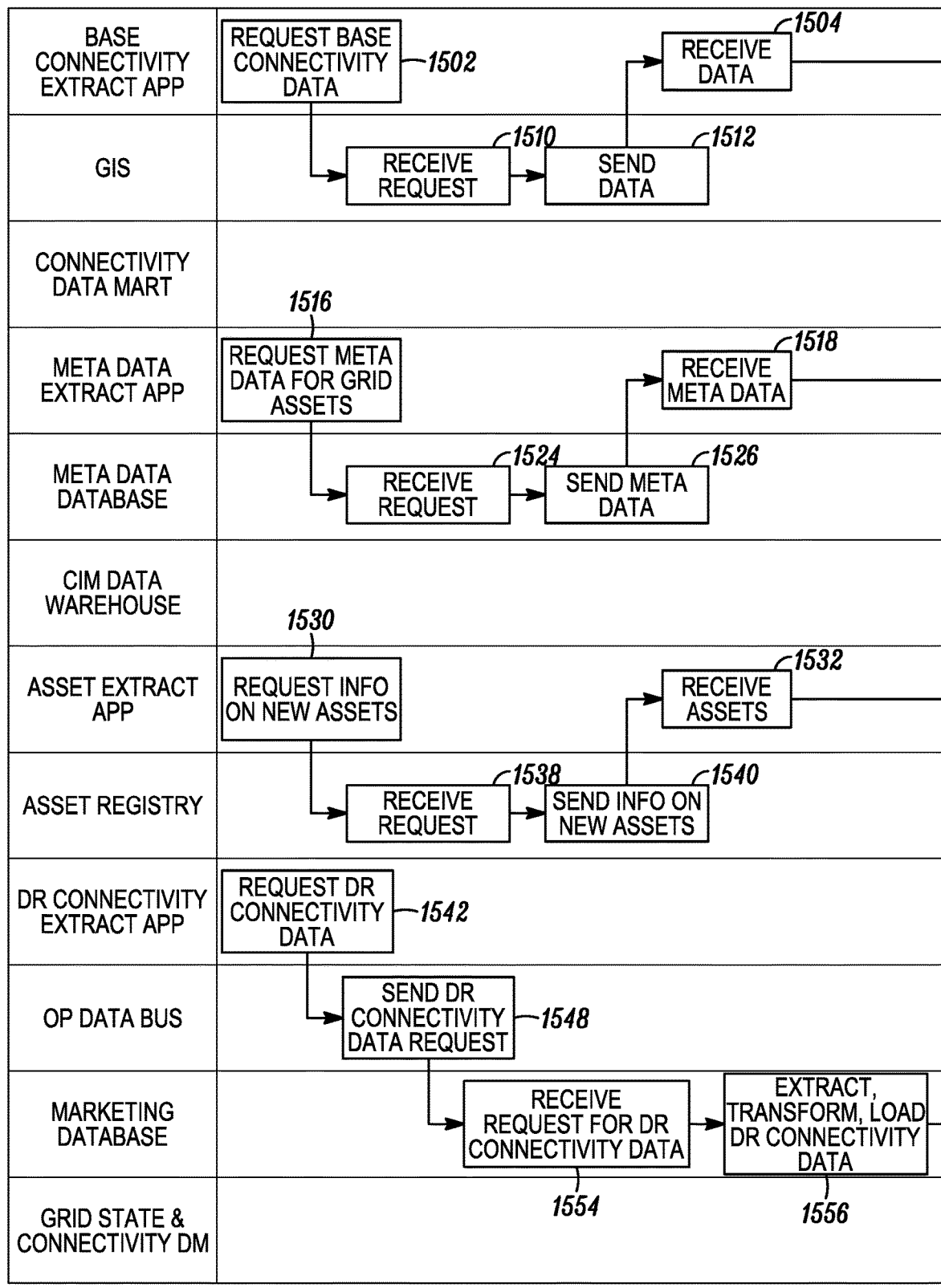
FIGS. 15A-B illustrate flow diagrams of the Meta-data Management Processes.
Figure 15B:
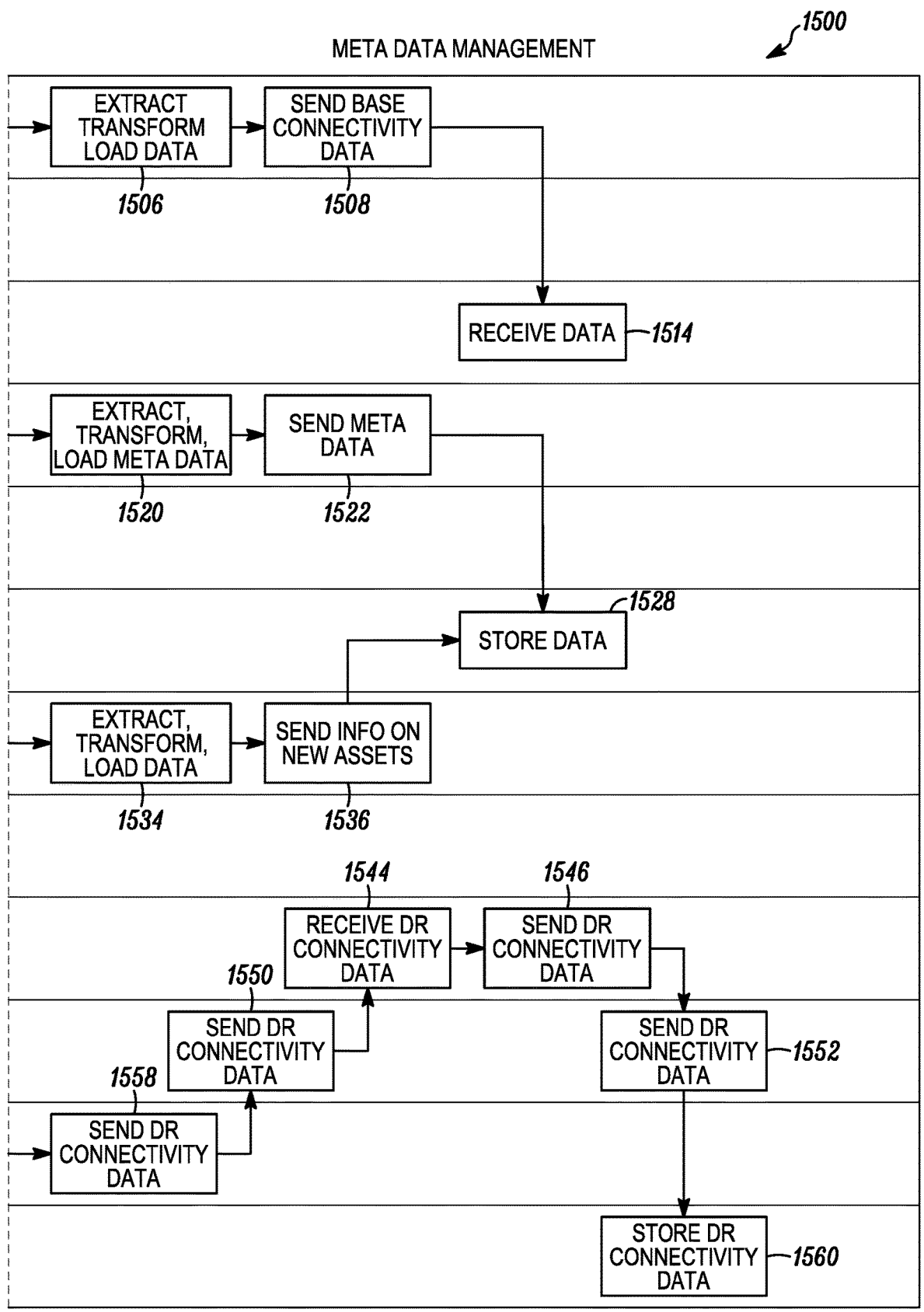

FIGS. 15A-B illustrate a flow diagram 1500 of the Meta-data Management processes. Meta-data management processes may include: point list management; and communication connectivity & protocol management; and element naming & translation; sensor calibration factor management; and real time grid topology data management. The base connectivity extract application may request base connectivity data, as shown at block 1502. The Geographic Information Systems (GIS) may receive the request (block 1510) and send data to the base connectivity extract application (block 1512). The base connectivity extract application may receive the data (block 1504), extract, transform and load data (block 1506) and send base connectivity data to the connectivity data mart (block 1508). The connectivity data mart may thereafter receive the data, as shown at block 1514.

The connectivity data mart may comprise a custom data store that contains the electrical connectivity information of the components of the grid. As shown in FIGS. 15A-B, this information may be derived typically from the Geographic Information System (GIS) of the utility, which holds the as built geographical location of the components that make up the grid. The data in this data store describes the hierarchical information about all the components oldie, grid (substation, feeder, section, segment, branch, t-section, circuit breaker, recloser, switch, etc—basically all the assets). This data store may have the asset and connectivity information as built.

The meta data extract application may request meta data for grid assets, as shown at block 1516. The meta data database may receive the request (block 1524) and send meta data (block 1526) The meta data extract application may receive the meta data (block 1518), extract, transform and load meta data (block 1520), and send the meta data to the CIM data warehouse (block 1522).

The CIM Common Information Model) data warehouse may then store the data, as shown at block 1528. CIM may prescribe utility standard formats for representing utility data. The INDE smart grid may facilitate the availability of information from the smart grid in a utility standard format. And, the CIM data warehouse may facilitate the conversion of INDE specific data to one or more formats, such as a prescribed utility standard format.

The asset extract application may request information on new assets, as shown at block 1530. The asset registry may receive the request (block 1538) and send information on the new assets (block 1540). The asset extract application may receive the information on the new assets (block 1532), extract transform and load data (block 1534), and send information on the new assets to the CIM data warehouse (block 1536).

The DR connectivity extract application may request DR connectivity data, as shown at block 1542. The operational data bus may send the DR connectivity data request to the marketing database, as shown at block 1548. The marketing database may receive the request (block 1554), extract transform, load DR connectivity data (block 1556), and send the DR connectivity data (block 1558). The operational data bus may send the DR connectivity data to the DR connectivity extract application (block 1550). The DR connectivity extract application may receive the DR connectivity data (block 1544), and send the DR connectivity data (block 1546) via the operational data bus (block 1552) to the grid state and connectivity DM, which stores the DR connectivity data (block 1560).

Figure 16:
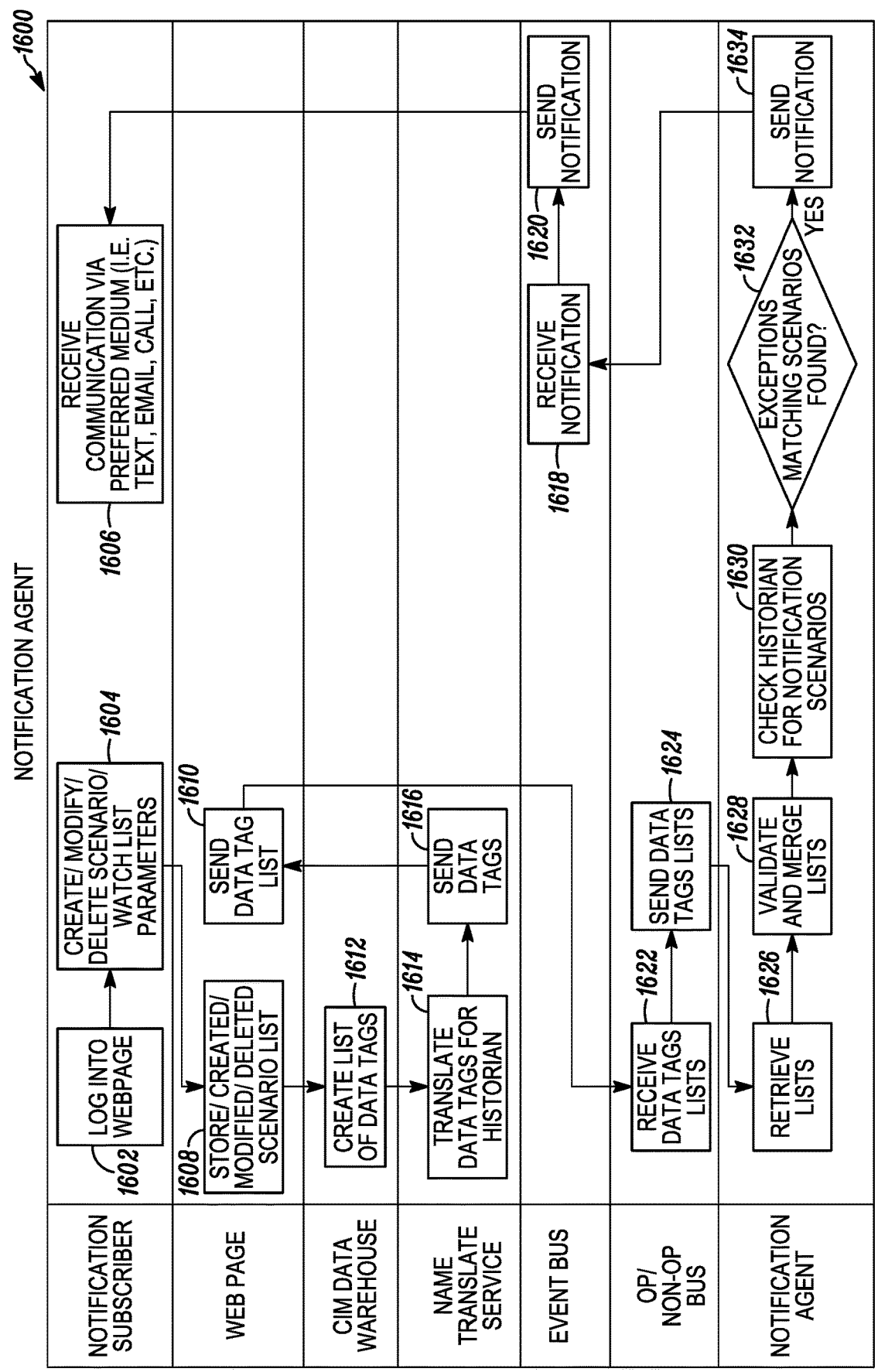
FIG. 16 illustrates a flow diagram of the Notification Agent processes.

FIG. 16 illustrates a flow diagram 1600 of the Notification Agent processes. A notification subscriber may log into a webpage, as shown at block 1602. The notification subscriber may create/modify/delete scenario watch list parameters, as shown at block 1604. The web page may store the created/modified/deleted scenario watch list, as shown at block 1608, and the CIM data warehouse may create a list of data tags, as shown at block 1612. A name translate service may translate the data tags for the historian (block 1614) and send the data tags (block 1616). The web page may send the data tag list (block 1610) via the operational data bus, which receives the data tag, list (block 1622) and sends it to the notification agent (block 1624). The notification agent retrieves the list (block 1626), validates and merges the lists (block 1628), and checks the historian for notification scenarios (block 1630). If exceptions matching the scenarios are found (block 1632), a notification is sent (block 1634). The event bus receives the notification (block 1613) and sends it to the notification subscriber (block 1620). The notification subscriber may receive the notification via a preferred medium, such as text, e-mail, telephone call, etc., as shown at block 1606.

Figure 17:
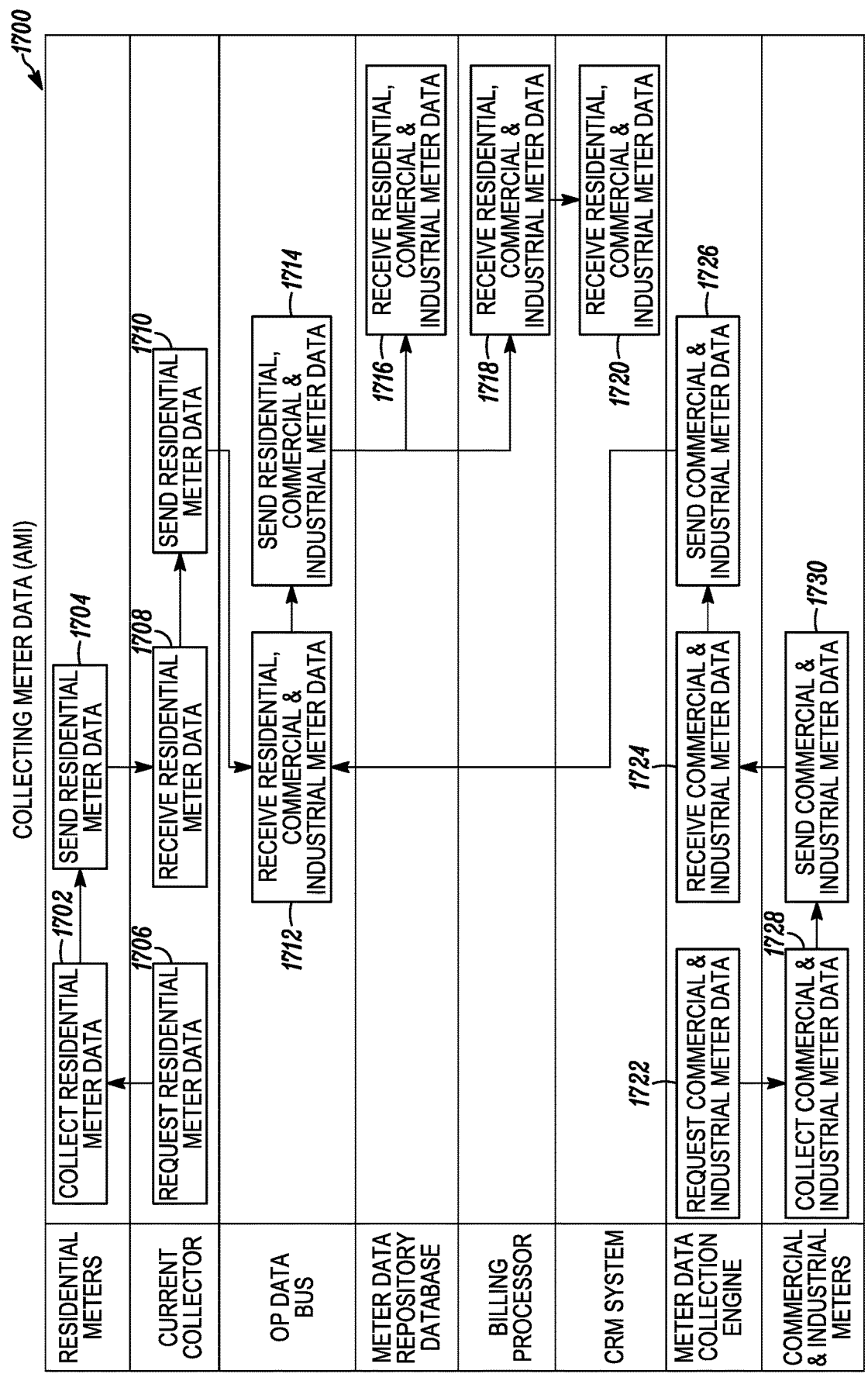
FIG. 17 illustrates a flow diagram of the Collecting Meter Data (AMI) processes.
Figure 18A:
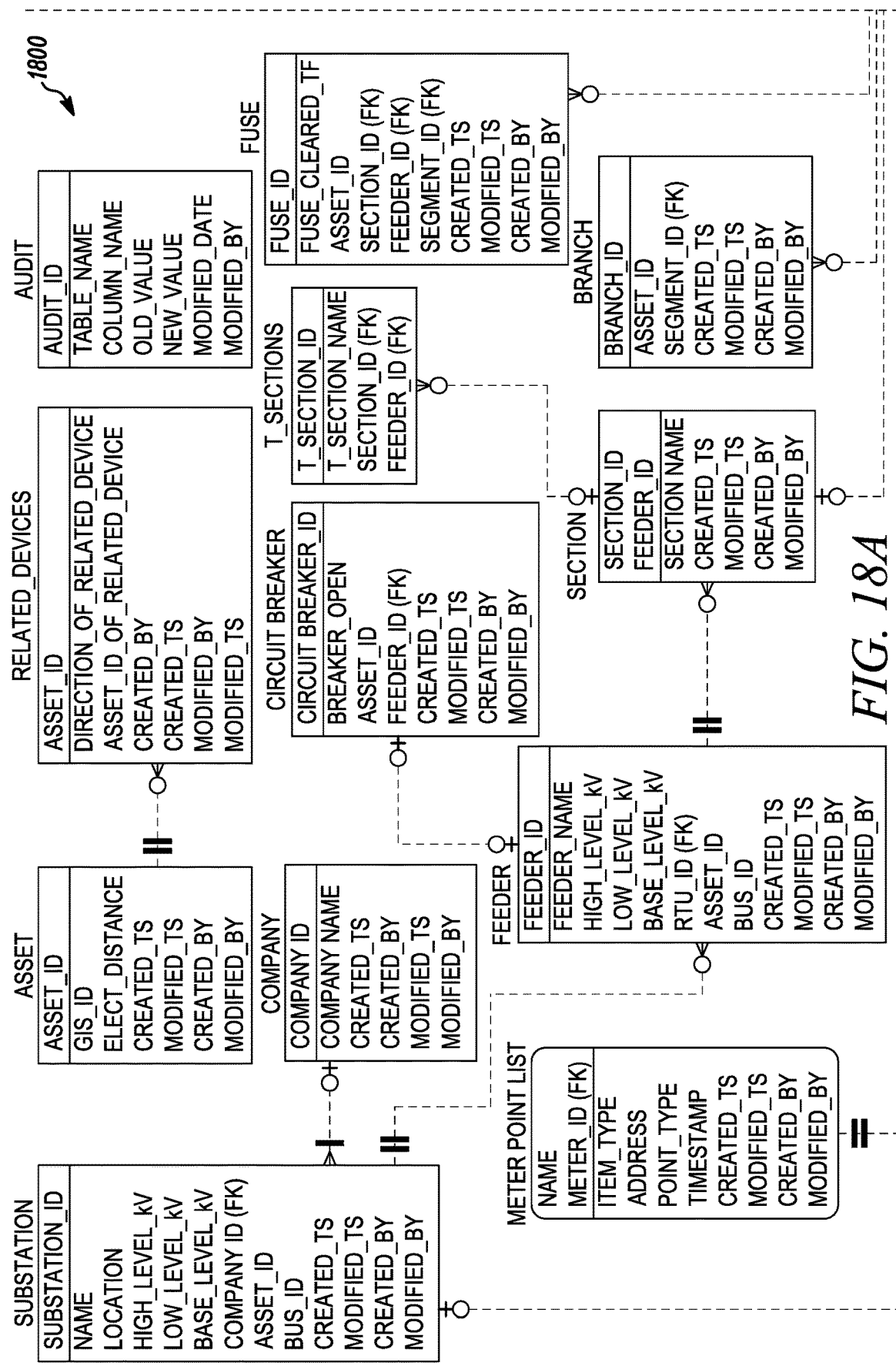
FIGS. 18A-D are an example of an entity relationship diagram, which may be used to represent the baseline connectivity database.
Figure 18B:
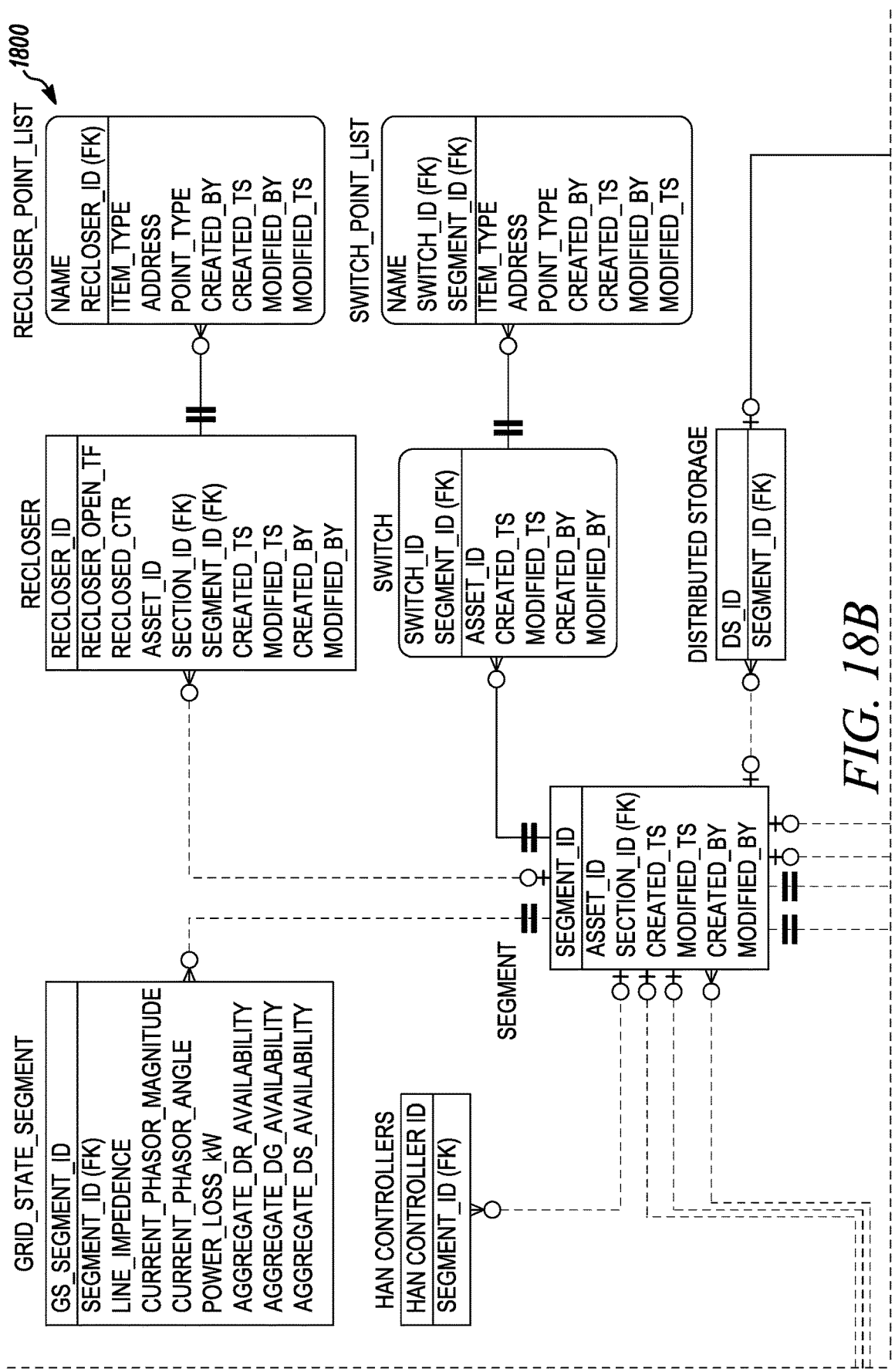
Figure 18C:
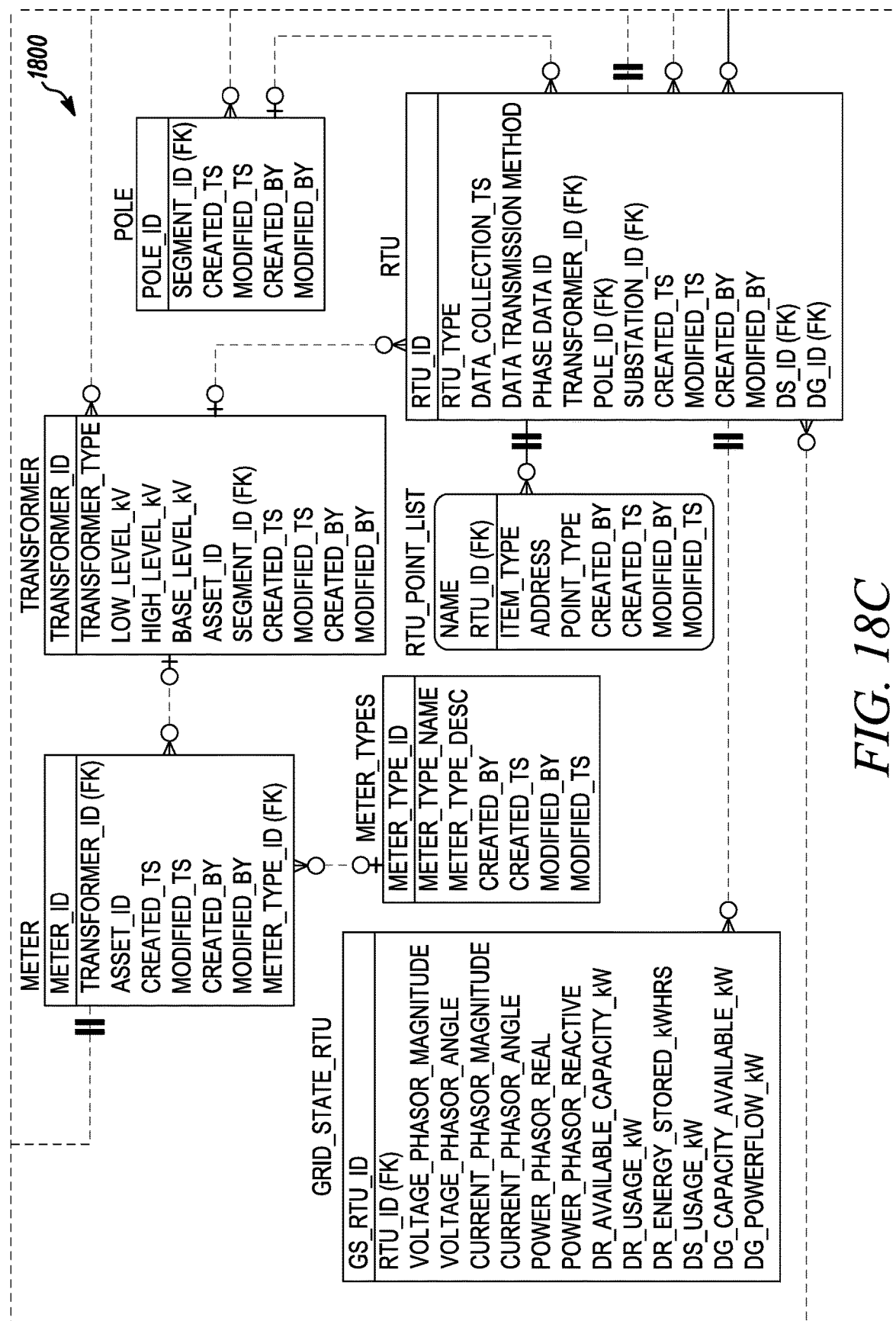
Figure 18D:
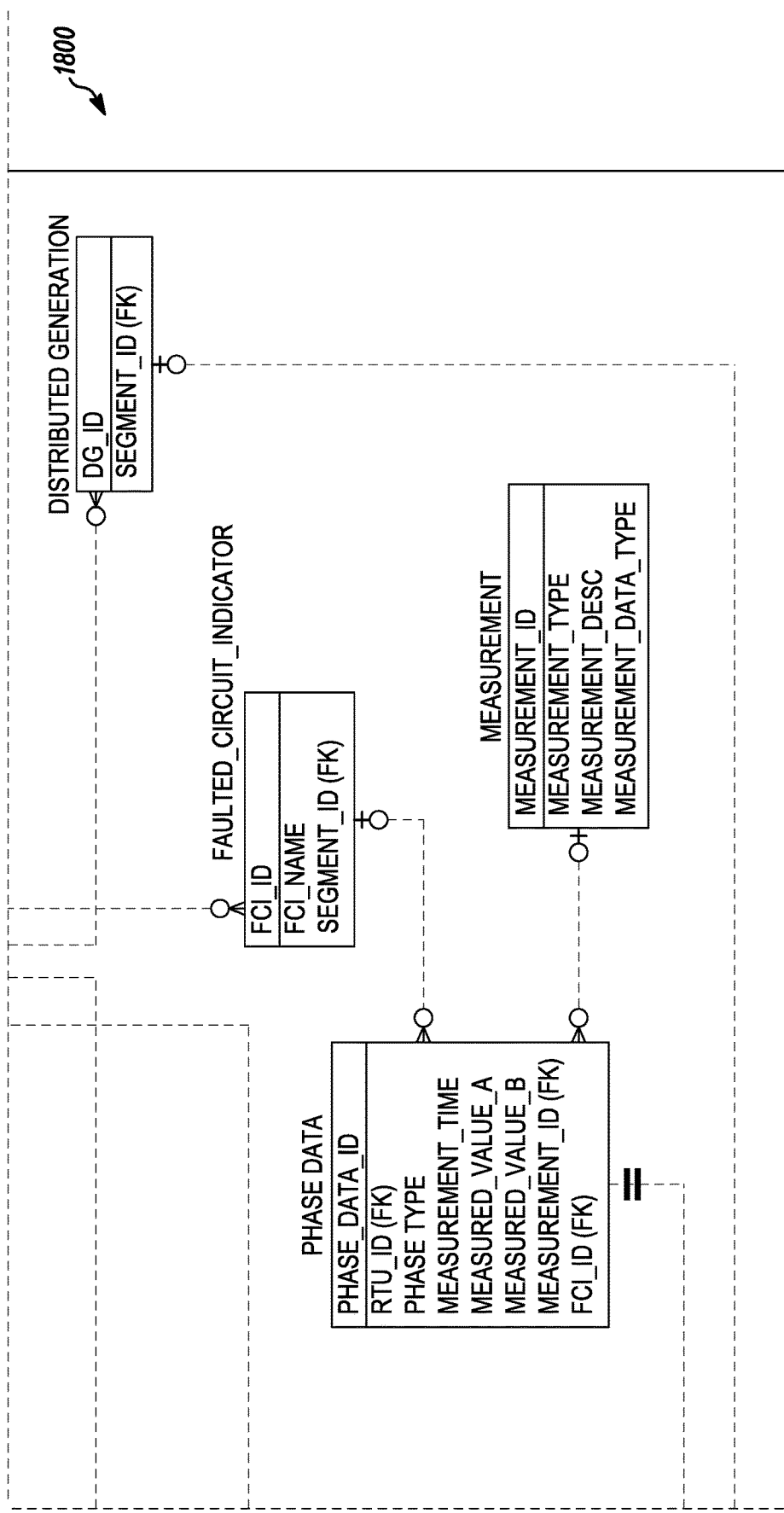

FIG. 17 illustrates a flow diagram 1700 of the Collecting Meter Data (AMI) processes. The current collector may request residential meter data, as shown at block 1706. One or more residential meters may collect residential meter data in response to the request (block 1702) and send the residential meter data (block 1704). The current collector may receive the residential meter data (block 1708) and send it to the operational data bus (block 1710). The meter data collection engine may request commercial and industrial meter data, as shown at block 1722. One or more commercial and industrial meters may collect commercial and industrial meter data in response to the request (block 1728) and send the commercial and industrial meter data (block 1730). The meter data collection engine may receive the commercial and industrial meter data (block 1724) and send it to the operational data bus (block 1726).

The operational data bus may receive residential, commercial, and industrial meter data (block 1712) and send the data (block 1714). The data may be received by the meter data repository database (block 1716) or may be received by the billing processor (block 1718), which may in turn be sent to one or more systems, such as a CIM (customer relationship management) system (block 1720).

The observability processes may further include remote asset monitoring processes. Monitoring the assets within a power grid may prove difficult. There may be different portions of the power grid, some of which are very expensive. For example, substations may include power transformers (costing upwards of $1 million), and circuit breakers. Oftentimes, utilities would do little, if anything, in the way of analyzing the assets and maximizing the use of the assets. Instead, the focus of the utility was typically to ensure that the power to the consumer was maintained. Specifically, the utility was focused on scheduled inspections (which would typically occur at pre-determined intervals) or "event-driven" maintenance (which would occur if a fault occurred in a portion of the grid).

Instead of the typical scheduled inspections or "event-driven" maintenance, the remote asset monitoring processes may focus on condition-based maintenance. Specifically, if one portion (or all) of the power grid may be assessed (such as on a periodic or continual basis), the health of the power grid may be improved.

As discussed above, data may be generated at various portions of the power grid and transmitted to (or accessible by a central authority. The data may then be used by the central authority in order to determine the health of the grid. Apart from analyzing the health of the grid, a central authority may perform utilization monitoring. Typically, equipment in the power grid is operated using considerable safety margins. One of the reasons for this is that utility companies are conservative by nature and seek to maintain power to the consumer within a wide margin of error. Another reason for this is that the utility companies monitoring the grid may not be aware of the extent a piece of equipment in the power grid is being utilized. For example, if a power company is transmitting power through a particular feeder circuit, the power company may not have a means by which to know if the transmitted power is near the limit of the feeder circuit for example, the feeder circuit may become excessively heated). Because of this, the utility companies may be underutilizing one or more portions of the power grid.

Utilities also typically spend a considerable amount of money to add capacity to the power grid since the load on the power grid has been growing (i.e., the amount of power consumed has been increasing). Because of the Utilities' ignorance. Utilities will upgrade the power grid unnecessarily. For example, feeder circuits that are not operating near capacity may nonetheless be upgraded by reconductoring bigger wires are laid in the feeder circuits), or additional feeder circuits may be laid. This cost alone is considerable.

The remote asset monitoring processes may monitor various aspects of the power grid, such as (1) analyzing current asset health of one or more portions of the grid; (2) analyzing future asset health of one or more portions of the grid; and (3) analyzing utilization of one or more portions of the grid. First, one or more sensors may measure and transmit to remote asset monitoring processes in order to determine the current health of the particular portion of the grid. For example, a sensor on a power transform may provide an indicator of its health by measuring the dissolved gases on the transformer. The remote asset monitoring processes may then use analytic tools to determine if the particular portion of the grid (such as the power transform is healthy or not healthy). If the particular portion of the grid is not healthy, the particular portion of the grid may be fixed.

Moreover, the remote asset monitoring processes may analyze data generated from portions of the grid in order to predict the future asset health of the portions of the grid. There are things that cause stress on electrical components. The stress factors may not necessarily be constant and may be intermittent. The sensors may provide an indicator of the stress on a particular portion of the power grid. The remote asset monitoring processes may log the stress measurements, as indicated by the sensor data, and may analyze the stress measurement to predict the future health of the portion of the power grid. For example, the remote asset monitoring processes may use trend analysis in, order to predict when the particular portion of the grid may fail, and may schedule maintenance in advance of (or concurrently with) the time when the particular portion of the grid may fail, in this way, the remote asset monitoring processes may predict the life of a particular portion of the grid, and thus determine if the life of that portion of the grid is too short (i.e., is that portion of the grid being used up too quickly).

Further, the remote asset monitoring processes may analyze the utilization of a portion of the power grid in order to manage the power grid better. For example, the remote asset monitoring processes may analyze a feeder circuit to determine what, its operating capacity is. In this feeder circuit example, the remote asset monitoring processes may determine that the feeder circuit is currently being operated at 70%. The remote asset monitoring processes may further recommend that the particular feeder circuit may be operated at a higher percentage (such as 90%), while still maintaining acceptable safety margins. The remote asset monitoring processes may thus enable an effective increase in capacity simply through analyzing the utilization.

Methodology for Determining Specific Technical Architecture

There are various methodologies for determining, the specific technical architecture that may use one, some, or ail of the elements of the INDE Reference Architecture. The methodology may include a plurality of steps. First, a baseline step may be performed in generating documentation of theas-is state of the utility, and a readiness assessment for transition to a Smart Grid. Second, a requirements definition step may be performed in generating the definition of the to-be state and the detailed requirements to get to this state.

Third, a solution development step may be performed in generating the definition of the solution architecture components that will enable the Smart Grid including the measurement, monitoring and control. For the INDE architecture, this may include the measuring devices, the communication network to pass data from the devices to the INDE CORE 120 applications, the INDE CORE 120 applications to persist and react to the data, analytical applications to interpret the data, the data architecture to model the measured and interpreted data, the integration architecture to exchange data and information between INDE and utility systems, the technology infrastructure to run the various applications and databases and the standards that may be followed to enable an industry standard portable and efficient solution.

Fourth, a value modeling may be performed in generating the definition of key performance indicators and success factors for the Smart Grid and the implementation of the ability to measure and rate the system performance against the desired performance factors. The disclosure above relates to the Architecture development aspect of step 3.

Figure 19A:
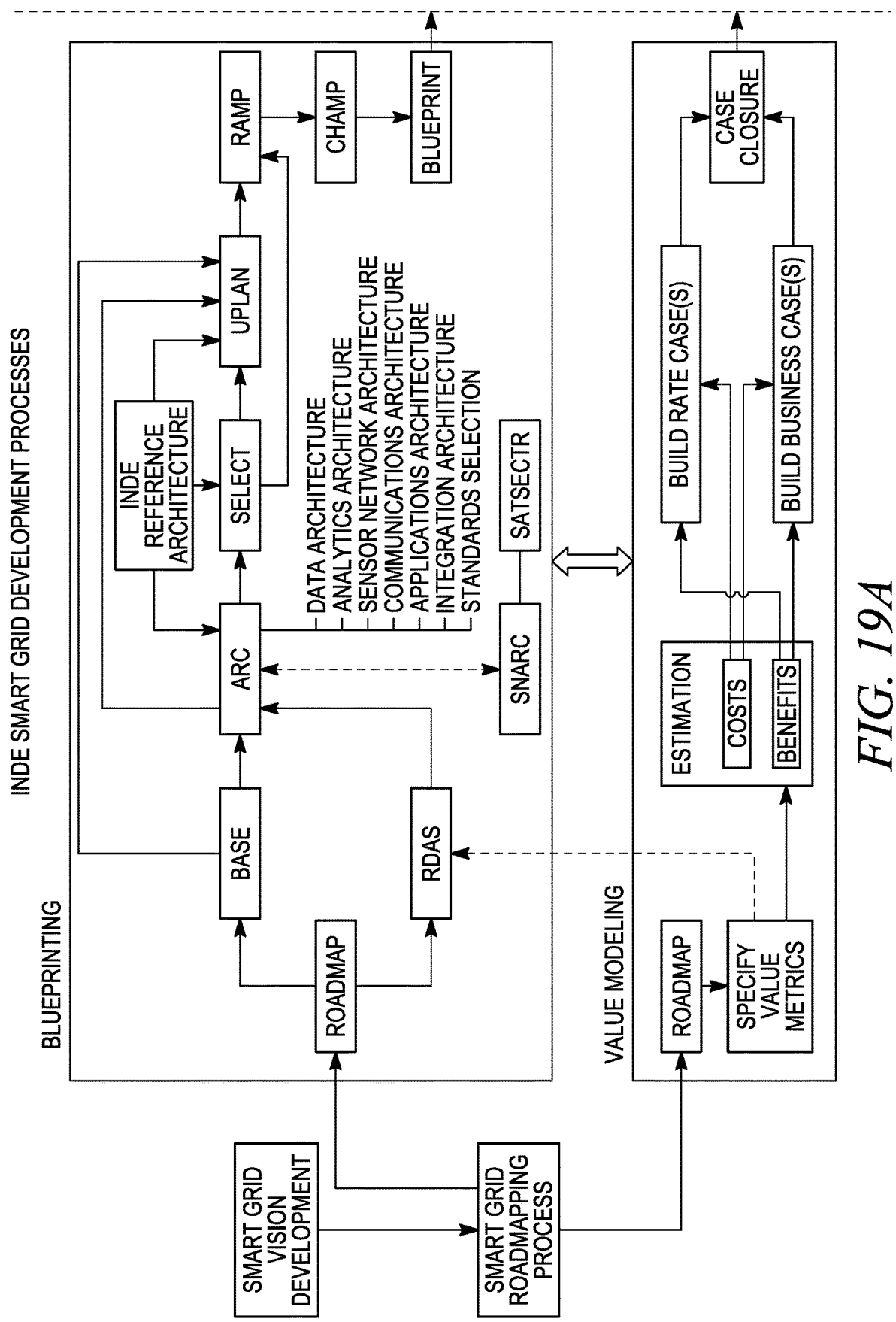
FIGS. 19A-B illustrate an example of a blueprint progress flow graphic.
Figure 19B:
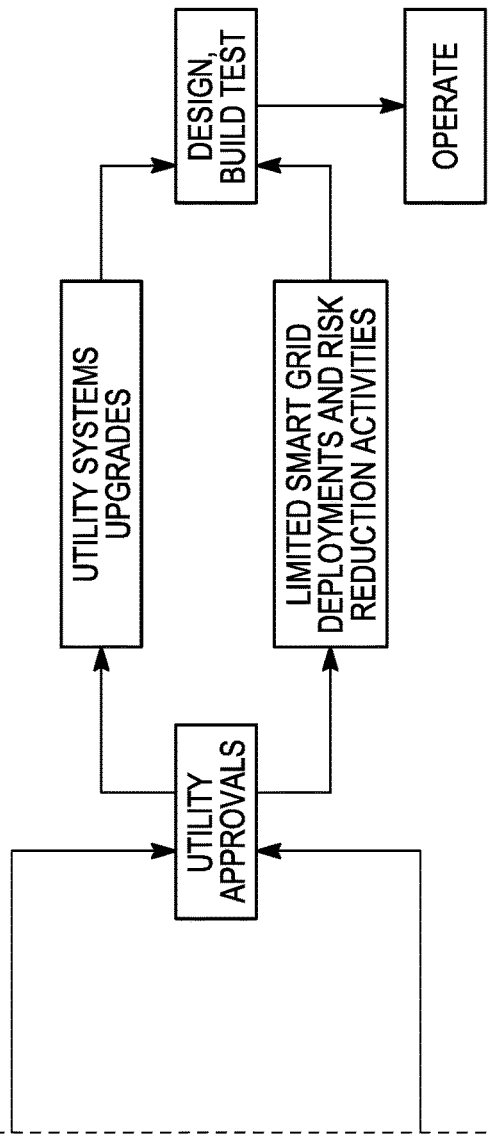

FIGS. 19A-B illustrate an, example of a blueprint progress flow graphic. Specifically, FIGS. 19A-B illustrate a process flow of the steps that may be undertaken to define the smart grid requirements and the steps that may be executed to implement the smart grid. The smart grid development process may begin with a smart grid vision development, which may outline the overall goals of the project, that may lead to the smart grid roadmapping process. The roadmapping process may lead to blueprinting and to value modeling.

Blueprinting may provide a methodical approach to the definition of the smart grid in the context of the entire utility enterprise. Blueprinting may include an overall roadmap, which may lead to a baseline and systems evaluation (BASE) and to a requirements definition and analytics selection (RDAS). The RDAS process may create the detailed definition of the utility's specific smart grid.

The BASE process may establish the starting point for the utility, in terms of systems, networks, devices, and applications to support smart grid capabilities. The first part of the process is to develop a systems inventory of the grid, which may include: grid structure (such as generation, transmission lines, transmission substations, sub transmission lines, distribution substations, distribution feeders, voltage classes); grid devices (such as switches, reclosers, capacitors, regulators, voltage drop compensators, feeder inter-ties); substation automation (such as IEDs, substation LANs, instrumentation, station RTUs/computers); distribution automation (such as capacitor and switch control; fault isolation and load rollover controls; LTC coordination systems; DMS; Demand Response Management System); and grid sensors (such as sensor types, amounts, uses, and counts on distribution grids, on transmission lines and in substations); etc. Once the inventory is complete, an evaluation of the utility against a high level smart grid readiness model may be created. An as-is dataflow model and a systems diagram may also be created.

The architecture configuration (ARC) process may develop a preliminary smart grid technical architecture for the utility by combining the information from the BASE process, requirements and constraints from the RDAS process and the INDE Reference Architecture to produce a technical architecture that meets the specific needs of the utility and that takes advantage of the appropriate legacy systems and that conforms to the constraints that exist at the utility. Use of the INDE Reference Architecture may avoid the need to invent a custom architecture and ensures that accumulated experience and best practices are applied to the development of the solution. It may also ensure that the solution can make maximum use of reusable smart grid assets.

The sensor network architecture configuration (SNARC) process may provide a framework for making the series of decisions that define the architecture of a distributed sensor network for smart grid support. The framework may be structured as a series of decision trees, each oriented to a specific aspect of sensor network architecture. Once the decisions have been made, a sensor network architecture diagram may be created.

The sensor allocation via T-section recursion (SAT-SECTR) process may provide a framework for determining how many sensors should be placed on the distribution grid to obtain a given level of observability, subject to cost constraints. This process may also determine the sensor types and locations.

The solution element evaluation and components template (SELECT) process may provide a framework for evaluation of solution component types and provides a design template for each component class. The template may contain a reference model for specifications for each of the solution elements. These templates may then be used to request vendor quotations and to support vendor/product evaluations.

The upgrade planning for applications and networks (UPLAN) process may provide for development of a plan to upgrade of existing utility systems, applications, and networks to be ready for integration into a smart grid solution. The risk assessment and management planning (RAMP) process may provide an assessment of risk associated with specific elements of the smart grid solution created in the ARC process. The UPLAN process may assesses the level or risk for identified risk elements and provides an action plan to reduce the risk before the utility commits to a build-out. The change analysis and management planning (CHAMP) process may analyze the process and organizational changes that may be needed for the utility to realize the value of the smart grid investment and may provide a high level management plan to carry out these changes in a manner synchronized with the smart grid deployment. The CHAMP process may result in a blueprint being generated.

The roadmap in the value modeling process may lead to specifying value metrics, which may lead to estimation of cost and benefits. The estimation may lead to the building of one or more cases, such as a rate case and business case, which in turn may lead to a case closure. The output of blueprinting and the value modeling may be sent to the utility for approval, which may result in utility system upgrades and smart grid deployments and risk reduction activities. After which, the grid may be designed, built and tested, and then operated.

While this invention has been shown and described in connection with the preferred embodiments, it is apparent that certain changes and modifications in addition to those mentioned above may be made from the basic features of this invention. In addition, there are many different types of computer software and hardware that may be utilized in practicing the invention, and the invention is not limited to the examples described above. The invention was described with reference to acts and symbolic representations of operations that are performed by one or more electronic devices. As such, it will be understood that such acts and operations include the manipulation by the processing unit of the electronic device of electrical signals representing data in a structured form. This manipulation transforms the data or maintains it at locations in the memory system of the electronic device, which reconfigures or otherwise alters the operation of the electronic device in a manner well understood by those skilled in the art. The data structures where data is maintained are physical locations of the memory that have particular properties defined by the format of the data. While the invention is described in the foregoing context, it is not meant to be limiting, as those of skill in the art will appreciate that the acts and operations described may also be implemented in hardware. Accordingly, it is the intention of the Applicants to protect all variations and modification within the valid scope of the present invention. It is intended that the invention be defined by the following claims, including all equivalents.

The invention claimed is:

1. A data management system for a power grid, comprising:
    a grid device positioned in a section of a power grid, the grid device configured to sense operational data in the section of the power grid, the operational data including at least an electrical parameter associated with the power grid,
    a data storage associated with the grid device, the data storage including a plurality of memory locations and configured to store the operational data in the plurality of memory locations,
    the grid device further configured to communicate a link corresponding to any of the memory locations in the data storage to a central power grid authority that manages the power grid and a plurality of grid devices within the power grid;
    the grid device further configured to receive a request from the central power grid authority for access to the operational data of a memory location or locations associated with the link included in the request; and
    the grid device, in response to the request, further configured to respond to the request by transmission to the central power grid authority of the operational data of the memory location in accordance with the corresponding link included in the request.

2. The data management system according to claim 1, wherein the grid device is a first grid device, the first grid device configured to query the central power grid authority for a link associated with a second grid device included within the power grid, wherein the first grid device is further configured to use the link received from the central power grid authority in response to a query to access operational data sensed by the second grid device.

3. The data management system according to claim 1, wherein the grid device further comprises a processor configured to communicate with the data storage associated with the grid device, the processor further configured to analyze the operational data to determine at least one analytical determination of operation of the power grid.

4. The data management system according to claim 3, wherein the data storage is further configured to store the at least one analytical determination in a memory location included among the plurality of memory locations and the link corresponding to any of the memory locations includes the memory location of the at least one analytical determination.

5. The data management system according to claim 3, wherein the at least one analytical determination by the grid device comprises at least one of a prediction of a potential fault, a determination of a past fault, or a determination of a present fault.

6. The data management system according to claim 1, wherein the central power grid authority is configured to store the link in a central data storage associated with the central power grid authority.

7. The data management system according to claim 1, wherein the grid device within the power grid includes a substation, and the data storage associated with the grid device includes a memory located in the substation.

8. The data management system according to claim 1, wherein the grid device within the power grid includes a feeder circuit and the section of the power grid is operable at a voltage less than 36K Volts.

9. The data management system according to claim 1, wherein the grid devices within the power grid comprises a meter at a customer premises.

10. A method for data management for a power grid, the method comprising:
    sensing, using a device positioned in a section of a power grid, operational data including an electrical parameter in the section of the power grid;
    storing the operational data in a memory location of a data storage device, the data storage device associated with the device and proximate to the device;
    sending, to a central power grid authority that manages the power grid, a link to the memory location of the operational data;
    receiving, from the central power grid authority, a request for access to the operational data associated with the link included in the request; and
    responding to the request by transmitting to the central power grid authority the operational data of the memory location in accordance with the corresponding link included in the request.

11. The method of claim 10, wherein the device is a first device, and the request that includes the link is received from the central power grid authority, or from a second device included in the power grid.

12. The method of claim 10, wherein the link is a first link and the method further comprises the step of analyzing, using a processor, the operational data to make at least one analytical determination of operation of the power grid; the storing step further comprises storing the at least one analytical determination in a memory location of the data storage device; and the sending step further comprises sending, to the central power grid authority, a second link indicative of the memory location of the at least one analytical determination.

13. The method of claim 10, wherein the step of sensing, using the device positioned in the section of the power grid comprises sensing operational data of a substation or a feeder circuit.

14. A data management system for a power grid, the power grid comprising a central power grid authority for managing the power grid and a plurality of devices within the power grid, the data management system comprising:
    data storage associated with a device positioned in a section of the grid, the data storage being proximate to the device, the device sensing an electrical parameter in the section of the power grid, the data storage comprising a plurality of memory locations, at least one of which is allocated to store the sensed electrical parameter;

and a central data storage associated with the central power grid authority, wherein the central power grid authority is configured to receive a link identifying a memory location in the data storage in which the electrical parameter is stored; and wherein the central power grid authority is configured to store the link in the central data storage; and wherein the central power grid authority is configured to access the link in the central data storage and send a request to the device requesting data associated with the link; and wherein the central power grid authority is configured to receive a response from the device comprising the electrical parameter stored in the memory location identified by the link.

15. The data management system of claim 14, wherein the device within the power grid comprises a substation, and the data storage associated with the device comprises a memory that is located in the substation.

16. The data management system of claim 15, wherein the substation is further configured to send at least one header associated with the link;

and wherein the central power grid authority comprises:

a first portion of a bus configured to communicate operational data to the central power grid authority, the operational data comprising at least one real-time measurement of voltage, current, real power, or reactive power for at least a part of the power grid; and a second portion of a bus configured to communicate event data to the central power grid authority, the second portion being separate from the first portion, the event data being distinct from and derived from the at least one real-time measurement and comprising at least one analytical determination as to operation of the power grid based on the at least one real time measurement.

17. The data management system of claim 14, wherein the device comprises a meter at a customer premises.

* * * * *

UNITED STATES PATENT AND TRADEMARK OFFICE
CERTIFICATE OF CORRECTION

PATENT NO. : 10,833,532 B2
APPLICATION NO. : 15/353611
DATED : November 10, 2020
INVENTOR(S) : Jeffrey D. Taft Page 1 of 3

It is certified that error appears in the above-identified patent and that said Letters Patent is hereby corrected as shown below:

In the Specification

In Column 1, Line 20, delete "m" and insert in its place --in--.

In Column 1, Line 27, delete "Foy" and insert in its place --For--.

In Column 1, Line 28, delete "isstepped" and insert in its place --is stepped--.

In Column 4, Line 46, delete "Hock" and insert in its place --block--.

In Column 6, Line 48, delete "ail" and insert in its place --all--.

In Column 7, Line 13, delete "Core" and insert in its place --CORE--.

In Column 8, Line 34, delete "," after "As".

In Column 8, Line 47, delete "," between "may" and "route".

In Column 10, Line 6, delete "Control" and insert in its place --control--.

In Column 10, Line 26, delete "ORE" and insert in its place --CORE--.

In Column 15, Line 4, insert --files,-- between "recorder" and "but".

In Column 15, Line 26, at the end of the line, delete "a" and insert in its place --as--.

In Column 16, in Table 2, delete the title "INDE SUBSTATION Elements".

In Column 17, in Table 2 (continued), delete the title "INDE SUBSTATION Elements".

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*

In Column 17, Line 54, delete ";" and insert in its place --:--.

In Column 18, Line 64, insert --(-- before "as".

In Column 19, Line 15, delete "Device" and insert in its place --DEVICE--.

In Column 20, Line 29, at the end of the line, delete "," and insert in its place --.--.

In Column 20, in Table 3, delete the title "INDE DEVICE Elements".

In Column 21, in Table 3 (continued), delete the title "INDE DEVICE Elements".

In Column 21, Line 38, delete "." between "Smart" and "Meter".

In Column 24, Line 42, delete "Core" and insert in its place --CORE--.

In Column 24, Line 63, delete "RTU" and insert in its place --RTUs--.

In Column 25, Line 29, insert --.-- between "(DR)" and "Demand".

In Column 26, Line 11, delete second instance of "data".

In Column 26, Line 26, insert --,-- after "puter)".

In Column 27, Line 20, delete "or" and insert in its place --of--.

In Column 27, Line 26, at end of line, delete "note-" and insert in its place --not- --.

In Column 27, Line 39, delete "," after "etc.".

In Column 28, Line 60, delete "1204, the" and insert in its place --1204. The--.

In Column 30, Line 26, delete "," and insert in its place --;-- after "momentaries".

In Column 30, Line 41, insert --RTUs-- between "sensor" and "and".

In Column 32, Line 11, delete "oldie," and insert in its place --of the--.

In Column 32, Line 23, insert --(-- before "Common".

In Column 33, Line 4, delete "1613)" and insert in its place --1618--.

In Column 33, Line 29, delete "CIM" and insert in its place --CRM--.

In Column 33, Line 53, insert --)-- after "by".

CERTIFICATE OF CORRECTION (continued)
U.S. Pat. No. 10,833,532 B2

In Column 34, Line 8, delete "." after "ignorance" and insert in its place --,--.

In Column 34, Line 11, insert --(i.e.,-- at beginning of line in front of "bigger".

In Column 34, Line 42, delete "fail, in" and insert in its place --fail. In--.

In Column 34, Line 63, delete "ail" and insert in its place --all--.

In Column 34, Line 67, delete "theas-is" and insert in its place --the as-is--.

In Column 35, Line 26, delete "," after "an".